(12) United States Patent
Hiner et al.

(10) Patent No.: US 9,653,428 B1
(45) Date of Patent: May 16, 2017

(54) SEMICONDUCTOR PACKAGE AND FABRICATING METHOD THEREOF

(71) Applicant: Amkor Technology, Inc., Tempe, AZ (US)

(72) Inventors: David Hiner, Chandler, AZ (US);
Michael Kelly, Queen Creek, AZ (US);
Ronald Huemoeller, Gilbert, AZ (US)

(73) Assignee: Amkor Technology, Inc.

( * ) Notice: Subject to any disclaimer, the term of this patent is extended or adjusted under 35 U.S.C. 154(b) by 0 days.

(21) Appl. No.: 15/207,186

(22) Filed: Jul. 11, 2016

Related U.S. Application Data

(60) Provisional application No. 62/287,544, filed on Jan. 27, 2016.

(51) Int. Cl.
| | | |
|---|---|---|
| H01L 23/48 | (2006.01) | |
| H01L 23/52 | (2006.01) | |
| H01L 25/065 | (2006.01) | |
| H01L 25/00 | (2006.01) | |
| H01L 23/538 | (2006.01) | |
| H01L 23/00 | (2006.01) | |
| H01L 21/56 | (2006.01) | |

(52) U.S. Cl.
CPC ........ *H01L 25/0655* (2013.01); *H01L 21/563* (2013.01); *H01L 23/5383* (2013.01); *H01L 23/5386* (2013.01); *H01L 24/14* (2013.01); *H01L 24/16* (2013.01); *H01L 24/73* (2013.01); *H01L 24/97* (2013.01); *H01L 25/50* (2013.01); *H01L 2224/1403* (2013.01); *H01L 2224/16225* (2013.01); *H01L 2224/73204* (2013.01); *H01L 2224/95001* (2013.01); *H01L 2224/97* (2013.01)

(58) Field of Classification Search
CPC ....... H01L 2224/32145; H01L 25/0657; H01L 2224/97; H01L 24/16; H01L 25/0652; H01L 24/73; H01L 23/5389; H01L 21/563; H01L 23/5386; H01L 25/50; H01L 25/0656; H01L 2224/73204; H01L 2224/16225
See application file for complete search history.

(56) References Cited

U.S. PATENT DOCUMENTS

| | | | | |
|---|---|---|---|---|
| 7,402,901 B2 * | 7/2008 | Hatano | ............... | H01L 23/5389 257/684 |
| 8,546,955 B1 * | 10/2013 | Wu | ............... | H01L 23/5384 257/686 |
| 9,026,872 B2 * | 5/2015 | Camarota | ............. | H01L 23/145 257/621 |
| 2013/0063843 A1 * | 3/2013 | Chen | ............... | H01L 23/552 361/56 |
| 2013/0168854 A1 * | 7/2013 | Karikalan | ............... | H01L 24/49 257/738 |
| 2013/0207261 A1 * | 8/2013 | Thacker | ............... | H01L 24/72 257/738 |
| 2016/0126161 A1 * | 5/2016 | Fang | ............... | H01L 24/06 257/741 |
| 2016/0240497 A1 * | 8/2016 | Chen | ............... | H01L 24/02 |

* cited by examiner

*Primary Examiner* — Jasmine Clark
(74) *Attorney, Agent, or Firm* — McAndrews, Held & Malloy, Ltd.

(57) ABSTRACT

A semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die.

20 Claims, 44 Drawing Sheets

SEMICONDUCTOR PACKAGE AND FABRICATING METHOD THEREOF

CROSS-REFERENCE TO RELATED APPLICATIONS/INCORPORATION BY REFERENCE

This application makes reference to, claims priority to, and claims benefit from U.S. Provisional Application No. 62/287,544, filed on Jan. 27, 2016, and titled "SEMICONDUCTOR PACKAGE AND FABRICATING METHOD THEREOF," which is hereby incorporated herein by reference in its entirety. This application is related to U.S. patent application Ser. No. 14/686,725, filed Apr. 14, 2015, and titled "SEMICONDUCTOR PACKAGE WITH HIGH ROUTING DENSITY PATCH"; and U.S. patent application Ser. No. 14/823,689, filed Aug. 11, 2015, and titled "SEMICONDUCTOR PACKAGE AND FABRICATING METHOD THEREOF"; and U.S. patent application Ser. No. 15/066,724, filed Mar. 10, 2016, and titled "SEMICONDUCTOR PACKAGE AND MANUFACTURING METHOD THEREOF," the contents of each of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 6A-1-6G-2 show cross-sectional views illustrating an example electronic device and an example method of making an example electronic device, in accordance with various aspects of the present disclosure.

FIGS. 8A-1-8J-2 show cross-sectional views illustrating an example electronic device and an example method of making an example electronic device, in accordance with various aspects of the present disclosure.

FIGS. 10A-1-10K show cross-sectional views illustrating an example electronic device and an example method of making an example electronic device, in accordance with various aspects of the present disclosure.

SUMMARY

Figure 1:
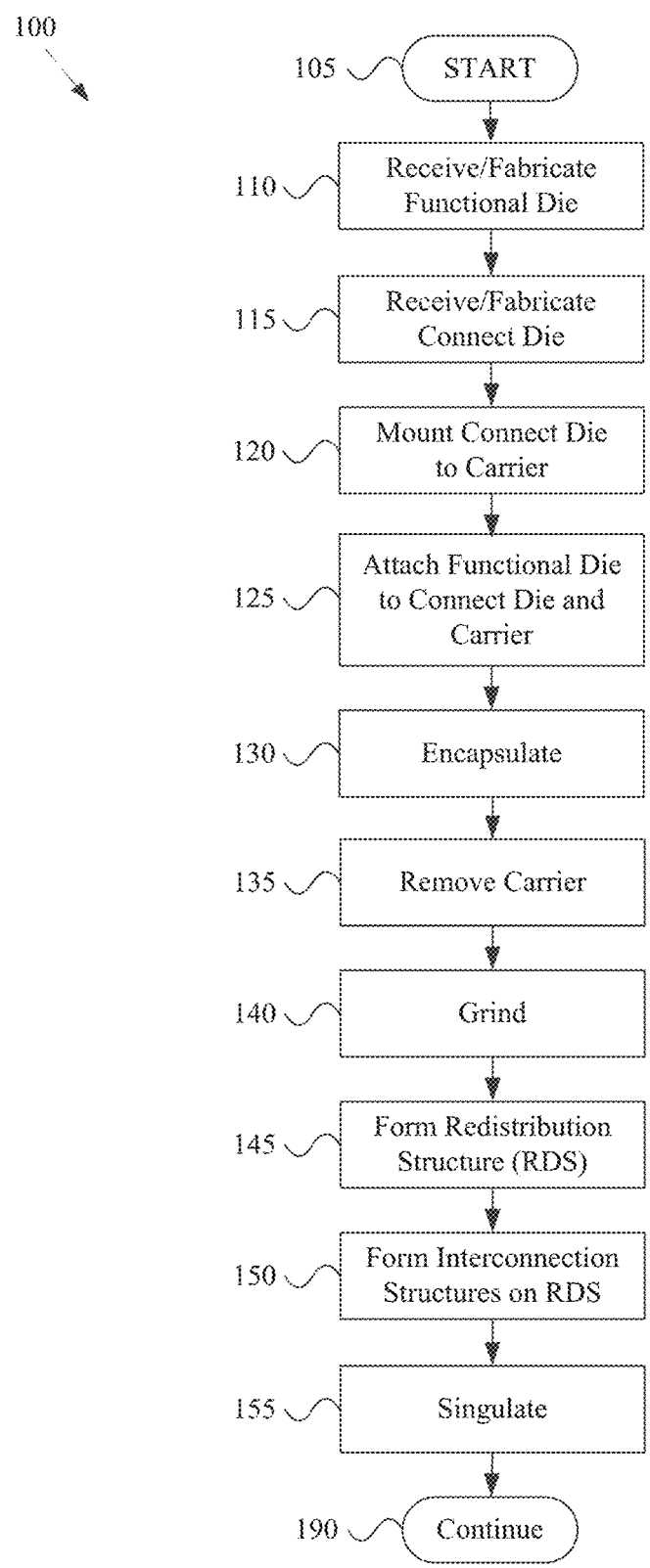
FIG. 1 shows a flow diagram of an example method of making an electronic device, in accordance with various aspects of the present disclosure.

Various aspects of this disclosure provide a semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, and/or increase the manufacturability of the semiconductor device or package.

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method of making an electronic device (e.g., a semiconductor package, etc.). The example method 100 may, for example, share any or all characteristics with any other example method(s) discussed herein (e.g., the example method 300 of FIG. 3, the example method 500 of FIG. 5, the example method 700 of FIG. 7, the example method 900 of FIG. 9, etc. FIGS. 2A-2M show cross-sectional views illustrating an example electronic device (e.g., a semiconductor package, etc.) and an example method of making an example electronic device, in accordance with various aspects of the present disclosure. FIGS. 2A-2M may, for example, illustrate an example electronic device at various blocks (or steps) of the method 100 of FIG. 1. FIGS. 1 and 2A-2M will now be discussed together. It should be noted that the order of the example blocks of the method 100 may vary without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, etc. Also for example, the method 100 may begin executing in response to an operator command to begin. Additionally for example, the method 100 may begin executing in response to receiving execution flow from any other method block (or step) discussed herein.

The example method 100 may, at block 110, comprise receiving and/or fabricating a plurality of functional die. Various example aspects of block 110 are presented at FIG. 2A.

Block 110 may comprise receiving and/or fabricating a plurality of functional die in any of a variety of manners, non-limiting examples of which are provided herein. Block 110 may, for example, comprise receiving the plurality of functional die from an upstream manufacturing process at a same facility or geographical location. Block 110 may also, for example, comprise receiving the functional die from a supplier (e.g., from a foundry).

Figure 2A:
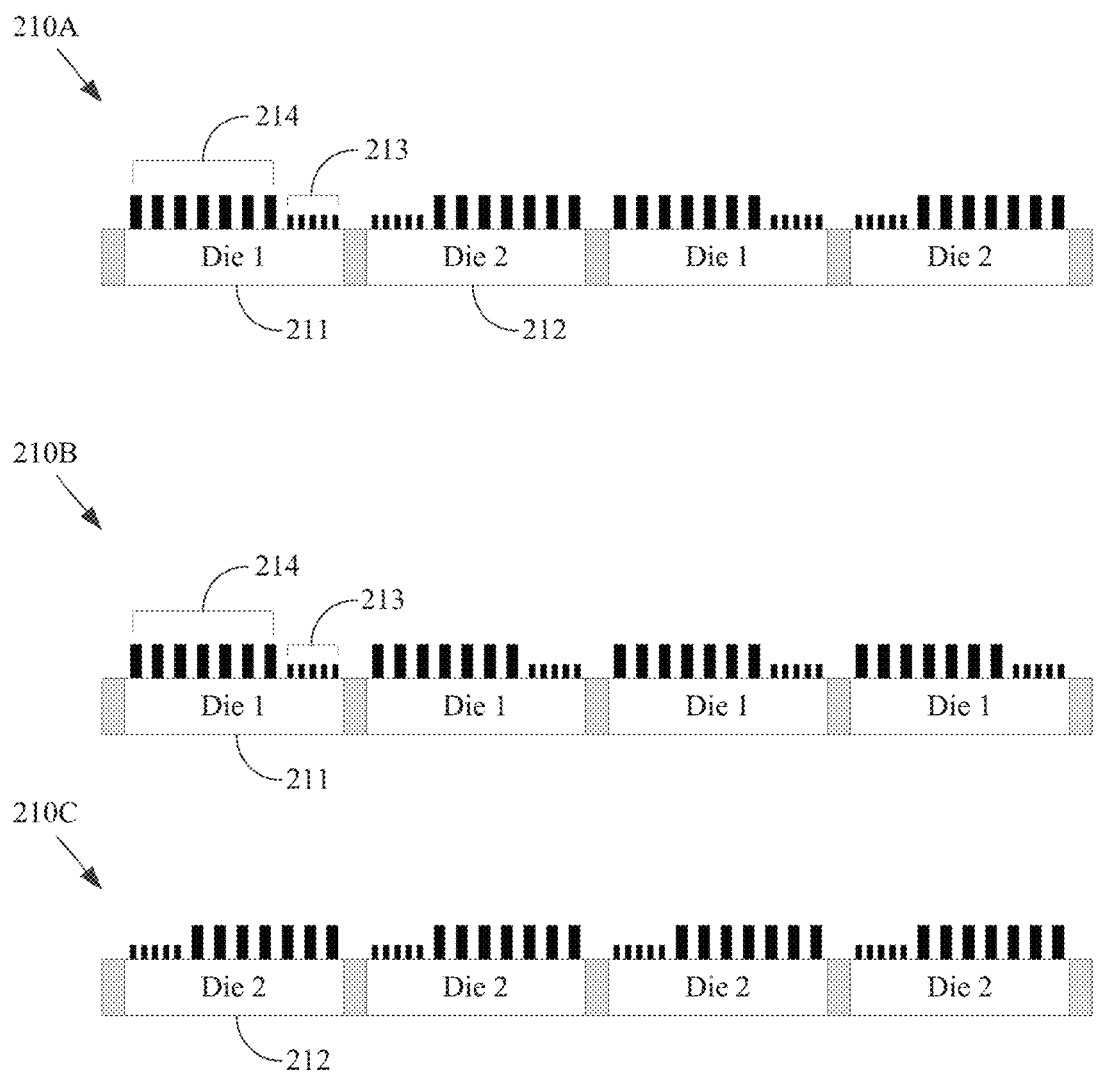
FIGS. 2A-2M show cross-sectional views illustrating an example electronic device and an example method of making an example electronic device, in accordance with various aspects of the present disclosure.

The received and/or fabricated functional die may comprise any of a variety of characteristics. For example, the received die may comprise a plurality of different die on a same wafer (e.g., a Multi-Project Wafer (MPW)). For example, as shown at FIG. 2A, the example wafer 210A comprises a plurality of different types of functional dies, for example Die 1 at label 211 and Die 2 at label 212. For example, the first die 211 may comprise a processor, and the second die 212 may comprise a memory chip. Also for example, the first die 211 may comprise a processor, and the second die 212 may comprise a co-processor. Additionally for example, the first die 211 and second die 212 may both comprise memory chips. In general, the first die 211 and/or second die 212 may comprise active semiconductor circuitry.

Though the example wafer 210A is shown as an MPW, block 110 may also comprise receiving the functional dies in one or more respective wafers dedicated to single types of dies. For example, as shown at FIG. 2A, the wafer 210B is dedicated to an entire wafer of Die 1, an example of which is shown at label 211, and the wafer 210C is dedicated to an entire wafer of Die 2, an example of which is shown at label 212. It should be understood that, although various examples shown herein generally relate to first and second functional dies (e.g., Die 1 and Die 2), the scope of this disclosure extends to any number of functional dies (e.g., three die, four die, etc.) of the same or different types.

The functional die 211 and 212 may comprise die interconnection structures. For example, the first functional die 211, as shown in FIG. 2A, comprises a first set of one or more die interconnection structures 213, and a second set of one or more die interconnection structures 214. Similarly, the second functional die 212 may comprise such structures. The die interconnection structures 213 and 214 may comprise any of a variety of die interconnection structure characteristics, non-limiting examples of which are provided herein.

The first die interconnection structures 213 may, for example, comprise metal (e.g., copper, aluminum, etc.) pillars or lands. The first die interconnection structures 213 may also, for example, comprise conductive bumps (e.g., C4 bumps, etc.) or balls, wires, etc.

The first die interconnection structures 213 may be formed in any of a variety of manners. For example, the first die interconnection structures 213 may be plated on die pads of the functional die 211. Also for example, the first die interconnection structures 213 may be printed and reflowed, wire bonded, etc.

The first die interconnection structures 213 may, for example, be capped. For example, the first die interconnection structures 213 may be solder-capped. Also for example, the first die interconnection structures 213 may be capped with a metal layer (e.g., a metal layer that forms a substitutional solid solution or intermetallic compounds with copper). For example, the first die interconnection structures 213 may be formed and/or connected as explained in U.S. patent application Ser. No. 14/963,037, filed on Dec. 8, 2015, and titled "Transient Interface Gradient Bonding for Metal Bonds," the entire content of which is hereby incorporated herein by reference. Additionally for example, the first die interconnection structures 213 may be formed and/or connected as explained in U.S. patent application Ser. No. 14/989,455, filed on Jan. 6, 2016, and titled "Semiconductor Product with Interlocking Metal-to-Metal Bonds and Method for Manufacturing Thereof," the entire content of which is hereby incorporated herein by reference.

The first die interconnection structures 213 may, for example, comprise any of a variety of dimensional characteristics. For example, in an example implementation, the first die interconnection structures 213 may comprise a pitch (e.g., a center-to-center spacing) of 30 microns and a diameter (or width, minor or major axis width, etc.) of 17.5 microns. Also for example, in an example implementation, the first die interconnection structures 213 may comprise a pitch in the 20-40 micron range and a diameter (or width, minor or major axis width, etc.) in the 10-25 micron range. The first die interconnection structures 213 may, for example, be 15-20 microns tall.

The second die interconnection structures 214 may, for example, share any or all characteristics with the first die interconnection structures 213. Some or all of the second die interconnection structures 214 may, for example, be substantially different from the first die interconnection structures 213.

The second die interconnection structures 214 may, for example, comprise metal (e.g., copper, aluminum, etc.) pillars or lands. The second die interconnection structures 214 may also, for example, comprise conductive bumps (e.g., C4 bumps, etc.) or balls, wires, etc. The second die interconnection structures 214 may, for example, be the same general type of interconnection structure as the first die interconnection structures 213, but need not be. For example, both the first die interconnection structures 213 and the second die interconnection structures 214 may comprise copper pillars. Also for example, the first die interconnection structures 213 may comprise metal lands, and the second die interconnection structures 214 may comprise copper pillars.

The second die interconnection structures 214 may be formed in any of a variety of manners. For example, the second die interconnection structures 214 may be plated on die pads of the functional die 211. Also for example, the second die interconnection structures 214 may be printed and reflowed, wire bonded, etc. The second die interconnection structures 214 may be formed in a same process step as the first die interconnection structures 213, but such die interconnection structures 213 and 214 may also be formed in separate respective steps and/or in overlapping steps.

For example, in a first example scenario, a first portion of each of the second die interconnection structures 214 (e.g., a first half, a first third, etc.) may be formed in a same first plating operation as the first die interconnection structures 213. Continuing the first example scenario, a second portion of each of the second die interconnection structures 214 (e.g., a second half, a remaining two thirds, etc.) may then be formed in a second plating operation. For example, during the second plating operation, the first die interconnection structures 213 may be inhibited from additional plating (e.g., by a dielectric or protective mask layer formed thereon). In another example scenario, the second die interconnection structures 214 may be formed in a second plating process that is completely independent of a first plating process utilized for formation of the first die interconnection structures 213, which may for example be covered by a protective mask layer during the second plating process.

The second die interconnection structures 214 may, for example, be non-capped. For example, the second die interconnection structures 214 might not be solder-capped. In an example scenario, the first die interconnection structures 213 may be capped (e.g., solder-capped, metal layer capped, etc.) while the second die interconnection structures 214 are not capped. In another example scenario, none of the first die interconnection structures 213 and the second die interconnection structures 214 is capped.

The second die interconnection structures 214 may, for example, comprise any of a variety of dimensional characteristics. For example, in an example implementation, the second die interconnection structures 214 may comprise a pitch (e.g., a center-to-center spacing) of 80 microns and a diameter (or width) of 25 microns or more. Also for example, in an example implementation, the second die interconnection structures 214 may comprise a pitch in the 50-80 micron range and a diameter (or width, minor or major axis width, etc.) in the 20-30 micron range. Additionally for example, in an example implementation, the second die interconnection structures 214 may comprise a pitch in the 80-150 micron range and a diameter (or width, minor major axis width, etc.) in the 25-40 micron range. The second die interconnection structures 214 may, for example, be 40-80 microns tall.

It should be noted that the functional dies (e.g., in wafer form) may be thinned at this point from their original die thickness (e.g., by grinding, mechanical and/or chemical thinning, etc.), but need not be. For example, the functional die wafers (e.g., 210A, 210B, 210C, etc.) may be full thickness wafers. Also, for example, the functional die wafers (e.g., 210A, 210B, 210C, etc.) may be at least partially thinned to reduce the thickness of the resulting package while still providing for safe handling of the wafers.

In general, block 110 may comprise receiving and/or fabricating a plurality of functional die. Accordingly, the scope of this disclosure should not be limited by characteristics of any particular manner of such receiving and/or fabricating, nor by any particular characteristics of such functional die.

The example method 100 may, at block 115, comprise fabricating and/or receiving connect die. Various example aspects of block 115 are presented at FIG. 2B and FIG. 2C.

Block 115 may comprise receiving and/or fabricating a plurality of connect die in any of a variety of manners, non-limiting examples of which are provided herein. Block 115 may, for example, comprise receiving the plurality of connect die from an upstream manufacturing process at a same facility or geographical location. Block 115 may also, for example, comprise receiving the connect die from a supplier (e.g., from a foundry).

Figure 2B:
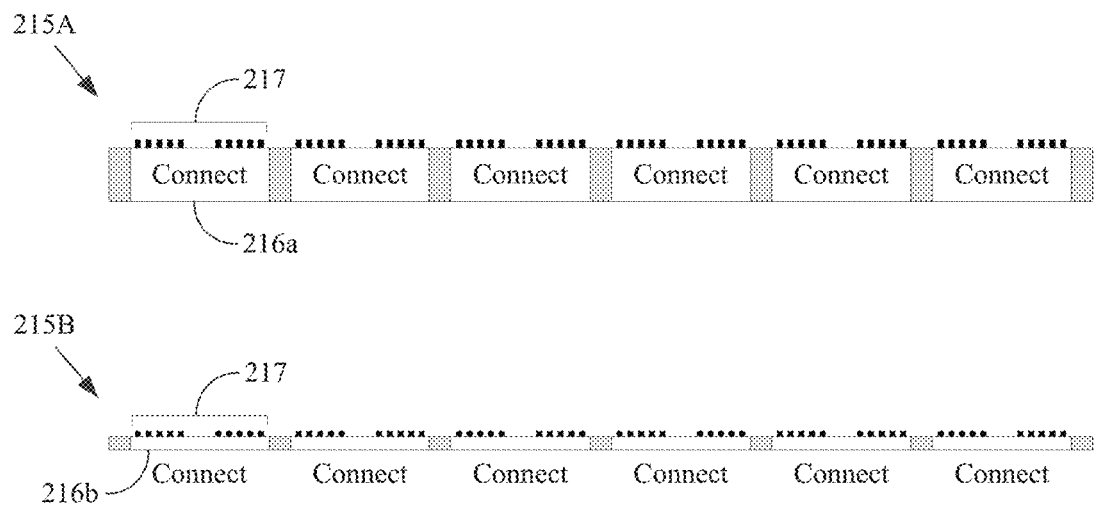

The received and/or fabricated connect die may comprise any of a variety of characteristics. For example, the received and/or fabricated die may comprise a plurality of connect die on a wafer (e.g., a silicon or other semiconductor wafer, etc.). For example, as shown at FIG. 2B, the example wafer 215A comprises an entire wafer of connect die, an example of which is shown at label 216a. It should be understood that, although various examples shown herein generally relate to the utilization of a single connect die in a package, multiple connect die (e.g., of a same or different design) may be utilized in a single electronic device package.

The connect die may comprise die interconnection structures. For example, the example connect die 216a shown in FIG. 2B comprises connect die interconnection structures 217. The connect die interconnection structures 217 may comprise any of a variety of interconnection structure characteristics, non-limiting examples of which are provided herein. Though this discussion will generally present all of the connect die interconnection structures 217 as being the same as each other, they may also be different from each other. For example, referring to FIG. 2B, the left portion of the connect die interconnection structures 217 may be the same as, or different from, the right portion of the connect die interconnection structures 217.

The connect die interconnection structures 217 and/or the formation thereof may share any or all characteristics with the first die interconnection structures 213 and/or the second die interconnection structures 214, and/or the formation thereof, discussed herein. In an example implementation, a first portion of the connect die interconnection structures 217 may comprise spacing, layout, shape, size, and/or material characteristics that provide for mating such first portion to respective first die interconnection structures 213 of a first functional die 211, and a second portion of the connect die interconnection structures 217 may comprise spacing, layout, shape, size, and/or material characteristics that provide for mating such second portion to respective first die interconnection structures 213 of a second functional die 212.

The connect die interconnection structures 217 may, for example, comprise metal (e.g., copper, aluminum, etc.) pillars or lands. The connect die interconnection structures 217 may also, for example, comprise conductive bumps (e.g., C4 bumps, etc.) or balls, wires, etc.

The connect die interconnection structures 217 may be formed in any of a variety of manners. For example, the connect die interconnection structures 217 may be plated on die pads of the connect die 216a. Also for example, the connect die interconnection structures 217 may be printed and reflowed, wire bonded, etc.

The connect die interconnection structures 217 may, for example, be capped. For example, the connect die interconnection structures 217 may be solder-capped. Also for example, the connect die interconnection structures 217 may be capped with a metal layer (e.g., a metal layer that forms a substitutional solid solution or intermetallic compounds with copper). For example, the connect die interconnection structures 217 may be formed and/or connected as explained in U.S. patent application Ser. No. 14/963,037, filed on Dec. 8, 2015, and titled "Transient Interface Gradient Bonding for Metal Bonds," the entire content of which is hereby incorporated herein by reference. Additionally for example, the connect die interconnection structures 217 may be formed and/or connected as explained in U.S. patent application Ser. No. 14/989,455, filed on Jan. 6, 2016, and titled "Semiconductor Product with Interlocking Metal-to-Metal Bonds and Method for Manufacturing Thereof," the entire content of which is hereby incorporated herein by reference.

The connect die interconnection structures 217 may, for example, comprise any of a variety of dimensional characteristics. For example, in an example implementation, the connect die interconnection structures 217 may comprise a pitch (e.g., a center-to-center spacing) of 30 microns and a diameter (or width, minor or major axis width, etc.) of 17.5 microns. Also for example, in an example implementation, the connect die interconnection structures 217 may comprise a pitch in the 20-40 micron range and a diameter (or width, minor or major axis width, etc.) in the 10-25 micron range. The connect die interconnection structures 217 may, for example, be 15-20 microns tall.

In an example scenario, the connect die interconnection structures 217 may comprise copper pillars that mate with respective first die interconnection structures 213 (e.g., metal lands, copper pillars, etc.) of a first functional die 211 and a second functional die 212.

The connect die 216a (or a wafer 215A thereof) may be formed in any of a variety of manners, non-limiting examples of which are discussed herein. For example, referring to FIG. 2C, the connect die 216a (or wafer 215A thereof) may, for example, comprise a support layer 290 (e.g., a silicon or other semiconductor layer, etc.). A redistribution (RD) structure 298 may be formed on the support layer 290. The RD structure 298 may, for example, comprise a base dielectric layer 291, a first dielectric layer 293, first conductive traces 292, a second dielectric layer 296, second conductive traces 295, and connect die interconnection structures 217.

The base dielectric layer 291 may, for example, be on the support layer 290. The base dielectric layer 291 may, for example, comprise an oxide layer, a nitride layer, etc. The base dielectric layer 291 may, for example, be formed to specification and/or may be native. The base dielectric layer 291 may be referred to as a passivation layer. The base dielectric layer 291 may be or comprise, for example, a silicon dioxide layer formed using a low pressure chemical vapor deposition (LPCVD) process.

The connect die 216a (or wafer 215A thereof) may also, for example, comprise first conductive traces 292 and a first dielectric layer 293. The first conductive traces 292 may, for example, comprise deposited conductive metal (e.g., copper, aluminum, tungsten, etc.). The first conductive traces 292 may, for example, be formed by sputtering, electro-plating, electroless plating, etc. The first conductive traces 292 may, for example, be formed at a sub-micron or sub-two-micron pitch (or center-to-center spacing). The first dielectric layer 293 may, for example, comprise an inorganic dielectric material (e.g., silicon oxide, silicon nitride, etc.). Note that in various implementations, the first dielectric layer 293 may be formed prior to the first conductive traces 292, for example formed with apertures which are then filled with the first conductive traces 292 or a portion thereof. In an example implementation, for example comprising copper conductive traces, a dual damascene process may be utilized to deposit the traces.

In an alternative assembly, the first dielectric layer 293 may comprise an organic dielectric material. For example, the first dielectric layer 293 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The organic dielectric material may be formed in any of a variety of manners, for example chemical vapor deposition (CVD). In such an alternative assembly, the first conductive traces 292 may, for example, be at a 2-5 micron pitch (or center-to-center spacing).

The connect die 216a (or wafer 215A thereof) may also, for example, comprise second conductive traces 295 and a second dielectric layer 296. The second conductive traces 295 may, for example, comprise deposited conductive metal (e.g., copper, etc.). The second conductive traces 295 may, for example, be connected to respective first conductive traces 292 through respective conductive vias 294 or apertures (e.g., in the first dielectric layer 293). The second dielectric layer 296 may, for example, comprise an inorganic dielectric material (e.g., silicon oxide, silicon nitride, etc.). In an alternative assembly, the second dielectric layer 296 may comprise an organic dielectric material. For example, the second dielectric layer 296 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The second dielectric layer 296 may, for example, be formed using a CVD process, but the scope of this disclosure is not limited thereto.

Figure 2C:
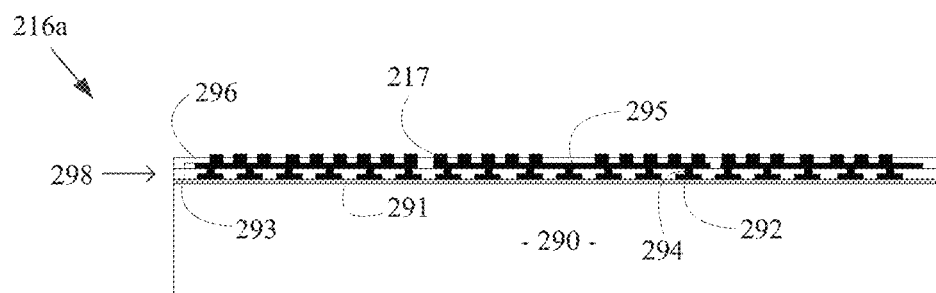

Though two sets of dielectric layers and conductive traces are illustrated in FIG. 2C, it should be understood that the RD structure 298 of the connect die 216a (or wafer thereof) may comprise any number of such layers and traces. For example, the RD structure 298 might comprise only one dielectric layer and/or set of conductive traces, three sets of dielectric layers and/or conductive traces, etc.

The connect die interconnection structures 217 (e.g., conductive bumps, conductive balls, conductive pillars, conductive lands or pads, etc.) may be formed on a surface of the RD structure 298. Examples of such connect die interconnection structures 217 are shown in FIG. 2C, in which connect die interconnection structures 217 are shown formed on the front (or top) side of the RD structure 298 and electrically connected to respective second conductive traces 295 through conductive vias in the second dielectric layer 296. Such connect die interconnection structures 217 may, for example, be utilized to couple the RD structure 298 to various electronic components (e.g., active semiconductor components or die, passive components, etc.), including for example the first functional die 211 and second function die 212 discussed herein.

The connect die interconnection structures 217 may, for example, comprise any of a variety of conductive materials (e.g., any one of or a combination of copper, nickel, gold, etc.). The connect die interconnection structures 217 may also, for example, comprise solder. Also for example, the connect die interconnection structures 217 may comprise solder balls or bumps, multi-ball solder columns, elongated solder balls, metal (e.g., copper) core balls with a layer of solder over a metal core, plated pillar structures (e.g., copper pillars, etc.), wire structures (e.g., wire bonding wires), etc.

Referring to FIG. 2B, the wafer 215A of connect die 216a may be thinned, for example to produce the thin connect die wafer 215B of thin connect die 216b. For example, the thin connect die wafer 215B may be thinned (e.g., by grinding, chemical and/or mechanical thinning, etc.) to an extent that still allows for safe handling of the thin connect die wafer 215B and/or individual thin connect die 216b thereof, yet provides for a low profile. For example, referring to FIG. 2C, in an example implementation in which the support layer 290 comprises silicon, the thin connect die 216b may still comprise at least a portion of the silicon support layer 290. For example, the bottom side (or back side) of the thin connect die 216b may comprise enough of the non-conductive support layer 290, base dielectric layer 291, etc., to prohibit conductive access at the bottom side of the remaining support layer 290 to the conductive layers at the top side.

For example, in an example implementation, the thin connect die wafer 215B (or thin connect die 216b thereof) may have a thickness of 50 microns or less. In another example implementation, the thin connect die wafer 215B (or thin connect die 216b thereof) may have a thickness in a range from 20 to 40 microns. As will be discussed herein the thickness of the thin connect die 216b may be smaller than the length of the second die interconnection structures 214 of the first die 211 and the second die 212, for example so that the thin connect die 216b can fit between the carrier and the dies 211 and 212.

In general, block 115 may comprise fabricating and/or receiving connect die. Accordingly, the scope of this disclosure should not be limited by characteristics of any particular manner of such fabricating and/or receiving or by any particular characteristics of such connect die.

The example method 100 may, at block 120, comprise mounting the connect die to a carrier. Various example aspects of block 120 are presented at FIG. 2D.

Figure 2D:
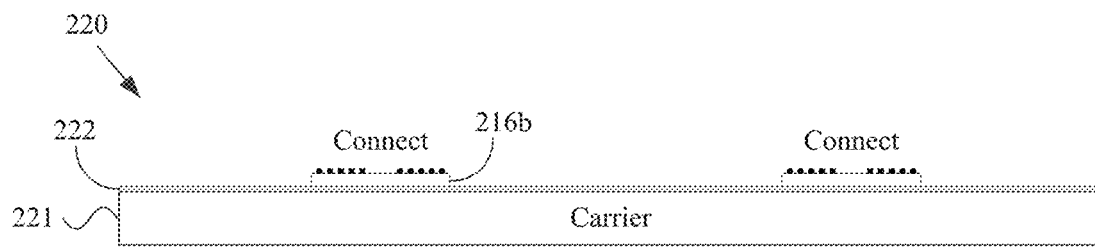

As shown in FIG. 2D, the connect die (e.g., the thin connect die 216b) may be attached to a carrier 221. The thin connect die 216b may, for example, be received as individual die or may be received as a thin connect die wafer 215B and then singulated from the thin connect die wafer 215B.

The carrier 221 may comprise any of a variety of characteristics. For example, the carrier 221 may comprise a metal carrier (e.g., a plate, a disc, etc.). Also for example, the carrier 221 may comprise a glass carrier, a silicon or other semiconductor carrier, etc. The carrier 221 may, for example, be panel-shaped (e.g., square-shaped, rectangular-shaped, etc.), wafer-shaped, etc.

In an example implementation, the carrier 221 may comprise a pattern to enhance die placement accuracy. Accordingly, block 120 may comprise receiving the carrier with such patterned already formed thereon and/or may comprise forming the pattern. The pattern may comprise any of a variety of characteristics. For example, the pattern may be temporarily formed on the carrier (e.g., formed each time the carrier is used, etc.) or may be permanently formed on the carrier. The pattern may, for example, comprise a pattern of conductive traces and/or dielectric features (e.g., die outlines, dot or cross-hair or arrow fiducials, etc.). The connect die mounting at block 120 and/or the functional die attachment at block 125 may utilize the pattern to enhance the positioning accuracy of such die (e.g., utilizing vision system enhanced machine die placement).

In an example implementation, which will be discussed herein in more detail (e.g., with respect to FIGS. 5 and 6), the carrier 221 may comprise a carrier on which a signal distribution structure (or redistribution structure) has been formed.

The thin connect die 216b may, for example, be attached (or coupled) to the carrier 221 utilizing a layer (or film) of adhesive 222. The adhesive 222 may comprise any of a variety of characteristics. The adhesive 222 may, for example, comprise a thermal-release adhesive. The adhesive 222 may also, for example, a chemically and/or mechanically released adhesive, a light-released adhesive, etc. The adhesive 222 may be applied in any of a variety of manners. For example, the adhesive 222 may be applied as a preformed sheet, printed, spun on, sprayed on, vapor deposited, rolled on, etc.

The thin connect die 216b (e.g., a plurality thereof) may be attached to the carrier 221 back-side-down. For example, as explained herein, the back side of the thin connect die 216b (e.g., the bottom side in FIG. 2D) may be formed such that no electrical signals are transferred through the back side. For example, even after being thinned, the thin connect die 216b may comprise the base dielectric layer 291 and/or a portion of the support layer 290 (e.g., a silicon support layer, etc.). In an example implementation, there are no electrical conductors exposed at the back side of the thin connect die 216b. In the back-side-down configuration shown in FIG. 2D, the connect die interconnection structures 217 are oriented facing upward (e.g., facing away from and/or extending away from the carrier 221).

It should be noted that although the discussion herein generally focuses on a single thin connect die 216b, as shown in various figures a plurality of thin connect dies may be attached to a single carrier 221.

In general, block 120 may comprise mounting the connect die to a carrier. Accordingly, the scope of this disclosure should not be limited by characteristics of any particular manner of such attaching or by any particular characteristics of such connect die and/or carrier.

The example method 100 may, at block 125, comprise attaching the functional die to the connect die and to the carrier. Various example aspects of block 125 are presented at FIG. 2E.

The functional die 211 and 212 may, for example, be received as individual die. Also for example, the functional die 211 and 212 may be received on a single wafer 210A, the functional die 211 and 212 may be received on multiple respective wafers 210B and 210C, etc. In a scenario in which one or both of the functional die are received in wafer form, the functional die may be singulated from the wafer. Note that if the functional die 211 and 212 are received on a single MPW 210A, the first and second die may be singulated from the wafer 210A as an attached pair (e.g., connected with silicon).

The functional die 211 and 212 may be attached to the thin connect die 216b and/or to the carrier 221. In the example 225 shown at FIG. 2E, the functional die 211 and 212 are attached to the thin connect die 216b and to the carrier 221. Such connections to the thin connect die 216b and to the carrier 221 may, however, be different from each other.

For example, the first die interconnection structures 213 of the first functional die 211 and of the second functional die 212 may be mechanically and electrically connected to respective connect die interconnection structures 217. The first die interconnection structures 213 of the first functional die 211 may be connected to a left portion of the connect die interconnection structures 217, and the first die interconnection structures 213 of the second functional die 212 may be connected to a right portion of the connect die interconnection structures 217.

Such interconnection structures may be connected in any of a variety of manners. For example, the connection may be performed by soldering. In an example implementation, the first die interconnection structures 213 and/or the connect die interconnection structures 217 may comprise solder caps that may be reflowed to perform the connection. Such solder caps may, for example, be reflowed by mass reflow, thermal compression bonding (TCB), etc. In another example implementation, the first die interconnection structures 213 may comprise solder (e.g., solder capped copper pillars, etc.), and the second die interconnection structures 214 might not comprise solder (e.g., non-solder capped copper pillars, etc.). In another example implementation, the connection may be performed by direct metal-to-metal (e.g., copper-to-copper, etc.) bonding. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference.

After the connection of the first die interconnection structures 213 of the first functional die 211 and of the second functional die 212 to the thin connect die 216a, the thin connect die 216a provides electrical connectivity between the first die interconnection structures 213 of the first functional die 211 and respective first die interconnection structures 213 of the second functional die 212. As discussed herein, electrical connectivity between the first die interconnection structures 213 and the back side (e.g., the bottom side in FIG. 2E) of the thin connect die 216b might not be provided.

As discussed herein, underfill may be applied between the functional die 211 and 212 and the thin connect die 216b. In a scenario in which pre-applied underfill (PUF) is utilized, such PUF may be applied to the thin connect die 216b and/or functional die 211 and 212 before the attachment of the first die interconnection structures 213 to the connect die interconnection structures 217. Also for example, a capillary underfill may be formed after such attachment.

The second die interconnection structures 214 of the first functional die 211 and/or of the second functional die 212 may, for example, be mechanically connected to the carrier 221. The second die interconnection structures 214 of the first functional die 211 may be connected to the carrier 221 at a left side of the thin connect die 216b, and the second die interconnection structures 214 of the second functional die 212 may be connected to the carrier 221 at a right side of the thin connect die 216b.

Such second die interconnection structures 214 may be connected to the carrier 221 in any of a variety of manners. For example, the second die interconnection structures 214 may be mechanically coupled to the carrier 221 using the same adhesive layer 222 as discussed herein with regard to attachment of the thin connect die 216b to the carrier 221. As with the thin connect die 216b, the second die interconnection structures 214 may be adhered to the top surface of the adhesive layer 222, but may also extend into the adhesive layer 222. In such a manner, mold material from a later step (if performed) may be prevented from flashing onto the surfaces of the thin connect die 216b and/or second die interconnection structures 214 that are extended into the adhesive layer 222. Alternatively, the second die interconnection structures 214 may be mechanically coupled to the carrier 221 in a different manner than the thin connect die 216b.

As discussed herein, the second die interconnection structures 214 at this point may be non-capped, but may be capped in various implementations.

In an example implementation, the first die interconnection structures 213 of a functional die 211 and 212 may be coupled to respective connect die interconnection structures 217 at the same time that the second die interconnection structures 214 of the functional die 211 and 212 are coupled to the carrier 221. Note that such simultaneity is not necessary, however. For example, a reflow process to complete bonding of the first die interconnection structures 213 to the connect die interconnection structures 217 may be performed after the second die interconnection structures 214 are adhesively attached to the carrier 221.

It should be noted that a testing process may be performed between attachment of the first functional die 211 and the second functional die 212. In such a scenario, as discussed herein, underfill may be applied between the first functional die 211 and the thin connect die 216b prior to such test. In an example scenario, having passed electrical test, the second functional die 212 may then be attached (e.g., with or without underfill).

It should also be noted that although the illustrations herein generally present the first functional die 211 (and interconnection structures thereof) and the second functional die 212 (and interconnection structures thereof) as being symmetrical with regard to each other, such symmetry is not required. For example, the functional die 211 and 212 may be of different respective shapes and sizes, may have different respective types and/or numbers of interconnection structures, etc.

It should additionally be noted that although the discussion herein generally focuses on two functional die coupled to a single connect die, the scope of this disclosure is not limited thereto. For example, any number of functional die (e.g., three die, four die, one die, etc.) may be coupled to a single connect die. Also for example, any number of connect die may be utilized in a single package.

In general, block 125 may comprise attaching the functional die to the connect die and to the carrier. Accordingly, the scope of this disclosure should not be limited by characteristics of any particular manner of such attaching or by any particular characteristics of such functional die, connect die, and/or attachment structures.

The example method 100 may, at block 130, comprise encapsulating the die. Various example aspects of block 130 are presented at FIGS. 2F and 2G.

As discussed herein, during and/or after attachment of the functional die 211 and 212 to the thin connect die 216*b*, underfill 223 may be applied between the functional die 211 and 212 and the thin connect die 216*b*. Such underfill 223 may comprise a pre-applied underfill (PUF) that is applied before the functional die 211 and 212 are connected to the thin connect die 216*b*. Also for example, such underfill 223 may be applied after the attachment. For example, a capillary underfill process may be utilized to form a capillary underfill 223 between the functional die 211 and 212 and the thin connect die 216*b* (e.g., surrounding the first die interconnection structures 213 of the functional die 211 and 212 and the connect die interconnection structures 217 of the thin connect die 216*b*). As shown, such underfill 223 may also cover the front side (or top) surface of the thin connect die 216*b* between the functional die 211 and 212, but need not. In the example shown, the underfill 223 may also cover sides of the thin connect die 216*b*, but need not. Also, in the example shown, the underfill 223 does not cover the second die interconnection structures 214 of the functional die 211 and 212, but in various implementations, such coverage may be implemented.

Figure 2E:
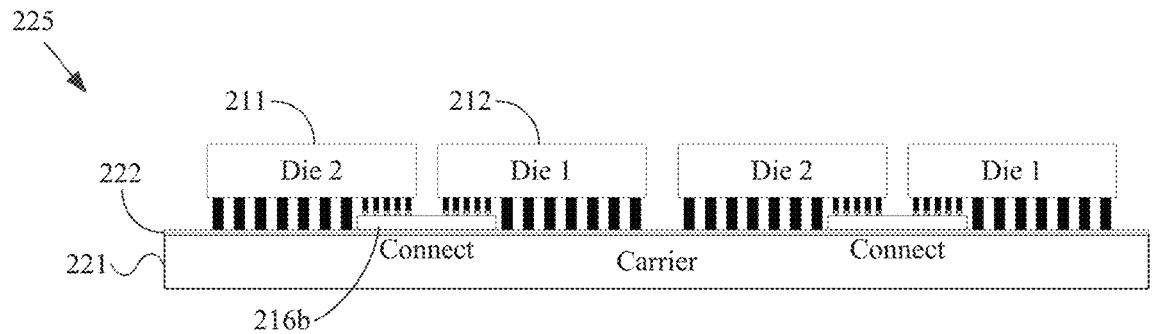
Figure 2F:
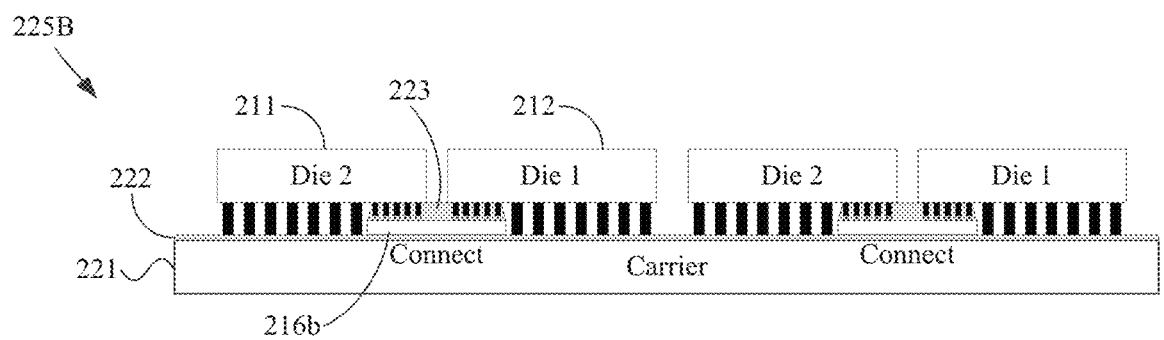
Figure 2G:
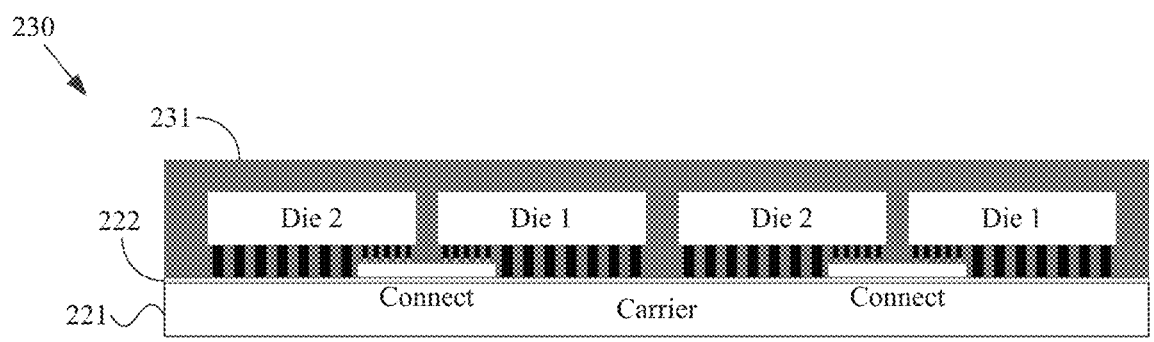
Figure 2H:
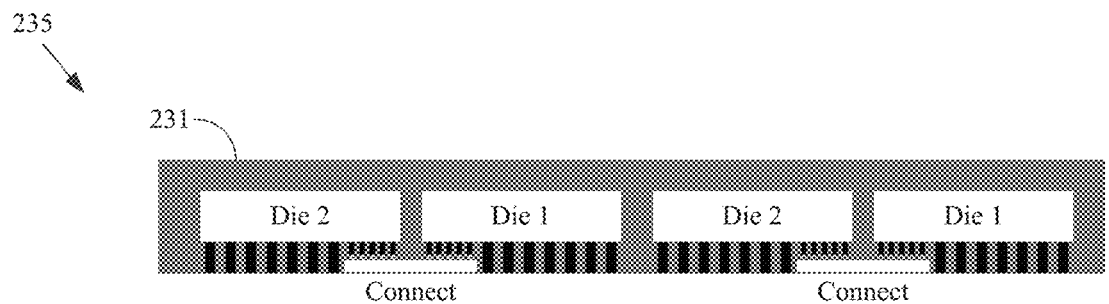
Figure 2I:

As shown in FIG. 2G, an encapsulant 231 is formed that covers various portions of the functional die 211 and 212, the thin connect die 216*b*, and the carrier 221 (or adhesive layer 222). The encapsulant 231 may comprise epoxy molding compound or any of a variety of materials. For example, the encapsulant 231 may comprise a polymer, polymer composite material (such as epoxy resin with filler, epoxy acrylate with filler, or polymer with proper filler), etc.

The encapsulant 231 may be formed in any of a variety of manners. For example, the encapsulating 130 may comprise transfer molding the encapsulant 231. Also for example, the encapsulating 130 may comprise compression molding the encapsulant 231. In an example implementation in which underfill 223 has been formed between at least the functional die 211 and 212 and the thin connect die 216*b*, compression molding or transfer molding may be utilized.

As shown in the example 230 illustrated in FIG. 2G, the encapsulant 231 forms a molded underfill (MUF) between the functional die 211 and 212 and the carrier 221 (or adhesive layer 222), for example surrounding the second die interconnection structures 214 of the functional die 211 and 212. Additionally, for example instead of the underfill 223, the encapsulant 231 may form a molded underfill between the functional die 211 and 212 and the thin connect die 216*b*. The encapsulant 231 may also, for example, cover side and/or top surfaces of the thin connect die 216*b*. The encapsulant 231 may also, for example, cover side, bottom, and top surfaces of the functional die 211 and 212. Note that although the encapsulant 231 is shown covering top (or back) sides of the functional die 211 and 212, the top sides of the functional die 211 and/or 212 may be exposed from the encapsulant 231. For example, in an example implementation, the top surface of the encapsulant 231 may be coplanar with the top surface of one or both of the functional die 211 and 212.

Note that in an example implementation, the underfill 223 may surround the first die interconnection structures 213 and the connect die interconnection structures 217, and the encapsulant 231 may surround the second die interconnection structures 214 and the underfill 223. For example, the encapsulant 231 might not have the physical properties (e.g., filler diameter, etc.) to effectively underfill between the functional die 211 and 212 and the thin connect die 216*b*, and/or the process utilized to form the encapsulant 231 might not have the capabilities to effectively perform such underfilling.

Also note that the encapsulant 231 (e.g., any surface thereof) may be planarized or thinned to a desired thickness. For example, the encapsulant 231 may be thinned to expose the top sides of the functional die 211 and 212, the encapsulant 231 may be thinned to a thickness that still covers the top sides of the functional die 211 and 212, the encapsulant 231 may be thinned just enough to establish a planar surface, the encapsulant 231 and the functional die 211 and 212 may be planarized or thinned to achieve a desired die thickness, etc.

In general, block 130 may comprise encapsulating the die. Accordingly, the scope of this disclosure should not be limited by characteristics of any particular manner of performing such encapsulating and/or underfilling or by any particular characteristics of such encapsulating material and/or underfill.

The example method 100 may, at block 135, comprise removing the carrier. Various example aspects of block 135 are presented at FIG. 2H, for example in comparison to FIG. 2G.

The carrier 221 may be removed in any of a variety of manners, for example depending on how the thin connect die 216*b* and/or second die interconnection structures 214 of the functional ide 211 and 212 are attached to the carrier 221. For example, in an example implementation in which a thermal-release adhesive 222 is utilized to perform such attachment, the assembly 230 may be exposed to temperatures appropriate to cause such thermal-release adhesive 222 to lose its adhesive properties, at least enough to remove the carrier 221. Also for example, the carrier 221 may be removed by peeling, sliding, cutting, grinding, planing, lasing, etc.

After removal of the carrier 221, remnants of the adhesive layer 222 may be cleaned from the carrier 221 (e.g., for reuse of the carrier) and/or from the assembly 235. Such cleaning may, for example, be performed mechanically (e.g., by scrubbing, grinding, etc.) and/or chemically (e.g., utilizing solvents, etc.). Note that in a scenario in which the assembly 235 is going to be subjected to bottom side grinding (or thinning or planarizing), such cleaning of the assembly 235 might not be necessary.

In an example implementation in which the carrier is patterned (e.g., as discussed herein with respect to block 120, etc.), for example in which the pattern is temporarily formed on (or attached to) the carrier, block 135 may comprise removing the carrier from the pattern, and then removing the pattern from the remainder of the assembly in a separate step. Note, however, that entire carrier (e.g., including the pattern, etc.) may be performed in one step.

In general, block 135 may comprise removing the carrier. Accordingly, the scope of this disclosure should not be limited by characteristics of any particular manner of performing such removing or by any particular characteristics of such carrier and/or adhesive or other attachment mechanism.

The example method 100 may, at block 140, comprise grinding the encapsulant, die interconnection structures, and/or connect die. Various example aspects of block 140 are presented at FIG. 2I.

Though grinding is generally presented as an example, block 140 may, for example, comprise performing thinning (or planarizing) in any of a variety of manners (e.g., mechanically, mechanically/chemically (CMP), etc.).

Block 140 may, for example, comprise performing such grinding to reliably expose ends of the second die interconnection structures 214 of the functional die 211 and 212. Also for example, block 140 may comprise grinding the second die interconnection structures 214 to planarize the end surfaces thereof for subsequent processing steps.

Block 140 may also comprise performing additional grinding of the thin connect die 216b. For example, in blocks 115, 120 and 125, the thickness of the thin connect die 216b may have been left large enough to ensure safe handling of the thin connect die 216b and bonding of the functional die 211 and 212 thereto. Now that the thin connect die 216b is additionally protected by the encapsulant 231, additional back side material from the thin connect die 216b (e.g., a second portion of the support layer 290, the remainder thereof, etc.) may be removed. In an example implementation, at least some of the support layer 290 (e.g., silicon) may be left for structural support of the thin connect die 216b. For example, from 10-20 microns of the support layer 290 might remain.

In the example presented, block 140 results in the end surfaces of the second die interconnection structures 214, the back side of the thin connect die 216b, and the grinded surface of the encapsulant 231 being coplanar.

In an example implementation in which the carrier is patterned (e.g., as discussed herein with respect to block 120, etc.), for example in which the pattern is temporarily formed on (or attached to) the carrier, block 135 may comprise removing the carrier from the pattern, and the pattern may be left behind. In such example scenario, block 140 may comprise removing the pattern during the grinding (or other thinning) operation.

In general, block 140 may comprise grinding (or thinning or planarizing) the encapsulant, die interconnection structures, and/or connect die. Accordingly, the scope of this disclosure should not be limited by characteristics of any particular manner of performing such grinding (or thinning or planarizing), nor by any particular characteristics of the grinded (or thinned or planarized) components.

The example method 100 may, at block 145, comprise forming a redistribution structure. Various example aspects of block 145 are presented at FIG. 2J.

Block 145 may comprise forming the redistribution structure 246 in any of a variety of manners, non-limiting examples of which are presented herein. In an example implementation, one or more dielectric layers and one or more conductive layers may be formed to laterally and/or vertically distribute electrical connections to the second die interconnection structures 214 of the functional die 211 and 212.

Figure 2J:
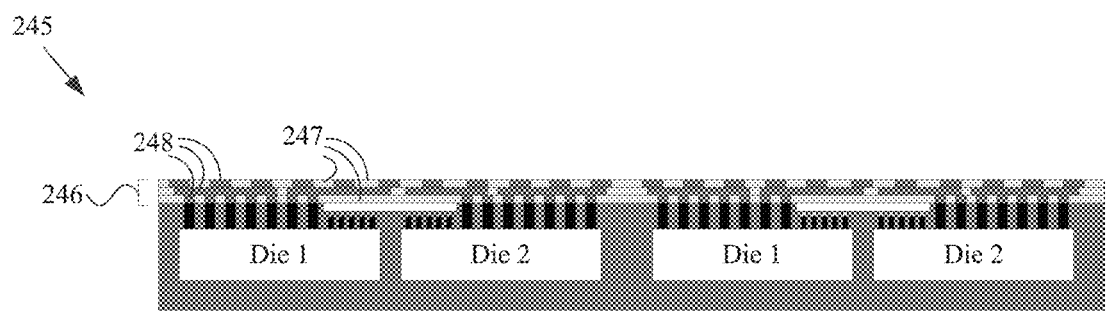
Figure 2K:
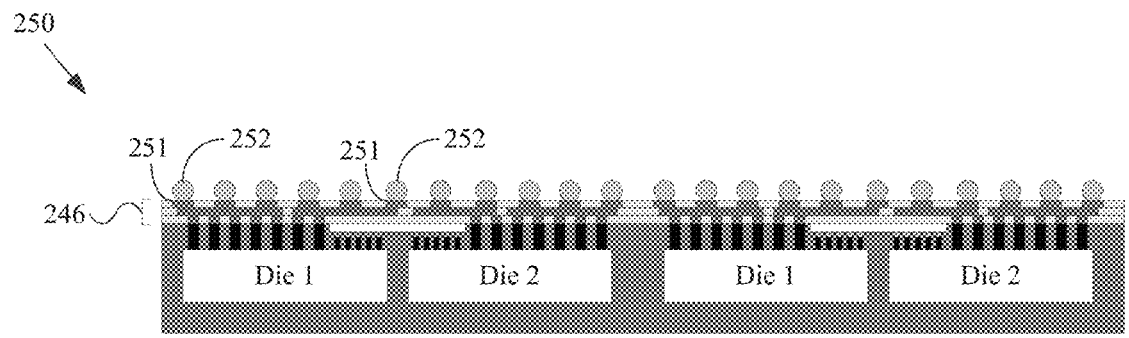

FIG. 2J shows an example in which the redistribution structure 246 comprises three dielectric layers 247 and three conductive layers 248. Such number of layers is merely an example, and the scope of this disclosure is not limited thereto. The example redistribution structure 246 is formed on the encapsulant, the ends of the second die interconnection structures 214, and the back side of the thin connect die 216b.

The dielectric layers 247 may be formed of any of a variety of materials (e.g., Si3N4, SiO2, SiON, PI, BCB, PBO, WPR, epoxy, or other insulating material). The dielectric layers 247 may be formed utilizing any of a variety of processes (e.g., PVD, CVD, printing, spin coating, spray coating, sintering, thermal oxidation, etc.). The dielectric layers 247 may, for example, be patterned to expose various surfaces (e.g., to expose the ends of the second die interconnection structures 214 of the functional die 211 and 212, to expose lower traces or pads of the conductive layers 248, etc.).

The conductive layers 248 may be formed on any of a variety of materials (e.g., copper, silver, gold, aluminum, nickel, combinations thereof, alloys thereof, etc.). The conductive layers 248 may be formed utilizing any of a variety of processes (e.g., electrolytic plating, electroless plating, CVD, PVD, etc.).

The redistribution structure 246 may, for example, comprise conductors exposed at an outer surface thereof (e.g., exposed at the top surface of the assembly 245). Such exposed conductors may, for example, be utilized for the attachment of package interconnection structures. In such an implementation, the exposed conductors may comprise ball pads and underbump metal (UBM) formed thereon to enhance attachment of the package interconnection structures. Such underbump metal may, for example, comprise Ti, Cr, Al, TiW, TiN, or other electrically conductive material.

Example redistribution structures and/or the formation thereof are provided in U.S. patent application Ser. No. 14/823,689, filed Aug. 11, 2015, and titled "SEMICONDUCTOR PACKAGE AND FABRICATING METHOD THEREOF"; and U.S. Pat. No. 8,362,612, titled "SEMICONDUCTOR DEVICE AND MANUFACTURING METHOD THEREOF"; the contents of each of which are hereby incorporated herein by reference in their entirety.

The redistribution structure 246 may, for example, perform a fan-out redistribution of at least some electrical connections, for example laterally moving electrical connections to at least a portion of the second die interconnection structures 214 of the functional dies 211 and 212 to locations outside the footprint of the functional dies 211 and 212. Also for example, the redistribution structure 246 may perform a fan-in redistribution of at least some electrical connections, for example laterally moving electrical connections to at least a portion of the second die interconnection structures 214 of the functional dies 211 and 212 to locations inside the footprint of the thin connect die 216b and/or to inside the footprints of the functional dies 211 and 212.

In general, block 145 may comprise forming a redistribution structure. Accordingly, the scope of this disclosure should not be limited by characteristics of any particular manner of making such a redistribution structure or by any particular characteristics of the redistribution structure.

The example method 100 may, at block 150, comprise forming interconnection structures on the redistribution structure. Various example aspects of block 150 are presented at FIG. 2K. Block 150 may comprise forming interconnection structures in any of a variety of manners, non-limiting examples of which are presented herein.

The example interconnection structures 252 (e.g., package interconnection structures, etc.) may comprise characteristics of any of a variety of interconnection structures. For example, the package interconnection structures 252 may comprise conductive balls (e.g., solder balls, etc.), conductive bumps, conductive pillars, wires, etc.

The interconnection structures 252 may be formed in any of a variety of manners. For example, the interconnection structures 252 may be pasted and/or printed on the redistribution structure 246 (e.g., to respective pads 251 thereof) and then reflowed. Also for example, the interconnection structures 252 (e.g., conductive balls, wires, etc.) may be preformed prior to attachment and then attached to the interconnection structure 246 (e.g., to respective pads 251 thereof), for example reflowed, plated, epoxied, wire-bonded, etc.).

Note that as explained herein, the pads 251 of the redistribution structure 246 may be formed with underbump metal (UBM) or any metallization to assist with the formation of the interconnection structures 252.

In general, block 150 may comprise forming interconnection structures on the redistribution structure. Accordingly, the scope of this disclosure should not be limited by characteristics of any particular manner of forming such interconnection structures or by any particular characteristics of an interconnection structure.

The example method 100 may, at block 155, comprise singulating the packages. Various example aspects of block 155 are presented at FIG. 2L.

Figure 2L:
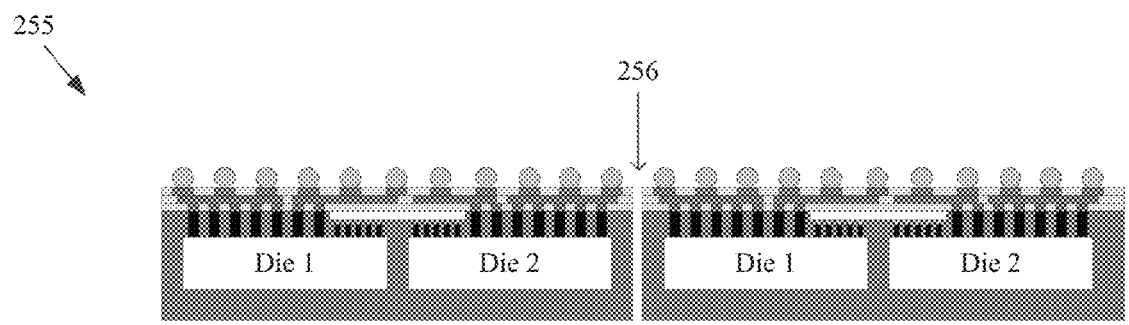

As shown by the examples presented herein, a plurality of like electronic devices (e.g., device packages) can be produced simultaneously (or concurrently) on a single carrier, in a single continuous encapsulant, etc. In such an example in which a plurality of electronic devices (e.g., device packages) are formed in a single overall structure, the individual devices may then be singulated (or excised) from such structure. For example, as shown in FIG. 2L, individual electronic devices (or packages) may be cut at cut lines 256 (or singulation streets) to separate out the individual devices. Such singulation may be performed in a variety of manners (e.g., sawing with a blade, laser cutting, etc.).

Figure 2M:
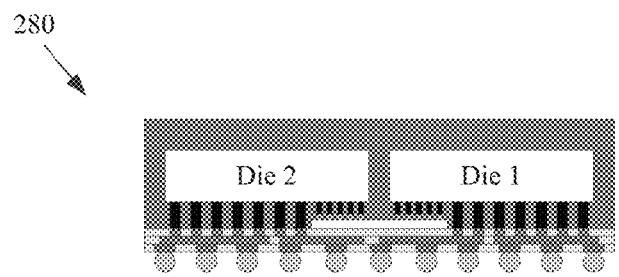

An example of an electronic device 280 (e.g., a semiconductor package) resulting from the example method 100 is shown at FIG. 2M.

The example method 100 may, at block 190, comprise performing continued processing. Such continued processing may comprise any of a variety of characteristics. For example, block 190 may comprise returning execution flow of the example method 100 to any block thereof. Also for example, block 190 may comprise directing execution flow of the example method 100 to any other method block (or step) discussed herein (e.g., with regard to the example method 300 of FIG. 3, etc.).

Figures 1, 6A:
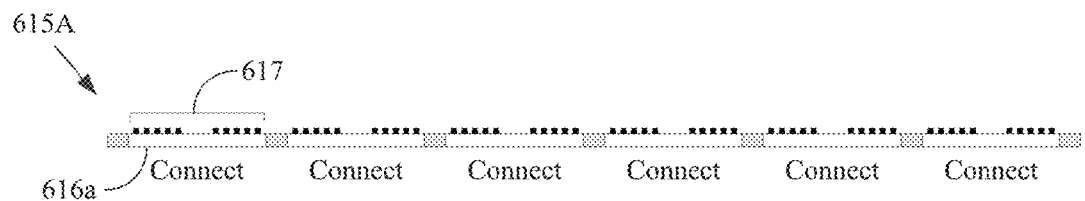
Figures 2, 6A:
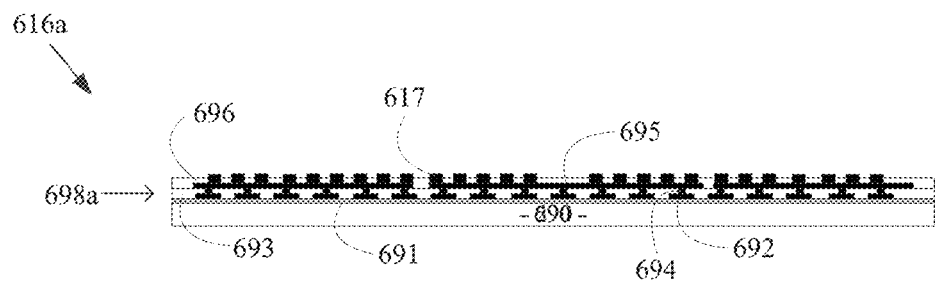
Figures 3, 6A:
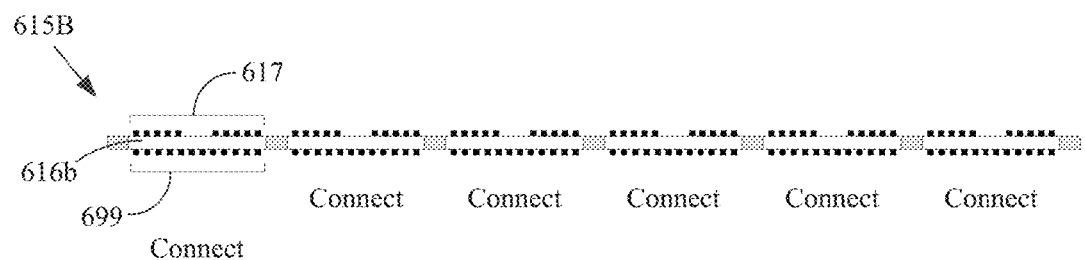

The example method(s) illustrated in FIGS. 1 and 2 and discussed herein generally concerned utilizing a carrier during the manufacturing of the semiconductor package. The utilization of a carrier is an example and is not necessarily required. An example of a method of manufacturing a semiconductor package in accordance with various aspects of the present disclosure will now be presented in which the carrier of FIGS. 1 and 2 is not utilized.

Figure 3:
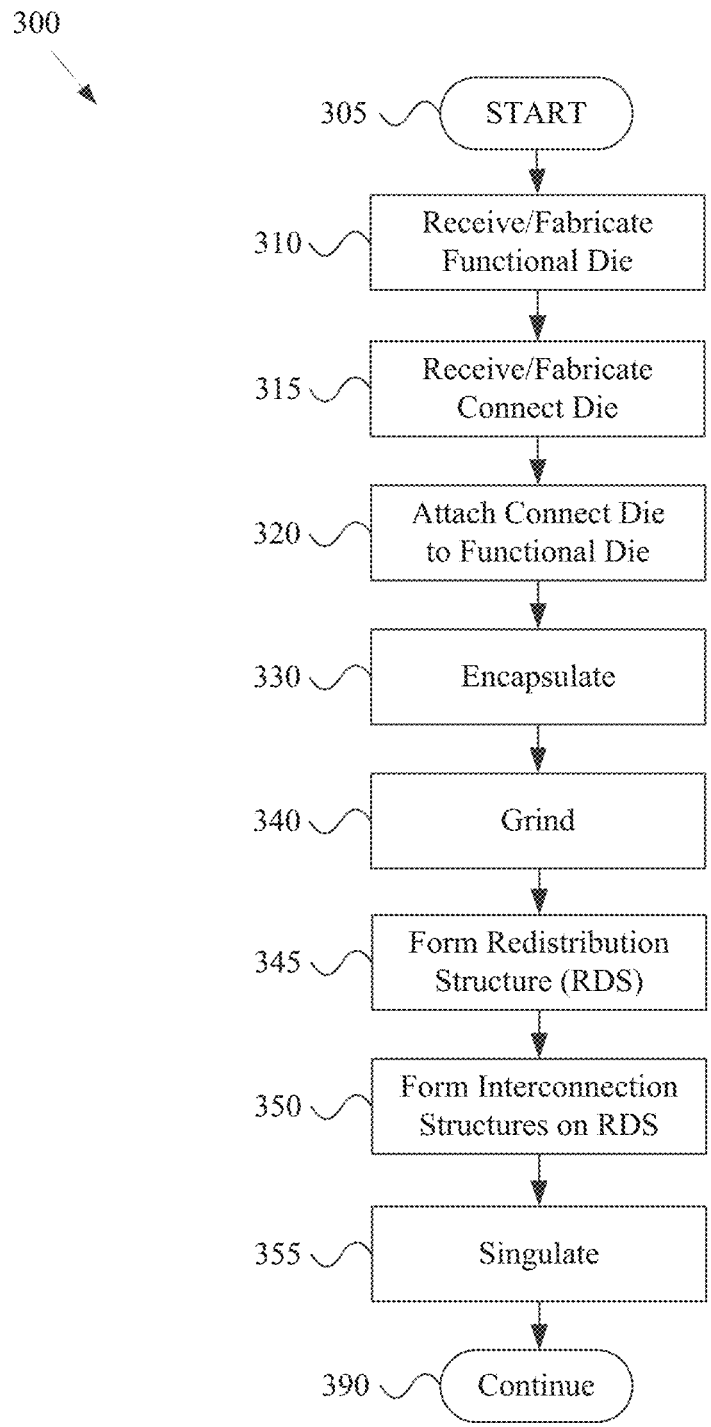
FIG. 3 shows a flow diagram of an example method of making an electronic device, in accordance with various aspects of the present disclosure.

FIG. 3 shows a flow diagram of an example method 300 of making an electronic device (e.g., a semiconductor package, etc.). The example method 300 may, for example, share any or all characteristics with any or all of the other methods presented herein (e.g., with the example method 100 of FIG. 1, with the example method 500 of FIG. 5, with the example method 700 of FIG. 7, with the example method 900 of FIG. 9, etc. FIGS. 4A-4J show cross-sectional views illustrating an example electronic device (e.g., a semiconductor package, etc.) and an example method of making an example electronic device, in accordance with various aspects of the present disclosure. FIGS. 4A-4J may, for example, illustrate an example electronic device at various steps (or blocks) of the method 300 of FIG. 3. FIGS. 3 and 4A-4J will now be discussed together. It should be noted that the order of the example blocks of the method 300 may vary without departing from the scope of this disclosure.

Though presented as separate examples for the sake of illustrative clarity, the example method 300 of FIG. 3 and the example method 100 of FIG. 1 and/or the device structures thereof, may share any or all characteristics.

The example method 300 may begin executing at block 305. The method 300 may begin executing in response to any of a variety of causes or conditions, non-limiting examples of which are provided herein. For example, the method 300 may begin executing automatically in response to one or more signals received from one or more upstream and/or downstream manufacturing stations, in response to a signal from a central manufacturing line controller, etc. Also for example, the method 300 may begin executing in response to an operator command to begin. Additionally for example, the method 300 may begin executing in response to receiving execution flow from any other method block (or step) discussed herein.

The example method 300 may, at block 310, comprise receiving and/or fabricating a plurality of functional die. Various example aspects of block 310 are presented at FIG. 4A. Block 310 may, for example, share any or all characteristics with block 110 of the example method 100 shown in FIG. 1 and discussed herein.

Block 310 may comprise receiving and/or fabricating a plurality of functional die in any of a variety of manners, non-limiting examples of which are provided herein. Block 310 may, for example, comprise receiving the plurality of functional die from an upstream manufacturing process at a same facility or geographical location. Block 310 may also, for example, comprise receiving the functional die from a supplier (e.g., from a foundry).

Figure 4A:
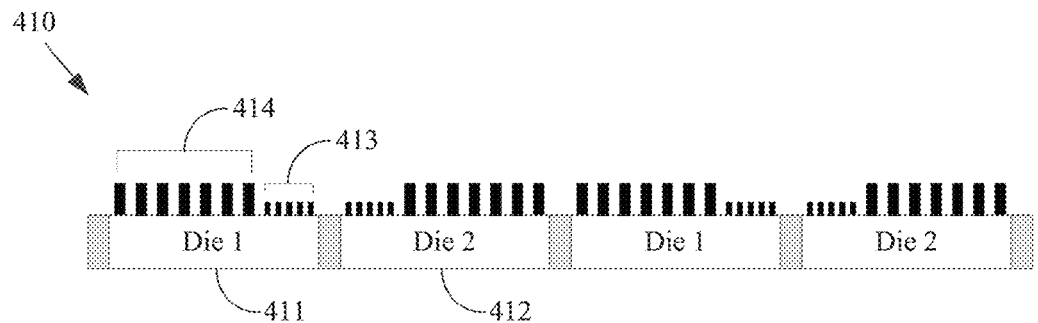
FIGS. 4A-4J show cross-sectional views illustrating an example electronic device and an example method of making an example electronic device, in accordance with various aspects of the present disclosure.

The received and/or fabricated functional die may comprise any of a variety of characteristics. For example, the received die may comprise a plurality of different die on a same wafer (e.g., a Multi-Project Wafer (MPW)). For example, as shown at FIG. 4A, the example wafer 410 comprises a plurality of different types of functional dies, for example Die 1 at label 411 and Die 2 at label 412. For example, the first die 411 may comprise a processor, and the second die 412 may comprise a memory chip. Also for example, the first die 411 may comprise a processor, and the second die 412 may comprise a co-processor. Additionally for example, the first die 411 and second die 412 may both comprise memory chips. In general, the first die 411 and/or second die 412 may comprise active semiconductor circuitry.

The functional die 411 and 412 may comprise die interconnection structures. For example, the first functional die 411, as shown in FIG. 4A, comprises a first set of one or more die interconnection structures 413, and a second set of one or more die interconnection structures 414. Similarly, the second functional die 412 may comprise such structures. The die interconnection structures 413 and 414 may comprise any of a variety of die interconnection structure characteristics, non-limiting examples of which are provided herein. For example, the die interconnection structures 413 and 414 and/or the formation thereof may share any or all characteristics with the die interconnection structures 213 and 214 shown in FIG. 2A and others and discussed herein.

In general, block 310 may comprise receiving and/or fabricating a plurality of functional die. Accordingly, the scope of this disclosure should not be limited by characteristics of any particular manner of performing such receiving and/or fabricating, nor by any particular characteristics of such functional die.

The example method 300 may, at block 315, comprise fabricating and/or receiving connect die. Various example aspects of block 315 are presented at FIG. 4B. Block 315 may, for example, share any or all characteristics with block 115 of the example method 100 shown in FIG. 1 and discussed herein.

The connect die 416a may, for example, comprise connect die interconnection structures 417. The connect die interconnection structures 417 may comprise any of a variety of characteristics. For example, the connect die interconnection structures 417 and/or the forming thereof may share any or all characteristics with the connect die interconnection structures 217 shown in FIG. 2B and others and discussed herein.

The connect die 416a (or a wafer 415 thereof) may be formed in any of a variety of manners, non-limiting examples of which are provided herein, for example with regard to the connect die 216a (or a wafer thereof 215A) and connect die 216A of FIGS. 2B and 2C and others.

Though the wafer 415 of connect die 416a may be thinned as discussed with regard to the connect die wafer 215A and 215B, and/or with regard to the connect die 216a and 216b of FIG. 2B, such thinning is not necessary. For example, for die handling purposes, it may be beneficial to process the connect die 416a at full thickness, at least until after encapsulating.

In general, block 315 may comprise fabricating and/or receiving connect die. Accordingly, the scope of this disclosure should not be limited by characteristics of any particular manner of such fabricating and/or receiving or by any particular characteristics of such connect die.

The example method 300 may, at block 320, comprise attaching the connect die to the functional die. Various example aspects of block 320 are presented at FIG. 4C. Block 320 may, for example, share any or all characteristics with block 125 of the example method 100 shown in FIG. 1 and discussed herein (e.g., all characteristics related to the attachment of the connect die and the functional die, etc.).

For example, the first die interconnection structures 413 of the first functional die 411 and of the second functional die 412 may be mechanically and electrically connected to respective connect die interconnection structures 417 of a connect die 416a. The first die interconnection structures 413 of the first functional die 411 may be connected to a left portion of the connect die interconnection structures 417, and the first die interconnection structures 413 of the second functional die 412 may be connected to a right portion of the connect die interconnection structures 417.

Such interconnection structures may be connected in any of a variety of manners, non-limiting examples of which are provided herein, for example with regard to the first die interconnection structures 213 and connect die interconnection structures 217 as discussed with regard to FIGS. 1 and 2 (e.g., FIG. 2E).

After the connection of the first die interconnection structures 413 of the first functional die 411 and of the second functional die 412 to the connect die 416a, the connect die 416a provides electrical connectivity between the first die interconnection structures 413 of the first functional die 411 and respective first die interconnection structures 413 of the second functional die 412. As discussed herein, electrical connectivity between the first die interconnection structures 413 and the back side (e.g., the top side in FIG. 4C) of the connect die 416a might not be provided.

As discussed herein, underfill may be applied between the functional die 411 and 412 and the connect die 416a. In a scenario in which pre-applied underfill (PUF) is utilized, such PUF may be applied to the connect die 416a and/or functional die 411 and 412 before the attachment of the connect die interconnection structures 417 to the first die interconnection structures 413. Also for example, a capillary underfill may be formed after such attachment.

At this point, the second die interconnection structures 414 of the functional dies 411 and 412 might not yet be connected to anything other than the functional dies 411 and 412. The second interconnection structures may be non-capped, but may be capped in various implementations.

In general, block 320 may comprise attaching the connect die to the functional die. Accordingly, the scope of this disclosure should not be limited by characteristics of any particular manner of performing such attaching or by any particular characteristics of such functional die and/or connect die interconnection structures.

The example method 300 may, at block 330, comprise encapsulating. Various example aspects of block 330 are presented at FIGS. 4D and 4E. Block 330 may, for example, share any or all characteristics with block 130 of the example method 100 shown in FIG. 1.

As discussed herein, during and/or after attachment of the connect die 416a to the functional die 411 and 412, underfill 423 may be applied between the connect die 416a and the functional die 411 and 412. Such underfill 423 may comprise a pre-applied underfill (PUF) that is applied before the connect die 416a is connected to the functional die 411 and 412. Also for example, such underfill 423 may be applied after the attachment. For example, a capillary underfill process may be utilized to form a capillary underfill 423 between the connect die 416a and the functional die 411 and 412 (e.g., surrounding the first die interconnection structures 413 of the functional die 411 and 412 and the connect die interconnection structures 417 of the connect die 416a). As shown, such underfill 423 may also cover the front side (or bottom) surface of the connect die 416a between the functional die 411 and 412, but need not. In the example shown, the underfill 423 may also cover at least a lower portion of sides of the connect die 416a, but need not. Also, in the example shown, the underfill 423 does not cover the second die interconnection structures 414 of the functional die 411 and 412, but in various implementations, such coverage may be implemented and/or at least a portion of at least one of the second interconnection structures 414 may be covered by the underfill 423.

Figure 4B:
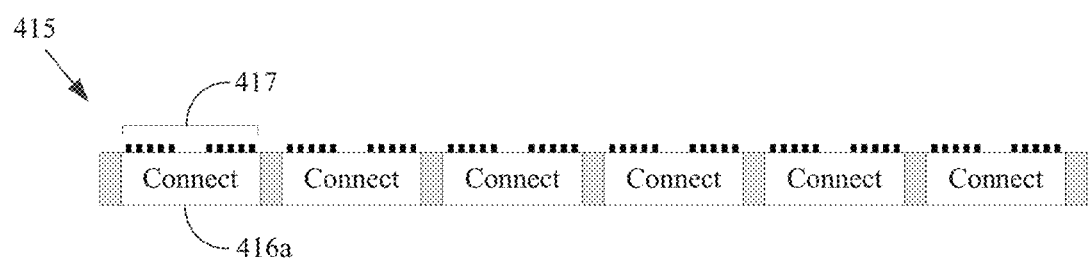
Figure 4C:
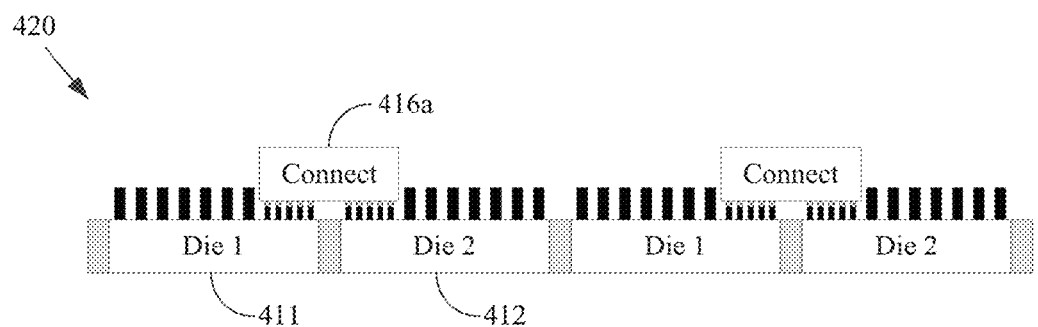
Figure 4D:
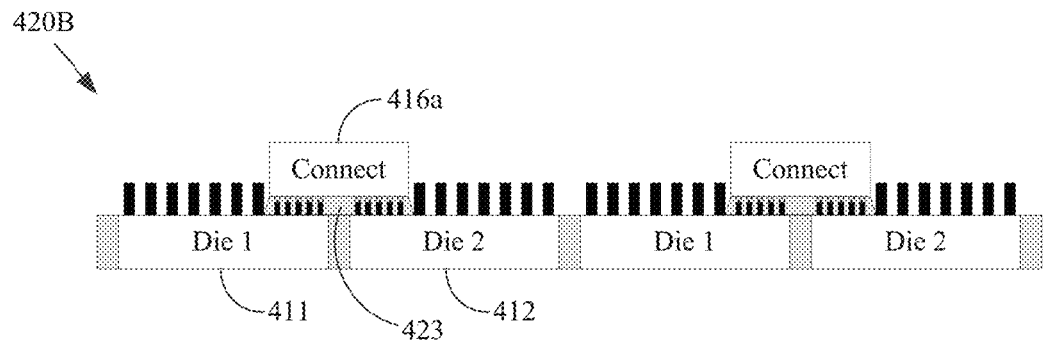
Figure 4E:
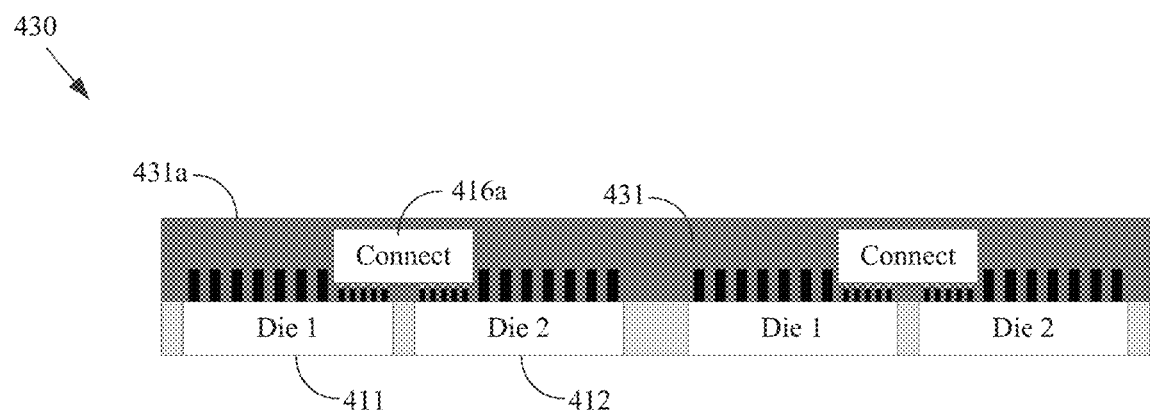
Figure 4F:
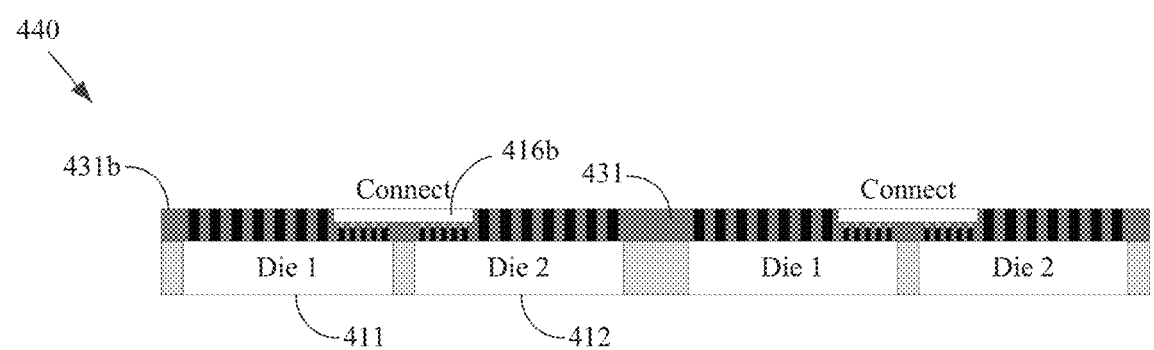
Figure 4G:
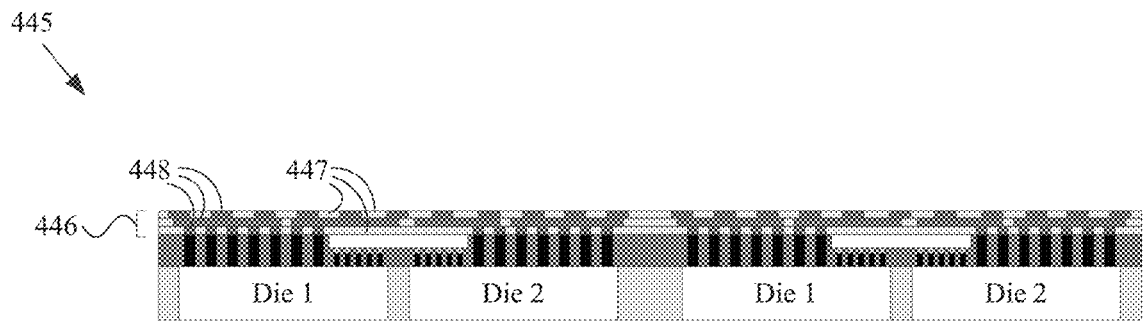
Figure 4H:
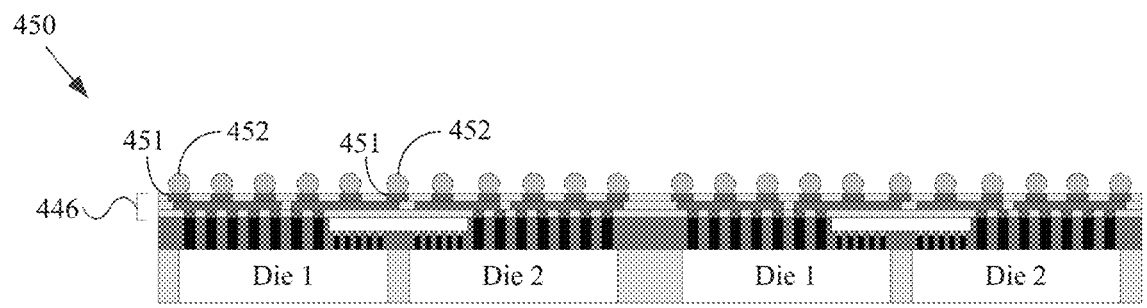
Figure 4I:
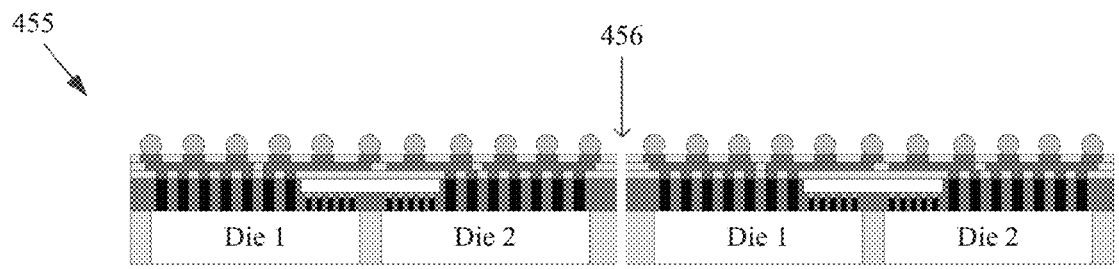

As shown in FIG. 4E, an encapsulant 431 is formed that covers various portions of the functional die 411 and 412, the connect die 416a, and portions of the functional die wafer 410 between the functional die 411 and 412. The encapsulant 431 may comprise epoxy molding compound or any of a variety of materials. For example, the encapsulant 431 may comprise a polymer, polymer composite material (such as epoxy resin with filler, epoxy acrylate with filler, or polymer with proper filler), etc.

The encapsulant 431 may be formed in any of a variety of manners. For example, the encapsulating 330 may comprise transfer molding the encapsulant 431. Also for example, the encapsulating 330 may comprise compression molding the encapsulant 431. In an example implementation in which underfill 423 has been formed between at least the functional die 411 and 412 and the connect die 416a, compression molding or transfer molding may be utilized.

As shown in the example 430 illustrated in FIG. 4E, the encapsulant 431 forms a molded underfill (MUF) above the functional die 411 and 412, or more particularly what will serve as a molded underfill when the redistribution structure is added at a later block. The encapsulant 431, for example, surrounds the second die interconnection structures 414 of the functional die 411 and 412. Additionally, for example instead of the underfill 423, the encapsulant 431 may form a molded underfill between the functional die 411 and 412 and the connect die 416a. The encapsulant 431 may also, for example, cover side and top surfaces of the connect die 416a. The encapsulant 431 may also, for example, cover top (or active) surfaces of the functional die 411 and 412 (e.g., in the orientation shown in FIG. 4E). Note that although the encapsulant 431 is shown covering top (or back) sides of the connect die 416a, the top sides of the connect die 416a may be exposed from the encapsulant 431. For example, in an example implementation, the top surface of the encapsulant 431 may be coplanar with the top surface of the connect die 416a.

Note that in an example implementation, the underfill 423 may surround the first die interconnection structures 413 and the connect die interconnection structures 417, and the encapsulant 431 may surround the second die interconnection structures 414 and the underfill 423. For example, the encapsulant 431 might not have the physical properties (e.g., filler diameter, etc.) to effectively underfill between the functional die 411 and 412 and the connect die 416a, and/or the process utilized to form the encapsulant 431 might not have the capabilities to effectively perform such underfilling.

In general, block 430 may comprise encapsulating. Accordingly, the scope of this disclosure should not be limited by characteristics of any particular manner of performing such encapsulating and/or underfilling or by any particular characteristics of such encapsulant and/or underfill.

The example method 100 may, at block 340, comprise grinding the encapsulant, die interconnection structures, and/or connect die. Various example aspects of block 340 are presented at FIG. 4F. Block 340 may, for example, share any or all characteristics with block 140 of the example method 100 shown in FIG. 1 and discussed herein.

Though grinding is generally presented as an example, block 340 may, for example, comprise performing thinning (or planarizing) in any of a variety of manners (e.g., mechanically, mechanically/chemically (CMP), etc.).

Block 340 may, for example, comprise performing such grinding to reliably expose ends of the second die interconnection structures 414 of the functional die 411 and 412. Also for example, block 340 may comprise grinding the second die interconnection structures 414 to planarize the end surfaces thereof for subsequent processing steps.

Block 340 may also comprise grinding (or thinning) the encapsulant 431, for example grinding the original top surface 431a of the encapsulant 431 to the grinded top surface 431b. Block 340 may also comprise grinding (or thinning) the connect die 416a, for example resulting in a thin connect die 416b. For example, in blocks 315 and 320, even if thinned to some extent, the thickness of the connect die 416a may have been left large enough to ensure safe handling of the connect die 416a and bonding of the connect die 416a to the functional die 411 and 412. Now that the connect die 416a is additionally protected by the encapsulant 431, back side material from the connect die 416a (e.g., a portion of the support layer 290, a second portion of the support layer 290, the reminder thereof, etc.) may be removed. In an example implementation, at least some of the support layer 290 (e.g., silicon) may be left for structural support of the thin connect die 416b. For example, from 10-20 microns of the support layer 290 might remain.

In the example presented, block 340 results in the end surfaces of the second die interconnection structures 414, the back side of the thin connect die 416b, and the grinded surface of the encapsulant 431b being coplanar.

In general, block 340 may comprise grinding (or thinning or planarizing) the encapsulant, die interconnection structures, and/or connect die. Accordingly, the scope of this disclosure should not be limited by characteristics of any particular manner of performing such grinding (or thinning or planarizing), nor by any particular characteristics of the grinded (or thinned or planarized) components.

The example method 100 may, at block 345, comprise forming a redistribution structure. Various example aspects of block 345 are presented at FIG. 4G. Block 345 may, for example, share any or all characteristics with block 145 of the example method 100 shown in FIG. 1 and discussed herein. For example, the redistribution structure 446 (e.g., dielectric layer(s) 447 and/or conductive layer(s) 448, etc.) and/or the formation thereof may share any or all characteristics with the redistribution structure 246 (e.g., dielectric layer(s) 247 and/or conductive layer(s) 248, etc.) and/or the formation thereof.

The example method 300 may, at block 350, comprise forming interconnection structures on the redistribution structure. Various example aspects of block 350 are presented at FIG. 4H. Block 350 may, for example, share any or all characteristics with block 150 of the example method 100 shown in FIG. 1 and discussed herein. For example, the pad(s) 451 and interconnection structure(s) 452 and/or the formation thereof may share any or all characteristics with the pad(s) 251 and interconnection structure(s) 252 and/or the formation thereof.

The example method 300 may, at block 355, comprise singulating the packages. Various example aspects of block 355 are presented at FIG. 4I. Block 355 may, for example, share any or all characteristics with block 155 of the example method 100 shown in FIG. 1 and discussed herein. For example, cut lines 456 (or singulation streets) and/or the singulating along such cut lines 456 may share any or all characteristics with the cut lines 256 (or singulation streets) and/or the singulating along such cut lines 256.

Figure 4J:
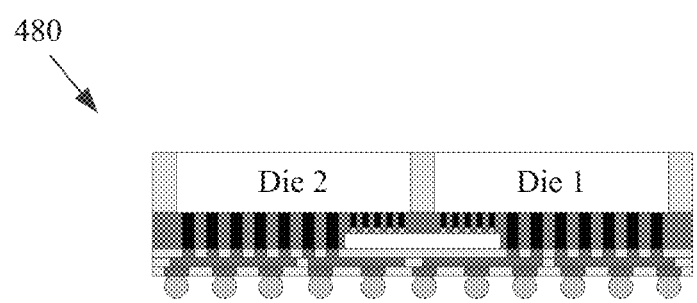

An example of an electronic device 480 (e.g., a semiconductor package) resulting from the example method 300 is shown at FIG. 4J. The electronic device 480 may, for example, share any or all characteristics with the example electronic device 280 of FIG. 2M.

The example method 300 may, at block 390, comprise performing continued processing. Such continued processing may comprise any of a variety of characteristics. For example, block 390 may comprise returning execution flow of the example method 300 to any block thereof. Also for example, block 390 may comprise directing execution flow of the example method 300 to any other method block (or step) discussed herein (e.g., with regard to the example method 100 of FIG. 1, etc.).

As discussed herein (e.g., in the discussion of FIGS. 1 and 2, etc.), a carrier used in forming an electronic device in accordance with various aspects of the present disclosure may have a signal distribution structure (e.g., a redistribution structure, redistribution layer, etc.) formed thereon prior to attachment of the connect die and/or functional die to such carrier. A non-limiting example of a method utilizing such a carrier will now be provided.

Figure 5:
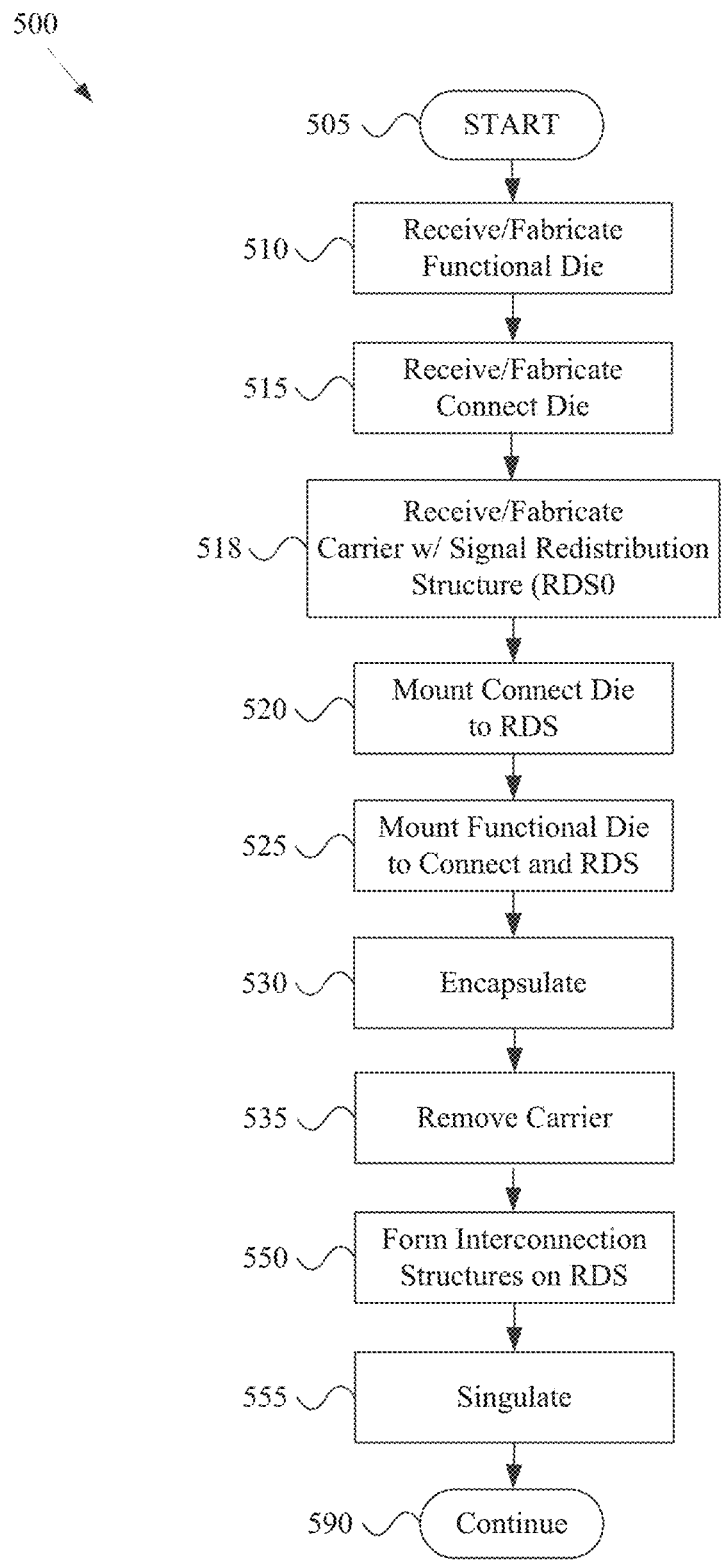
FIG. 5 shows a flow diagram of an example method of making an electronic device, in accordance with various aspects of the present disclosure.

FIG. 5 shows a flow diagram of an example method of making an electronic device (e.g., a semiconductor package, etc.), in accordance with various aspects of the present disclosure. The example method 500 may, for example, share any or all characteristics with any other example method(s) discussed herein (e.g., the example method 100 of FIG. 1, the example method 300 of FIG. 3, the example method 700 of FIG. 7, the example method 900 of FIG. 9 etc.). FIGS. 6A-6G show cross-sectional views illustrating an example electronic device (e.g., a semiconductor package, etc.) and an example method of making an example electronic device, in accordance with various aspects of the present disclosure. FIGS. 6A-6G may, for example, illustrate an example electronic device at various blocks (or steps) of the method 500 of FIG. 5. FIGS. 5 and 6A-6G will now be discussed together. It should be noted that the order of the example blocks of the method 500 may vary without departing from the scope of this disclosure.

The example method 500 begins executing at block 505. Block 505 may, for example, share any or all characteristics with block 105 of the example method 100 shown in FIG. 1, with block 305 of the example method 300 shown in FIG. 1, etc.

The example method 500 may, at block 510, comprise receiving and/or fabricating a plurality of functional die. Block 510 may, for example, share any or all characteristics with block 110 of the example method 100 shown in FIG. 1, with block 310 of the example method 300 shown in FIG. 3, etc.

The example method 500 may, at block 515, comprise receiving and/or fabricating one or more connect die. Block 515 may, for example, share any or all characteristics with block 115 of the example method 100 shown in FIG. 1, with block 315 of the example method 300 shown in FIG. 3, with block 515 of the example method 500 shown in FIG. 5, etc.

For example, referring to FIGS. 6A-1 and 6A-2, the example wafer 615A may share any or all characteristics with the example wafers 215A and/or 215B shown in FIG. 2B and discussed herein. Also, the example connect die 616a may share any or all characteristics with the example connect die 216a and/or 216b shown in FIGS. 2B and 2C and discussed herein. For example, the connect die interconnection structures 617 may share any or all characteristics with the connect die interconnection structures 217 shown in FIGS. 2B and 2C, with the connect die interconnection structure 417 shown in FIG. 4B, etc. Also for example, any or all of the redistribution (RD) structure 698 (698a or 698b), support layer 690, base dielectric layer 691, first conductive traces 692, first dielectric layer 693, conductive vias 694, second conductive traces 695, and second dielectric layer 696, may share any or all characteristics with the redistribution (RD) structure 298, support layer 290, base dielectric layer 291, first conductive traces 292, first dielectric layer 293, conductive vias 294, second conductive traces 295, and second dielectric layer 296 shown in FIG. 2C and discussed herein, respectively.

In an example implementation, the example connect die 616a may be received and/or fabricated to be at its final thickness, for example so that the connect die 616a need not be thinned at a later process steps.

Figures 4, 6A:
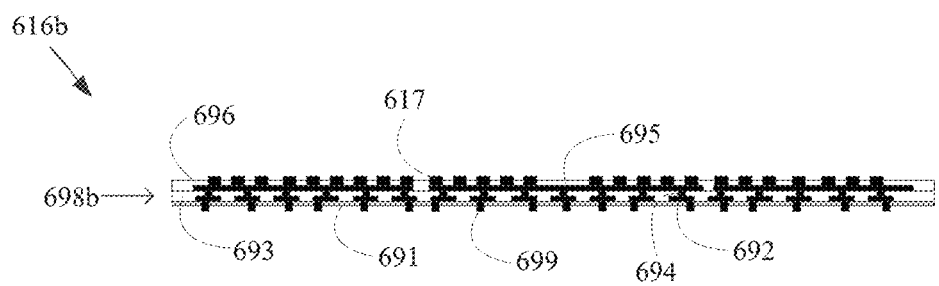

The connect die (or wafer thereof) may have interconnection structures on only one side (e.g., as shown in the example connect die 616a of FIGS. 6A-1 and 6A-2), or may have interconnection structures on both sides. Example implementations of such a connect die 616b, which may also be referred to herein as a two-sided connect die, and wafer thereof 615B are shown at FIGS. 6A-3 and 6A-4. The example wafer 615B may, for example, share any or all characteristics with the example wafers 215A, 215B, and/or 615A shown in FIGS. 2B and 6A-1 and discussed herein. Also for example, the example connect die 616b may share any or all characteristics with the example connect die 216a, 216b, and/or 615a shown in FIGS. 2B, 2C, 6A-1, and 6A-2, and discussed herein. For example, the connect die interconnection structures 617 may share any or all characteristics with the connect die interconnection structures 217 shown in FIG. 2B and discussed herein. Also for example, any or all of the redistribution (RD) structure 698 (698a or 698b), support layer 690, base dielectric layer 691, first conductive traces 692, first dielectric layer 693, conductive vias 694, second conductive traces 695, and second dielectric layer 696, may share any or all characteristics with the redistribution (RD) structure 298, support layer 290, base dielectric layer 291, first conductive traces 292, first dielectric layer 293, conductive vias 294, second conductive traces 295, and second dielectric layer 296 shown in FIG. 2C and discussed herein, respectively. The example connect die 616b also includes a second set of connect die interconnection structures 699 received and/or fabricated on the side of the connect die 616b opposite the connect die interconnection structures 617. Such second connect die interconnection structures 699 may share any or all characteristics with the connect die interconnection structures 617. In an example implementation, the second connect die interconnection structures 699 may be formed first as the RD structure 698b is build up on a support structure (e.g., like the support structure 690), which is then removed or thinned or planarized (e.g., by grinding, peeling, stripping, etching, etc.).

Note that one or more or all of the second connect die interconnection structures 699 might be isolated from other electrical circuitry of the connect die 616b, which may also be referred to herein as dummy structures (e.g., dummy pillars, etc.), anchoring structures (e.g., anchoring pillars, etc.), etc. For example, any or all of the second connect die interconnection structures 699 might be formed solely for anchoring the connect die 616b to the carrier or RD structure or metal pattern at a later step. Note also that one or more or all of the second connect die interconnection structures 699 may be electrically connected to electrical traces, which may for example connect to electronic device circuitry of die attached to the connect die 616b. Such structures may, for example, be referred to as active structures (e.g., active pillars, etc.), etc.

The example method 500 may, at block 518, comprise receiving and/or fabricating a carrier with a signal redistribution (RD) structure (or distribution structure) thereon. Various example aspects of block 518 are presented in FIGS. 6B-1 and 6B-2. Block 518 may, for example, share any or all characteristics (e.g., RD structure and/or RD structure formation characteristics, etc.) with block 145 of the example method 100 of FIG. 1 and with the example RD structure 246 shown in FIG. 2J.

The example carriers 621a and 621b may, for example, share any or all characteristics with any carrier discussed herein (e.g., the example carrier 221 of FIGS. 2D-2G, etc.). The redistribution (RD) structures 646a and 646b (or the forming thereof) may share any or all characteristics with the RD structure 246 of FIG. 2J and discussed herein. For example, the dielectric layers 647a and 647b (or the forming thereof) may share any or all characteristics with the dielectric layers 247 shown in FIG. 2J and discussed herein. Also for example, the conductive layers 648a and 648b (or the forming thereof) may share any or all characteristics with the conductive layers 248 shown FIG. 2J and discussed herein.

A top conductive layer of the conductive layers 648a and a top dielectric layer of the dielectric layers 647a may, for example, be formed to match one or more connect die attached thereto. For example, a backside (e.g., a dielectric side) of a connect die may be entirely attached to such top dielectric layer. An example of such attachment is shown in FIG. 6C-1. Similarly, a top conductive layer of the conductive layers 648b and a top dielectric layer of the dielectric layers 647b may, for example, be formed to match one or more connect die attached thereto. For example, pads of the top conductive layer of the conductive layers 648b may be matched to respective second interconnection structures (e.g., like the second connect die interconnection structures 699 of FIGS. 6A-3 and 6A-4, etc.) of the connect die. An example of such attachment is shown in FIG. 6C-2.

In general, block 518 may comprise receiving and/or fabricating a carrier with a single redistribution (RD) structure (or distribution structure) thereon. Accordingly, the scope of this disclosure should not be limited by characteristics of any particular manner of making such a carrier or by any particular characteristics of such a carrier.

The example method 500 may, at block 520, comprise mounting the connect die to the carrier (or, for example, an RD structure formed thereon). Block 520 may, for example, share any or all characteristics with block 120 of the example method 100 shown in FIG. 1 (an example of which is provided at FIG. 2D) and discussed herein. Various example aspects of block 520 are presented at FIGS. 6C-1 and 6C-2.

As shown in FIG. 6C-1, the connect die 616a may be attached to an RD structure 646a on the carrier 621a. The connect die 616a may, for example, be received as individual die or may be received as a connect die wafer 615A and then singulated from the connect die wafer 615A.

The connect die 616a may, for example, be attached (or coupled) to the RD structure 646a (e.g., to a top dielectric layer thereof) utilizing a layer of adhesive between the connect die 616a and the RD structure 646 (e.g., a top dielectric layer thereof). An example of such an adhesive 222 is shown in the example of FIG. 2D and discussed herein. Note that the adhesive may, for example, be formed or positioned to leave conductors of the RD structure 646a exposed for later electrical connection to functional die. The adhesive may comprise any of a variety of characteristics. The adhesive may be applied in any of a variety of manners. For example, the adhesive may be applied as a preformed sheet, printed, spun on, sprayed on, vapor deposited, rolled on, etc.

The connect die 616a (e.g., a plurality thereof) may be attached to the RD structure 646a back-side-down (e.g., inactive side down). For example, as explained herein, the back side of the connect die 616a (e.g., the bottom side in FIGS. 6A-1 and 6A-2) may be formed such that no electrical signals are transferred through the connect die 616a to the back side. For example, even after being thinned, the connect die 616a may comprise the base dielectric layer 691 and/or a portion of the support layer 690 (e.g., a silicon support layer, etc.). In an example implementation, there are no electrical conductors exposed at the back side of the connect die 616a. In the back-side-down configuration shown in FIG. 6C-1, the connect die interconnection structures 617 are oriented facing upward (e.g., facing away from and/or extending away from the RD structure 646a).

It should be noted that although the discussion herein generally focuses on a single connect die 616a, as shown in various figures a plurality of connect dies may be attached to a single RD structure 646a.

As shown and discussed herein with regard to block 515 of FIG. 5 and with regard to the example connect die 616b of FIGS. 6A-3 and 6A-4, the connect die may have interconnection structures on both sides (e.g., the connect die interconnection structures 617 and second connect die interconnection structures 699). In such an implementation, the connect die 616b may also be electrically connected to the RD structure 646b. An example of such a connection is shown in FIG. 6C-2.

The second connect die interconnection structures 699 of the example connect die 616b are electrically connected to corresponding interconnection structures (e.g., pads, traces, lands, etc.) of a top conductive layer of the conductive layers 648b of the RD structure 646b. Such a connection may be performed in any of a variety of manners, non-limiting examples of which are provided herein. For example, the second connect die interconnection structures 699 may be connected to respective interconnection structures of the RD structure 646b utilizing mass reflow, thermal-compression bonding, conductive epoxy, direct metal-to-metal bonding, etc.

Note that an underfill may be formed between the connect die 616b and the RD structure 646b. Such an underfill may share any or all characteristics with any underfill discussed herein. For example, the underfill may comprise a capillary underfill, a pre-applied underfill, etc. In an example implementation, an underfill under the connect die 616b may be different from an underfill under the functional die (to be attached later). In another example implementation, the underfill may comprise a same underfill as that formed under the functional die (e.g., a capillary underfill, a pre-applied underfill, a molded underfill, etc.).

In general, block 520 may comprise mounting the connect die to the RD structure. Accordingly, the scope of this disclosure should not be limited by characteristics of any particular manner of such attaching or by any particular characteristics of such connect die and/or RD structure.

The example method 500 may, at block 525, comprise mounting (or attaching) the functional die to the connect die and to the RD structure. Block 525 may, for example, share any or all characteristics with block 125 of the example method 100 shown in FIG. 1 and discussed herein, and with the example aspects shown in FIGS. 2E and 2F. Various examples of block 525 are presented at FIGS. 6D-1 and 6D-2.

The functional die 611 (611a and/or 611b) and 612 (612a and/or 612b) may, for example, be received as individual die. Also for example, the functional die 611 and 612 may be received on a single wafer (e.g., as shown at 210A, etc.), the functional die 611 and 612 may be received on multiple respective wafers (e.g., as shown at 210B and 210C, etc.), etc. In a scenario in which one or both of the functional die are received in wafer form, the functional die may be singulated from the wafer. Note that if the functional die 611 and 612 are received on a single MPW (e.g., as shown at 210A, etc.), the first and second die may be singulated from the wafer as an attached pair (e.g., connected with silicon).

The functional die 611 (611a and/or 611b) and 612 (612a and/or 612b) may be attached to the connect die 616 (616a and/or 616b) and/or to the RD structure 646 (646a and/or 646b). In the examples 625a and 625b shown at FIGS. 6D-1 and 6D-2, the functional die 611 and 612 are attached to the connect die 616 and to the RD structure 646. Such connections to the connect die 616 and to the RD structure 646 may, however, be different from each other.

For example, first die interconnection structures of the first functional die 611 and of the second functional die 612 may be mechanically and electrically connected to respective connect die interconnection structures 617. The first die interconnection structures of the first functional die 611 may be connected to a left portion of the connect die interconnection structures 617, and the first die interconnection structures of the second functional die 612 may be connected to a right portion of the connect die interconnection structures 617.

Such interconnection structures may be connected in any of a variety of manners. For example, the connection may be performed by soldering. In an example implementation, the first die interconnection structures and/or the connect die interconnection structures 617 may comprise solder caps (or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference.

After the connection of the first die interconnection structures of the first functional die 611 and of the second functional die 612 to the connect die 616, the connect die 616 provides electrical connectivity between the first die interconnection structures of the first functional die 611 and respective first die interconnection structures of the second functional die 612. As discussed herein, electrical connectivity between the first die interconnection structures and the back side (e.g., the bottom side in FIG. 6D-1) of the connect die 616a might not be provided. In other example implementations, for example as shown in FIG. 6D-2, electrical connectivity between any one or more of the first die interconnection structures and the back side (e.g., the bottom side in FIG. 6D-2) of the connect die 616b may be provided. For example, the connect die 616b (or various conductive paths thereof) may provide electrically connectivity between the functional die 611b and 612b and/or electrically connectivity between one or both of the functional die 611b and 612b and the RD structure 646b.

As discussed herein, underfill may be applied between the functional die 611 and 612 and the connect die 616. In a scenario in which pre-applied underfill (PUF) is utilized, such PUF may be applied to the connect die 616 and/or functional die 611 and 612 before the attachment of the first die interconnection structures to the connect die interconnection structures 617. Also for example, a capillary underfill may be formed after such attachment.

The second die interconnection structures of the first functional die 611 and/or of the second functional die 612 may, for example, be electrically and mechanically connected to the RD structure 646. The second die interconnection structures of the first functional die 611 may be electrically and mechanically connected to the RD structure 646 to the left of the connect die 616, and the second die interconnection structures of the second functional die 612 may be connected to the RD structure 646 to the right of the connect die 616.

Such second die interconnection structures may be connected to the RD structure 646 in any of a variety of manners. For example, the second die interconnection structures may be connected to the RD structure 646 utilizing a same connection process as utilized to connect the first die interconnection structures to the connect die 616 (e.g., at the same time). For example, the second die interconnection structures may be connected to respective pads of the RD structure 646 utilizing mass reflow, thermal-compression bonding (TCB), direct metal-to-metal intermetallic bonding, conductive adhesive, etc.).

Alternatively, the second die interconnection structures may be mechanically and/or electrically coupled to the RD structure 646 in a different manner than that in which the first die interconnection structures are coupled to the connect die 616

It should be noted that a testing process may be performed between attachment of the first functional die 611 and the second functional die 612 (and/or between attachment of the connect die 616 to the RD structure 646). In such a scenario, as discussed herein, underfill may be applied between the first functional die 611 and the connect die 616 (and/or between the first functional die 611 and the RD structure 646) prior to such test. In an example scenario, having passed electrical test, the second functional die 612 may then be attached (e.g., with or without underfill).

It should also be noted that although the illustrations herein generally present the first functional die 611 (and interconnection structures thereof) and the second functional die 612 (and interconnection structures thereof) as being symmetrical with regard to each other, such symmetry is not required. For example, the functional die 611 and 612 may be of different respective shapes and sizes, may have different types and/or numbers of interconnection structures, etc.

It should additionally be noted that although the discussion herein generally focuses on two functional die coupled to a single connect die, the scope of this disclosure is not limited thereto. For example, any number of functional die (e.g., three die, four die, one die, etc.) may be coupled to a single connect die. Also for example, any number of connect die may be utilized in a single package.

In general, block 525 may comprise mounting (or attaching) the functional die to the connect die and to the RD structure. Accordingly, the scope of this disclosure should not be limited by characteristics of any particular manner of such attaching or by any particular characteristics of such functional die, connect die, and/or attachment structures.

The example method 500 may, at block 530, comprise encapsulating. Various example aspects of block 530 are presented at FIGS. 6E-1 and 6E-2. Block 530 may, for example, share any or all characteristics with block 130 of the example method 100 shown in FIG. 1, example aspects of which are shown at FIG. 2G.

Figures 1, 6B:
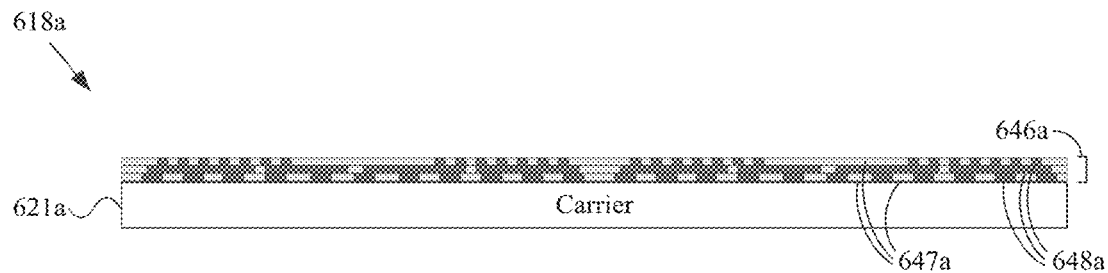
Figures 2, 6B:
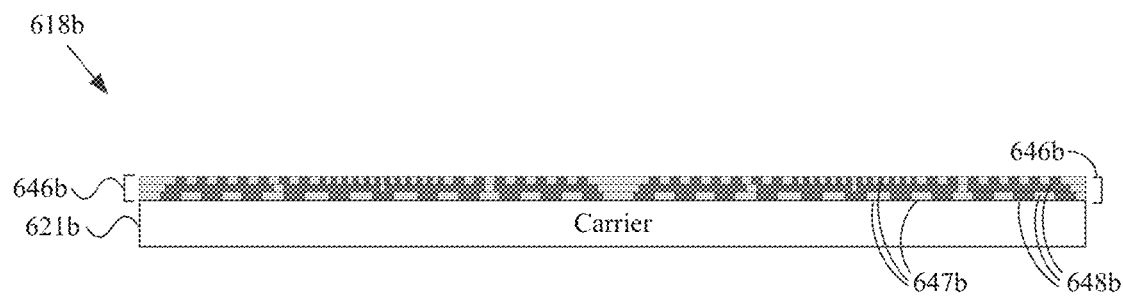
Figures 1, 6C:
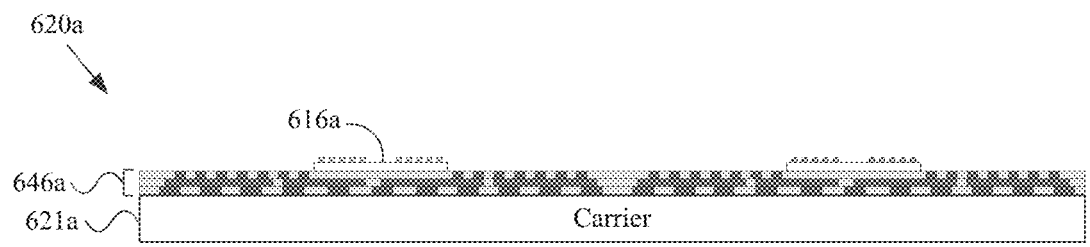
Figures 2, 6C:
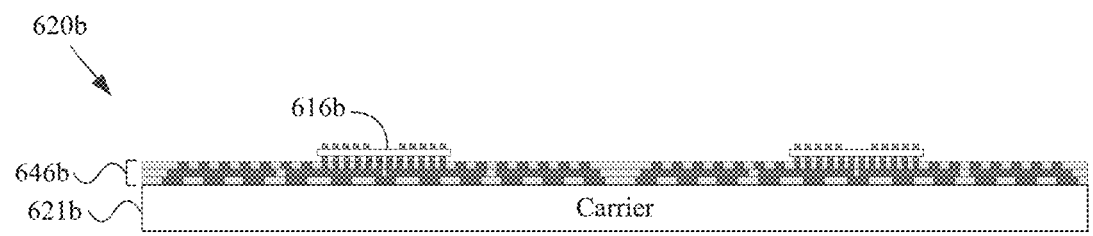
Figures 1, 6D:
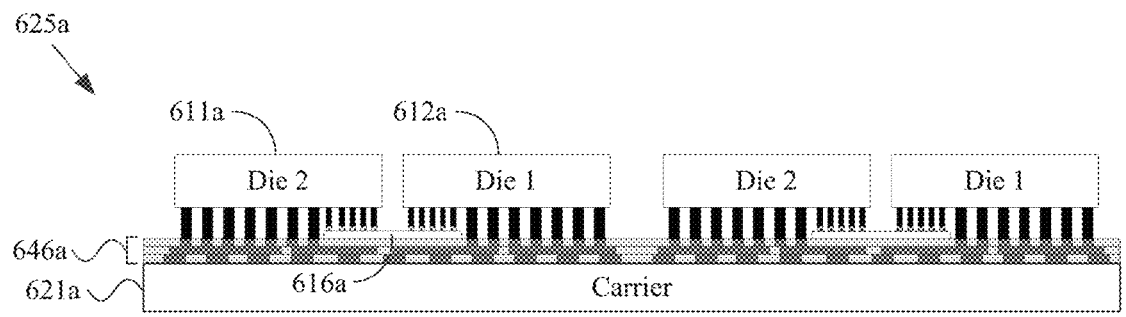
Figures 2, 6D:
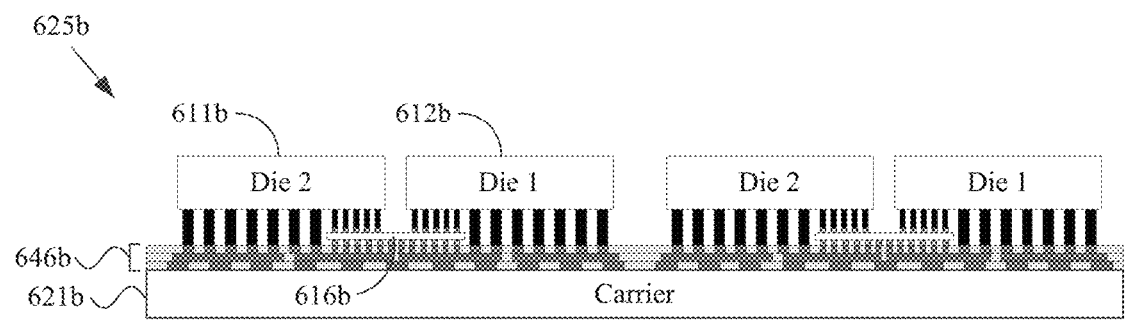
Figures 1, 6E:
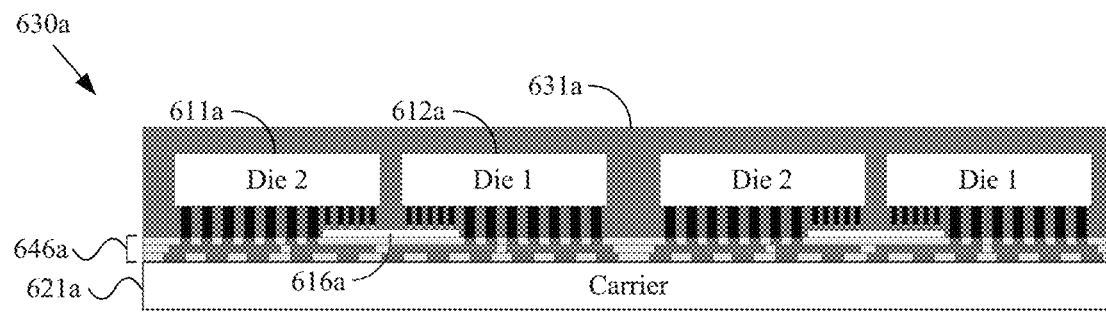
Figures 2, 6E:
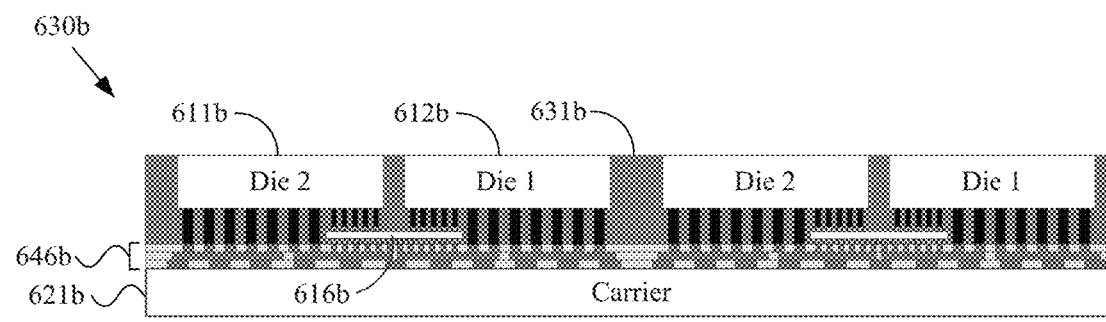
Figures 1, 6F:
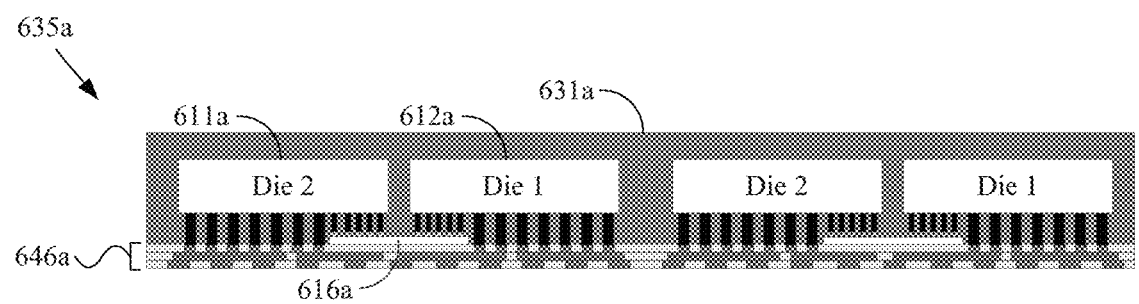
Figures 2, 6F:
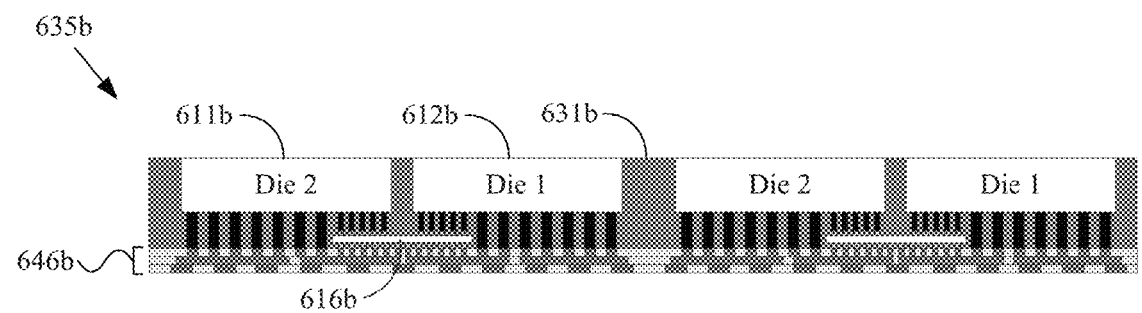

For example, the example implementation 630a of FIG. 6E-1 shows the encapsulating material 631a. The encapsulating material 631a is shown covering top, bottom, and side surfaces of the functional die 611a and 612a; top and side surfaces of the connect die 616a; the top surface of the RD structure 646a; the interconnection structures between the functional die 611a and 612a and the RD structure 646a; and the interconnection structures between the functional die 611a and 612a and the connect die 616a. Note that as explained herein, an underfill different from the encapsulating material 631a may be formed between the functional die 611a and 612a and the connect die 616a and/or between the functional die 611a and 612a and the RD structure 646a.

The encapsulating material 631 (631a and/or 631b) may be planarized or thinned. For example, one or more or all of the functional die 611 and 612 may be exposed from the encapsulating material 631 by such planarizing. Such planarizing or thinning may also comprise thinning the back sides of one or more of the functional die. An example in which both functional die 611b and 612b are exposed from the encapsulating material 631b is shown at FIG. 6E-2. Such die exposure may, for example, be accomplished by a thinning or planarizing process (e.g., grinding, etc.), by film assisted molding or another molding technique in which the back sides of one or more of the functional die 611b and 612b are not covered by the encapsulating material 631b during the original application thereof, etc.

As discussed herein, underfill that is distinct and/or different from the encapsulating material 631 may be formed between the functional die 611 and 612 and the connect die 616 and/or between the functional die 611 and 612 and the RD structure 646. In an example implementation, such underfill may be performed at block 530 during the encapsulating (e.g., as a molded underfill).

In general, block 530 may comprise encapsulating. Accordingly, the scope of this disclosure should not be limited by characteristics of any particular manner of performing such encapsulating and/or underfilling or by any particular characteristics of such encapsulating material and/or underfill.

The example method 500 may, at block 535, comprise removing the carrier. Various example aspects of block 535 are presented at FIGS. 6F-1 and 6F-2. Block 535 may, for example, share any or all aspects with block 135 of the example method 100 shown in FIG. 1 and discussed herein, example aspects of which are provided at block 2H.

Block 535 may, for example, comprise removing the carrier 621 (621a or 621b) from the RD structure 646 (646a or 646b). Block 535 may comprise removing the carrier 621 from the RD structure 646 in any of a variety of manners, non-limiting examples of which are provided herein.

For example, block 535 may comprise grinding the carrier 621, removing the carrier utilizing chemical-mechanical planarization (CMP), exposing the assembly to heat to release a thermally releasable adhesive, exposing the assembly to laser to release a laser-releasable adhesive, peeling the carrier from the RD structure, sheering the carrier from the RD structure, cutting the carrier from the RD structure, etc. In an example scenario in which the RD structure 646 was formed on a base silicon (or other semiconductor substrate), for example in a wafer fab process, block 535 may comprise grinding and/or etching the base silicon from the RD structure 646. In another example scenario in which the RD structure 646 was formed on a glass or metal base, block 646 may comprise peeling away the glass or metal base, for example also applying thermal, chemical, light, other energy, etc., to assist in releasing the RD structure 646 from the base material of the carrier 621.

Note that although the examples presented herein generally show removing the entire carrier 621, various example implementations may comprise leaving a portion of the carrier 621, for example forming apertures therein to expose conductors of the RD structure 646.

After removal of the carrier, block 535 may comprise performing any cleaning that may be necessary to prepare the RD structure 646 for additional processing.

In general, block 535 may comprise removing the carrier (or a portion thereof). Accordingly, the scope of this disclosure should not be limited by characteristics of any particular manner of performing such removing or by any particular characteristics of such carrier and/or adhesive or other attachment mechanism.

The example method 500 may, for example at block 550, comprise forming interconnection structures on the RD structure (RDS). Block 550 may, for example, share any or all characteristics with block 150 of the example method 100 of FIG. 1 and discussed herein, examples of which are provided at FIG. 2K and discussed herein. Block 550 may also, for example, share any or all characteristics with block 350 of the example method 300 of FIG. 3 and discussed herein, examples of which are provided at FIG. 4H.

The example method 500 may, for example at block 555, comprise singulating the packages. Block 555 may, for example, share any or all characteristics with block 155 of the example method 100 of FIG. 1 and discussed herein, examples of which are provided at FIG. 2L and discussed herein. Block 555 may, for example, share any or all characteristics with block 355 of the example method 300 of FIG. 3 and discussed herein, examples of which are provided at FIG. 4I.

Figures 1, 6G:
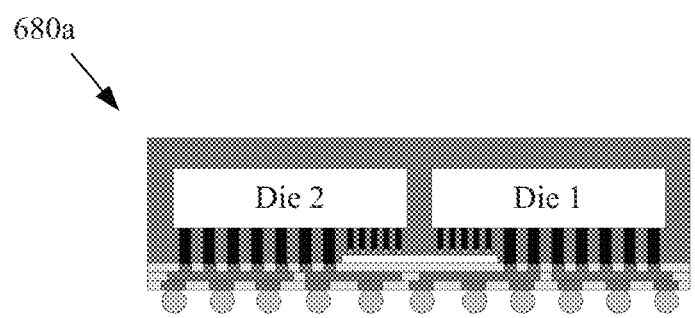
Figures 2, 6G:
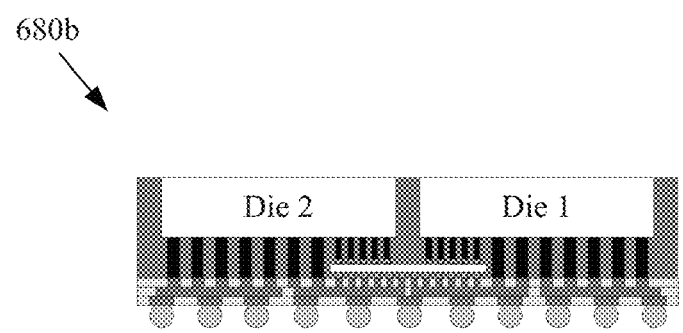

Examples of electronic devices 680 (680a and 680b) (e.g., a semiconductor package) resulting from the example method 500 are shown at item 680a of FIG. 6G-1 and at item 680b of FIG. 6G-2. Such example electronic devices 680 (or packages) may share any or all characteristics with the example electronic device 280 shown at FIG. 2M and discussed herein and/or the electronic device 480 shown at FIG. 4J and discussed herein. Such example electronic devices 680 may, for example, comprise relatively fine line spacing (e.g., as low as 2 um line spacing and below).

The example method 500 may, at block 590, comprise performing continued processing. Such continued processing may comprise any of a variety of characteristics. For example, block 590 may comprise returning execution flow of the example method 500 to any block thereof. Also for example, block 590 may comprise directing execution flow of the example method 500 to any other method block (or step) discussed herein (e.g., with regard to the example method 100 of FIG. 1, the example method 300 of FIG. 3, the example method 700 of FIG. 7, the example method 900 of FIG. 9, etc.).

In the example implementation shown in FIGS. 1 and 2A-2M, the connect die were attached to the carrier before the functional die are attached. The scope of the present disclosure, however, is not limited by such order. For example, as shown in FIGS. 7 and 8A-8J (and later by FIGS. 9 and 10), the functional die may be attached to the carrier before the connect die are attached.

Figure 7:
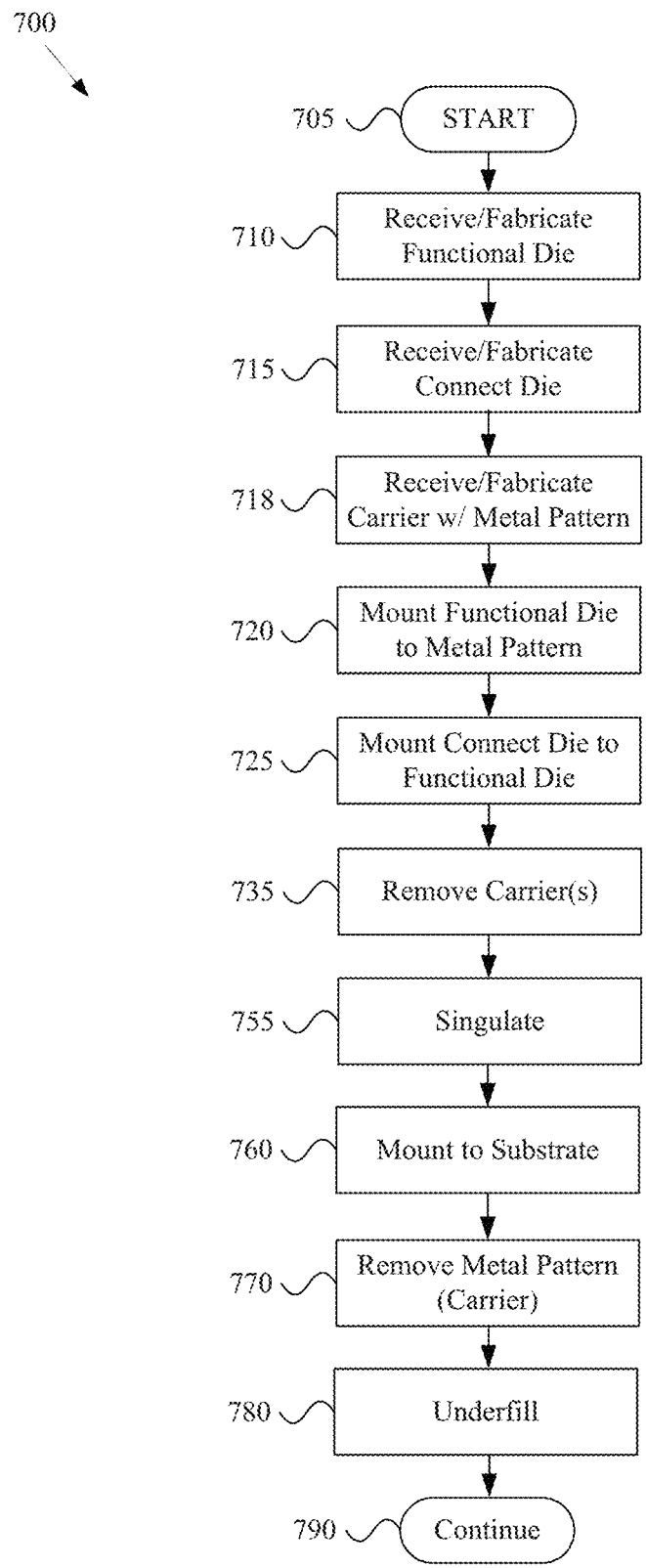
FIG. 7 shows a flow diagram of an example method of making an electronic device, in accordance with various aspects of the present disclosure.

FIG. 7 shows a flow diagram of an example method 700 of making an electronic device (e.g., a semiconductor package, etc.), in accordance with various aspects of the present disclosure. The example method 700 may, for example, share any or all characteristics with any other example method discussed herein (e.g., the example method 100 of FIG. 1, the example method 300 of FIG. 3, the example method 500 of FIG. 5, etc.). FIGS. 8A-8J show cross-sectional views illustrating an example electronic device (e.g., an electronic package, etc.) and an example method of making an example electronic device, in accordance with various aspects of the present disclosure. FIGS. 8A-8J may, for example, illustrate an example electronic device at various blocks (or steps) of the method 700 of FIG. 7. FIGS. 7 and 8A-8J will now be discussed together. It should be noted that the order of the example blocks of the example method 700 may vary without departing from the scope of this disclosure.

The example method 700 begins executing at block 705. Block 705 may, for example, share any or all characteristics with block 105 of the example method 100 shown in FIG. 1, with block 305 of the example method 300 shown in FIG. 1, with block 505 of the example method 500 shown in FIG. 5, etc.

The example method 700 may, at block 710, comprise receiving and/or fabricating a plurality of functional die. Block 710 may, for example, share any or all characteristics with block 110 of the example method 100 shown in FIG. 1, with block 310 of the example method 300 shown in FIG. 3, with block 510 of the example method 500 shown in FIG. 5, etc.

The example method 700 may, at block 715, comprise receiving and/or fabricating a plurality of connect die. Block 715 may, for example, share any or all characteristics with block 115 of the example method 100 shown in FIG. 1, with block 315 of the example method 300 shown in FIG. 3, with block 515 of the example method 500 shown in FIG. 5, etc.

Figures 1, 8A:
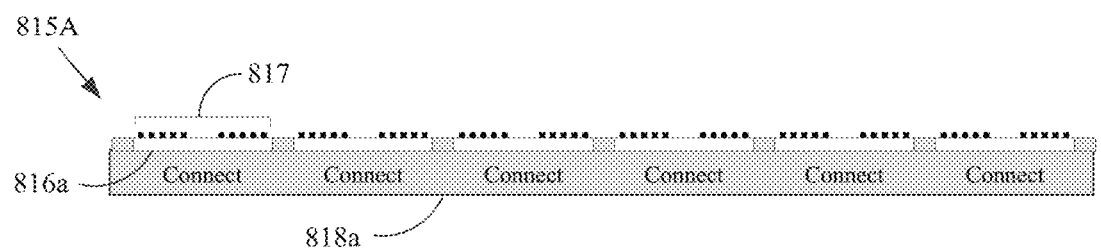
Figures 2, 8A:
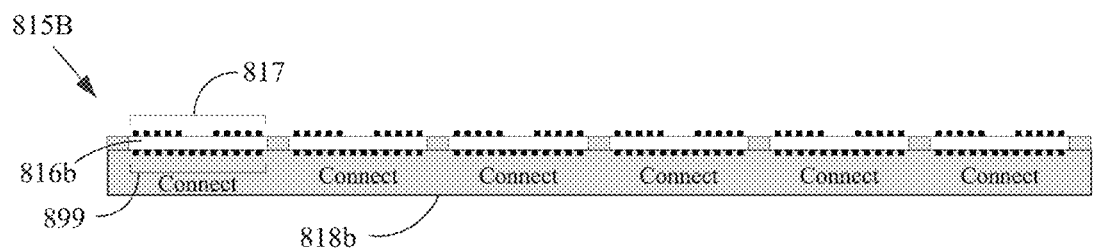

For example referring to FIG. 8A-1, the example wafer 815A may share any or all characteristics with the example wafers 215A and/or 215B shown in FIG. 2B, with the example wafer 415 shown in FIG. 4B, with the example wafer 615A shown in FIG. 6A-1, etc. Also, the example connect die 816a may share any or all characteristics with the example connect die 216a and/or 216b shown in FIGS. 2B and 2C, with the example connect die 416a shown in FIG. 4B, with the example connect die 616a shown in FIGS. 6A-1 and 6A-2, etc. For example, the connect die interconnection structures 817 may share any or all characteristics with the connect die interconnection structures 217 shown in FIGS. 2B and 2C, with the connect die interconnection structures 417 shown in FIG. 4B, with the connect die interconnection structures 617 shown in FIGS. 6A-1 to 6A-4, etc.

Also for example referring to FIG. 8A-2, the example wafer 815B may share any or all characteristics with the example wafer 615B shown in FIGS. 6A-3 and 6A-4. Additionally, the example connect die 816b may share any or all characteristics with the example connect die 616b shown in FIGS. 6A-3 and 6A-4. For example, the second connect die interconnection structures 899 may share any or all characteristics with the second connect die interconnection structures 699 shown in FIGS. 6A-3 and 6A-4, with any other connect die interconnection structures shown herein, etc.

As explained herein, the example connect die wafers 815A and 815B (and/or the example connect die 816a and 816b thereof) may be thinned (or planarized) to remove any portion or all of a carrier or bulk material 818a and 818b on which the connect die are formed. In the example implementation discussed with regard to FIGS. 7 and 8, the example connect die wafers 815A and 815B (and/or the example connect die 816a and 816b thereof) are shown with a substantial amount of carrier and/or bulk material 818a and 818b during singulation, handling, and attachment to the functional die, and are thinned at a later stage. Note, however, that the example connect die wafers 815A and 815B (and/or the example connect die 816a and 816b thereof) may be thinned to their final desired thickness prior to attachment to the functional die.

The example method 700 may, at block 718, comprise receiving and/or fabricating a carrier. Block 718 may, for example, share any or all characteristics with block 120 of the example method 100 shown in FIG. 1, with block 518 of the example method 500 shown in FIG. 5, etc. Various example aspects of block 718 are presented in FIG. 8B and discussed herein.

The example carrier 819 may, for example, share any or all characteristics with any carrier discussed herein (e.g., the example carrier 221 of FIG. 2D, the example carriers 621a and 621b of FIGS. 6B-1 and 6B-2, etc.). For example, the carrier 819 may be entirely formed of temporary (or dummy) material that is completely removed at a later process step. Also for example, the carrier 819 may comprise a bulk carrier portion on which an RD structure is formed. Additionally for example, the carrier 819 may comprise a bulk carrier portion on which a pattern is formed.

Figure 8B:
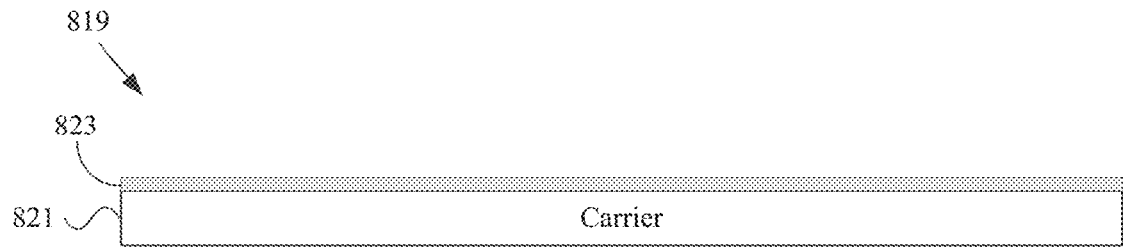

The example carrier 819 of FIG. 8B, for example, is shown with a bulk carrier portion 821 on which a metal pattern 823 is formed (or positioned). The metal pattern 823 may serve any of a variety of purposes. For example, as discussed herein (e.g., with regard to block 120, etc.), the metal pattern 823 may comprise alignment features to assist with the accurate placement of die (e.g., connect die, functional die, etc.) thereon. Also for example, the metal pattern 823 may comprise a thickness that is stable (or strong or rigid) enough to serve as a work-piece carrier, even after the bulk carrier portion 821 is removed. The metal pattern 823 may also be referred to herein as a metal carrier. Additionally, for example, the metal pattern 823 may comprise signal routing lines (e.g., a complete or partial RD structure) that remain with the final assembly after the bulk carrier portion 821 is removed.

In general, block 718 may comprise receiving and/or fabricating a carrier. Accordingly, the scope of this disclosure should not be limited by characteristics of any particular manner of making such a carrier or by any particular characteristics of such a carrier.

The example method 700 may, at block 720, comprise mounting functional die to the carrier (e.g., to a metal pattern thereof). Block 720 may, for example, share any or all characteristics with block 120 of the example method 100 shown in FIG. 1 (e.g., attaching functional die to the carrier (and/or pattern) instead of the connect die), with block 520 of the example method 500 shown in FIG. 5 (e.g., attaching functional die to the carrier (and/or RD structure) instead of the connect die), etc. Various example aspects of block 720 are presented in FIG. 8C.

Figure 8C:
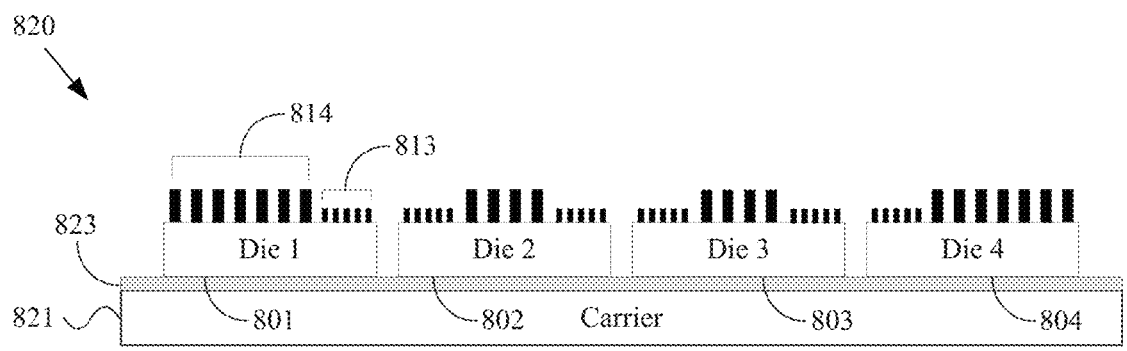

In the example implementation 820 shown at FIG. 8C, the example first functional die 801 is attached to the metal pattern 823 with an adhesive. An example of such adhesive attachment is provided at block 120 (e.g., at the example implementation 220 of FIG. 2D. The adhesive may, for example, be formed to only cover the back side of the first functional die 801 and/or may be formed to cover the entire metal pattern 823. Also for example, though not explicitly shown in FIG. 8C, the first functional die 801 may comprise one or more metal anchors on the back side which may be adhered to (or soldered to, or otherwise connected to) corresponding metal anchors of the metal pattern 823. The second functional die 802, third functional die 803, and fourth functional die 804 may be similarly mounted. Note that at this point in the example method 800, the functional die may be at their final desired thickness, but they may also be thinned (or planarized) during a later process step (e.g., after the metal carrier 823 is removed).

As shown in the example implementation 820 of FIG. 8C, any or all of the functional die (801-804) may comprise first die interconnection structures 813 (e.g., for connection to a connect die) and second die interconnection structures 814 (e.g., for connection to circuit elements other than a connect die).

In the example implementation 820 shown in FIG. 8C, four functional die 801-804 are shown. It should be understood that any number of such die may be mounted. This applies as well to any of the example implementations shown herein. Also, each of the four functional die may be different from each other, or any of such functional die may be duplicates. It should also be understood that the example implementation 820 may be duplicated any number of times on an example carrier wafer. For example, though only one example set of four functional die is shown (e.g., a multi-chip module), the example set may be replicated any number of times on a single wafer (or panel) which may be singulated later (e.g., at block 755, etc.).

In general, block 720 may comprise mounting functional die to the carrier. Accordingly, the scope of this disclosure should not be limited by characteristics of any particular manner of mounting a die to a carrier or by any particular characteristics of mounting structures.

The example method 700 may, at block 725, comprise mounting (or attaching) connect die to the functional die. Block 725 may, for example, share any or all characteristics with block 320 of the example method 300 shown in FIG. 3. Block 725 may also, for example, share any or all characteristics with block 125 (e.g., with regard to the attachment between the connect die and the functional die) of the example method 100 shown in FIG. 1, with block 525 (e.g., with regard to the attachment between the connect die and the functional die), etc. Various example aspects of block 725 are presented at FIGS. 8D-1 (e.g., with regard to a one-sided connect die with conductive pads or other interconnection structures on only one side, etc.) and 8D-2 (e.g., with regard to a two-sided connect die with conductive pads or other interconnection structures on two sides, etc.).

For example, the first die interconnection structures 813 of the first functional die 801 and of the second functional die 802 may be mechanically and electrically connected to respective connect die interconnection structures 817 of a first connect die 816*a*-1 (or 816*b*-1). The first die interconnection structures 813 of the first functional die 801 (e.g., at the right side of the first functional die 801) may be connected to a left portion of the connect die interconnection structures 817, and the first die interconnection structures 813 of the second functional die 802 (e.g., at the left side of the second functional die 802) may be connected to a right portion of the connect die interconnection structures 817.

Such interconnection structures may be connected in any of a variety of manners, non-limiting examples of which are provided herein, for example with regard to the first die interconnection structures 213 and connect die interconnection structures 217 as discussed with regard to FIGS. 1 and 2 (e.g., FIG. 2E). Such interconnection structures may, for example, be coupled utilizing any of the variety of attachment techniques discussed herein.

After the connection of the first die interconnection structures 813 of the first functional die 801 and of the second functional die 802 to the first connect die 816*a*-1 (or 816*b*-1), the first connect die 816*a*-1 (or 816*b*-1) provides electrical connectivity between the first die interconnection structures 813 of the first functional die 801 and respective first die interconnection structures 813 of the second functional die 802.

As discussed herein, electrical connectivity between the first die interconnection structures 813 and the back side of the connect die 816*a* (or 816*b*) may or may not be provided.

Figures 1, 8D:
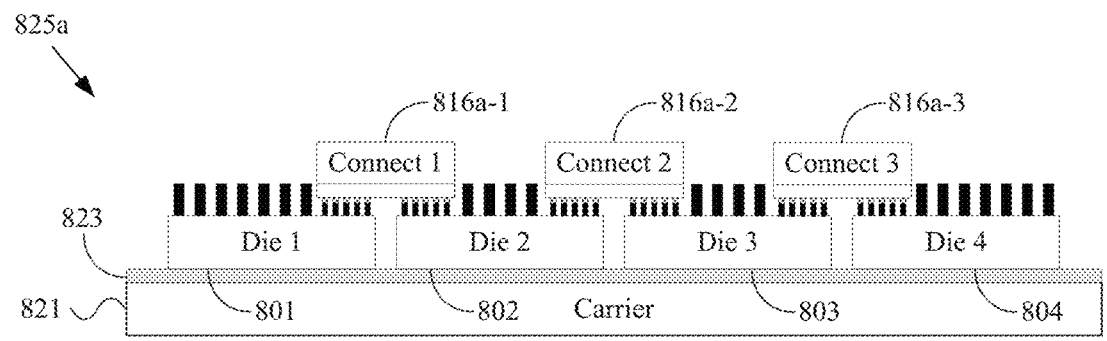
Figures 2, 8D:
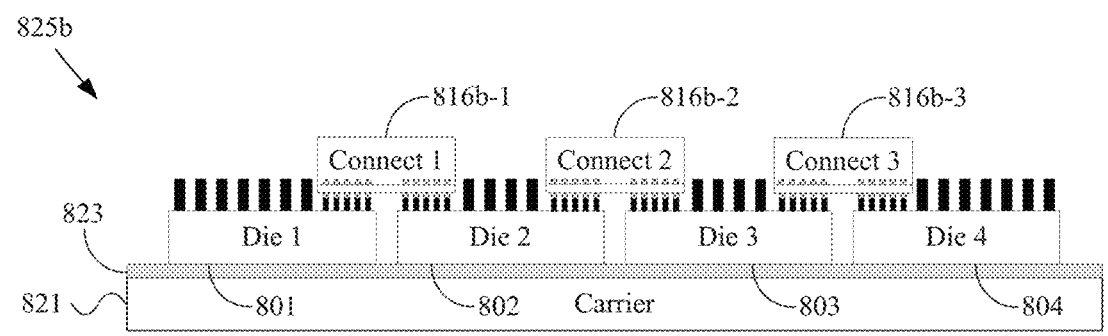
Figures 1, 8E:
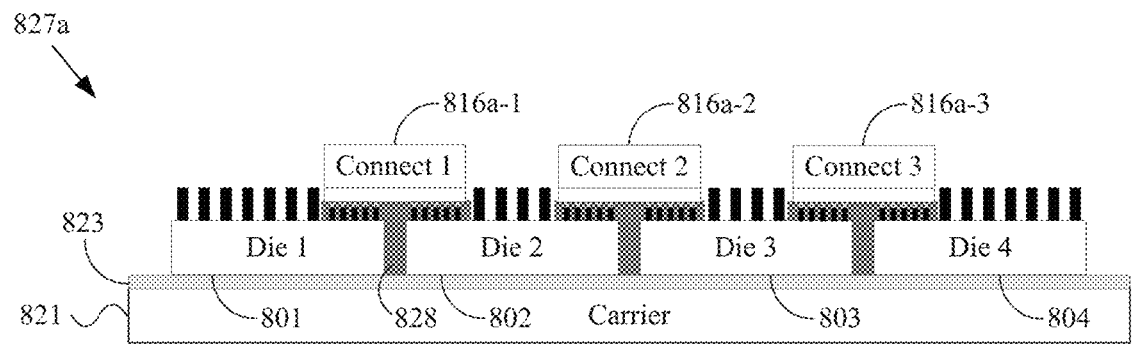
Figures 2, 8E:
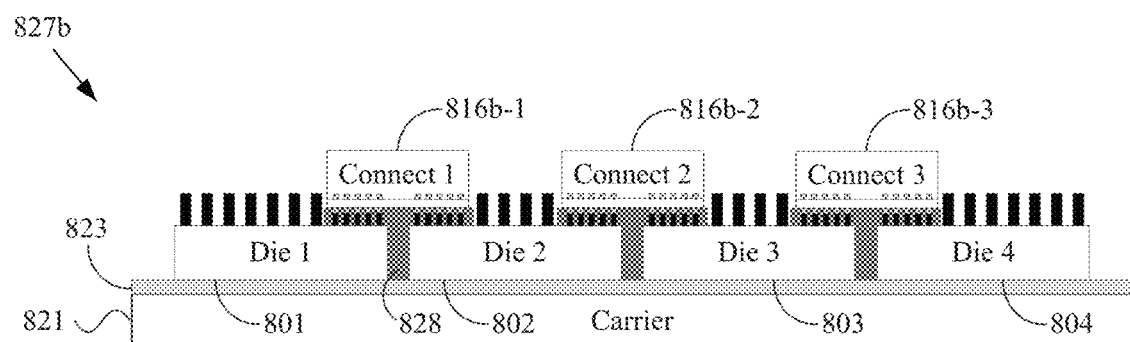

For example, in the example implementation 825*a* shown in FIG. 8D-1, after thinning the connect die 816*a*, there might not be an electrical connection between the top and bottom sides of the connect die 816*a*. In the example implementation 825*b* shown in FIG. 8D-2, however, after thinning the connect die 816*b*, there may be one or more electrical connections between the top and bottom sides of the connect die 816*b*. Note that an example implementation may comprise at least one of the connect die 816*a* and at least one of the connect die 816*b* in a same module.

As with the first connect die 816*a*-1 (or 816*b*-1) electrically connecting the first functional die 801 and second functional die 802, a second connect die 816*a*-2 (or 816*b*-2) may similarly provide a connection between the second functional die 802 and the third functional die 803, and a third connect die 816*a*-3 (or 816*b*-3) may similarly provide a connection between the third functional die 803 and the fourth functional die 804.

After (or before or while) attaching the connect die to the functional die at block 725, an underfill may be formed between the connect die and the functional die and/or between adjacent ones of the functional die. Such underfill may comprise any of a variety of characteristics. For example, the underfill may comprise a capillary underfill material, a pre-applied underfill material, a molded underfill material, etc. Such underfilling may be performed in any of a variety of manners, non-limiting examples of which are provided herein. For example, such underfilling may be performed utilizing one or more of a capillary underfill, a pre-applied underfill, an injected underfill, any combination thereof, etc. For example, in an example implementation, a first type of underfill (e.g., a pre-applied underfill, for example a non-conductive paste, etc.) may be utilized to fill between the functional die, and a capillary underfill may be utilized to fill between the functional die and the connect die. Example implementations 827*a* and 827*b* of such underfilling are provided at FIGS. 8E-1 and 8E-2. As shown in the example implementations 827*a* and 827*b*, the underfill material 828 may be formed between the connect die 816 and the functional die 801-804 and/or between any or all adjacent pairs of the functional die 801-804.

In general, block 725 may comprise mounting (or attaching) connect die to functional die. Accordingly, the scope of this disclosure should not be limited by characteristics of any particular manner of performing such attaching or of any particular type of attachment structure.

The example method 700 may, at block 735, comprise removing one or more carriers. Block 735 may, for example, share any or all characteristics with block 535 of the example method 500 of FIG. 5 (e.g., removing bulk carrier material and leaving the metal pattern or RD structure). Block 735 may also, for example, share any or all characteristics with block 135 of the example method 100 shown in FIG. 1, etc. Various example aspects of block 735 are presented at FIGS. 8F-1 (e.g., with regard to a one-sided connect die with conductive pads or other interconnection structures on only one side, etc.) and 8F-2 (e.g., with regard to a two-sided connect die with conductive pads or other interconnection structures on two sides, etc.).

Block 735 may, for example, comprise removing bulk carrier or base material 818 (818*a* or 818*b*) from the connect die 816 (816*a* or 816*b*). Such removing (or thinning) may be performed in any of a variety of manners, non-limiting examples of which are provided herein (e.g., grinding, peeling, sheering, thermal or light-based adhesive release, chemical-mechanical planarization, etc.). As shown in the example implementation 835*a* of FIG. 8F-1, the connect die 816a are thinned (or planarized) such that the back sides thereof are co-planar with exposed ends of the second interconnection structures 814 of the functional die 801-804. As shown in the example implementation 835b of FIG. 8F-2, the connect die 816b are thinned (or planarized) such that the exposed ends of the second connect die interconnection structures 899 are co-planar with the exposed ends of the second interconnection structures 814 of the functional die 801-804. Note that the exposed ends of the second interconnection structures 814 of the functional die 801-804 may also be thinned (or planarized) during such process. Also note that in an example scenario in which the connect die 816 are already at a desired final thickness or planarity, this thinning (or planarizing) aspect of the example method 700 may be skipped.

Block 735 may, for example, comprise removing bulk carrier or base material 821 from the metal pattern 823 (or metal carrier). Such removing (or thinning) may be performed in any of a variety of manners, non-limiting examples of which are provided herein (e.g., grinding, peeling, sheering, thermal or light-based adhesive release, chemical-mechanical planarization, etc.). Note that in an example scenario in which the carrier (or carrier material) is already at a desired thickness, this thinning (or planarizing) aspect of the example method 700 may be skipped.

In general, block 735 may comprise removing one or more carriers (or carrier material). Accordingly, the scope of this disclosure should not be limited by characteristics of any particular manner of carrier (or carrier material) removing or by characteristics of any particular type of carrier (or carrier material).

The example method 700 may, at block 755, comprise singulating. Block 755 may, for example, share any or all characteristics with block 155 of the example method 100 shown in FIG. 1, with block 355 of the example method 300 shown in FIG. 3, with block 555 of the example method 500 shown in FIG. 5, etc. Various example aspects of block 755 are presented at FIGS. 8G-1 (e.g., with regard to a one-sided connect die with conductive pads or other interconnection structures on only one side, etc.) and 8G-2 (e.g., with regard to a two-sided connect die with conductive pads or other interconnection structures on two sides, etc.).

As discussed herein, the example assemblies (or modules) shown herein may be formed on a wafer or panel that includes a plurality of such assemblies. In such an example implementation, the wafer or panel may be singulated (or diced) to form individual assemblies. Example saw lines (or streets) 856 are shown in the example implementations 855a and 855b of FIGS. 8G-1 and 8G-2. In the example implementation shown in which the bulk carrier (or carrier material) was removed at block 735, such singulating (e.g., sawing, cutting, breaking, dicing, etc.) need only be performed on the metal pattern 823 (or metal carrier). Since the bulk carrier (or carrier material) was removed, in various example implementations, it may be reused. Additionally, such bulk carrier (or carrier material) removal may enhance the efficiency of the singulating process at block 755. In an example implementation, if instead of removing the carrier (or carrier material) from the metal pattern 823 at block 735, such carrier or carrier material (or a portion thereof) is left (e.g., glass, silicon, etc.), block 755 may comprise cutting through such carrier or carrier material.

In general, block 755 may comprise singulating. Accordingly, the scope of this disclosure should not be limited by any particular manner of singulating.

The example method 700 may, at block 760, comprise mounting (or attaching) to a substrate. Block 760 may, for example, share any or all characteristics with any of the attaching steps discussed herein (e.g., attaching interconnection structures, attaching die backsides, etc.). Various example aspects of block 760 are presented at FIGS. 8H-1 (e.g., with regard to a one-sided connect die with conductive pads or other interconnection structures on only one side, etc.) and 8H-2 (e.g., with regard to a two-sided connect die with conductive pads or other interconnection structures on two sides, etc.). Block 760 may, for example, perform such attaching in any of a variety of manners, non-limiting examples of which are provided herein.

The substrate 861 may comprise any of a variety of characteristics, non-limiting examples of which are provided herein. For example, the substrate 861 may comprise a packaging substrate, an interposer, a mother board, printed wire board, etc. The substrate 861 may, for example, comprise a coreless substrate, an organic substrate, a ceramic substrate, etc. The substrate 861 may, for example, comprise one or more dielectric layers (e.g., organic and/or inorganic dielectric layers) and/or conductive layers formed on a semiconductor (e.g., silicon, etc.) substrate, a glass or metal substrate, a ceramic substrate, etc. The substrate 861 may, for example, share any or all characteristics with the RD structures 646 (646a or 646b) of FIGS. 6B-1 and 6B-2, with the RD structures 698 (698a or 698b) of FIGS. 6A-2 and 6A-4, with the RD structure 298 of FIG. 2C, etc. The substrate 861 may, for example, comprise an individual package substrate or may comprise a plurality of substrates coupled together (e.g., in a panel or wafer), which may be later singulated.

Figures 1, 8F:
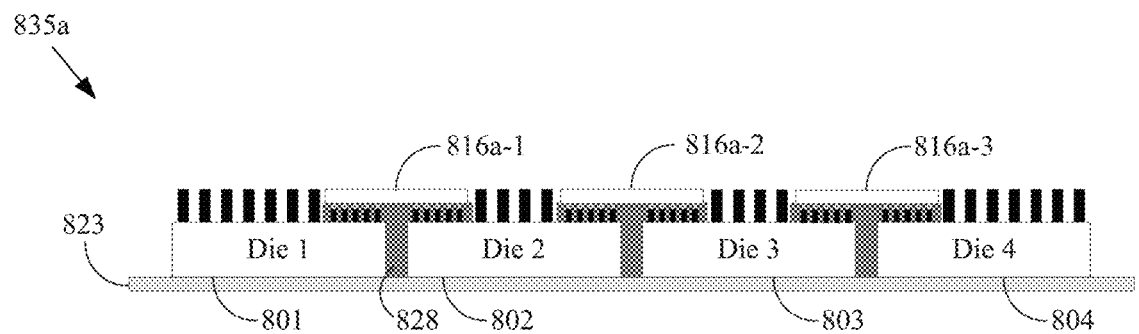
Figures 2, 8F:
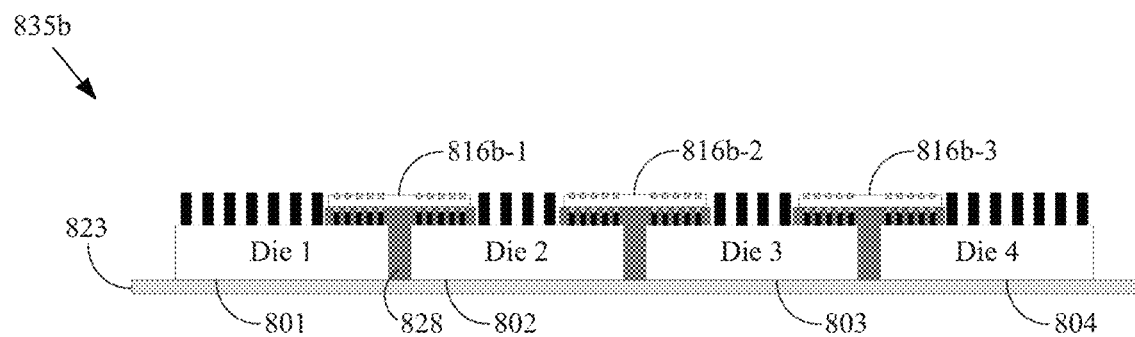
Figures 1, 8G:
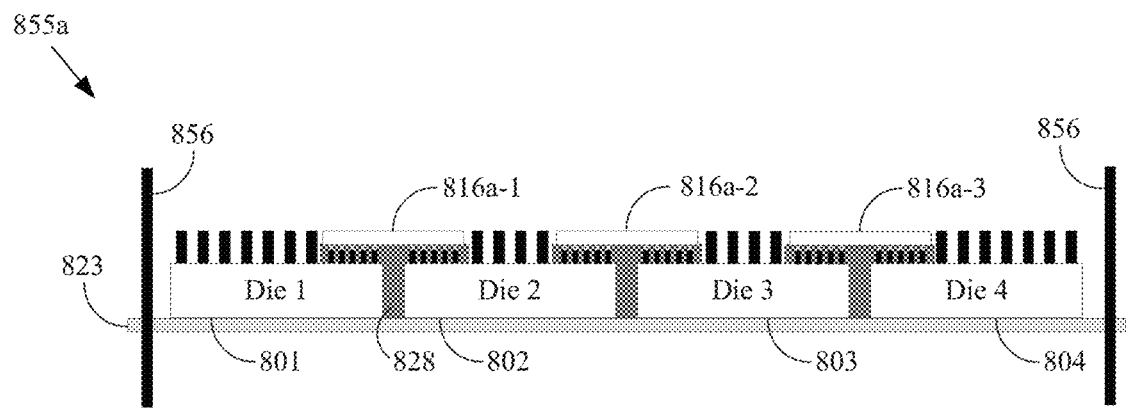
Figures 2, 8G:
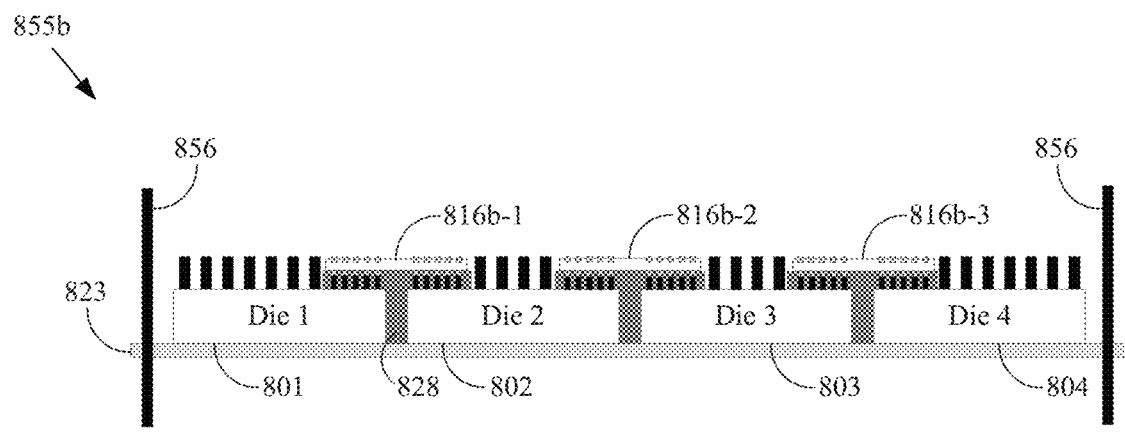
Figures 1, 8H:
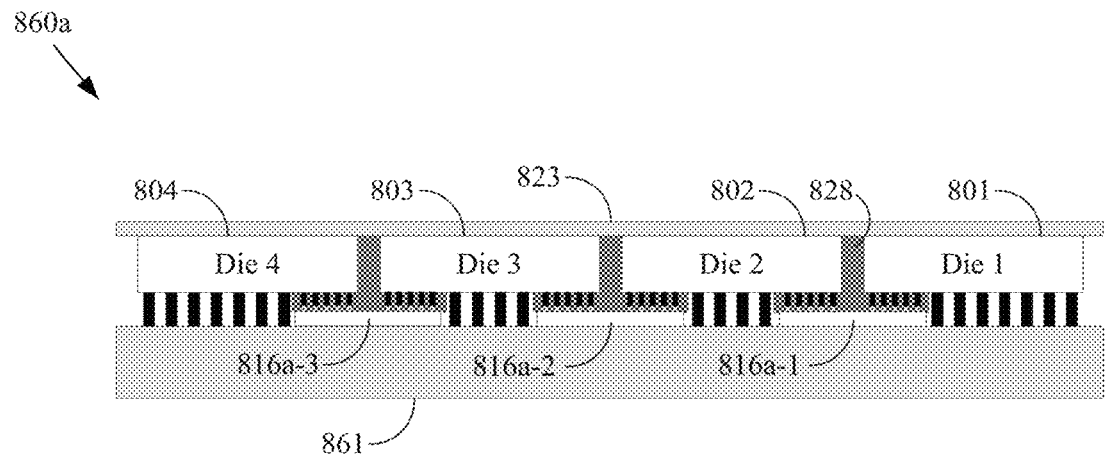
Figures 2, 8H:
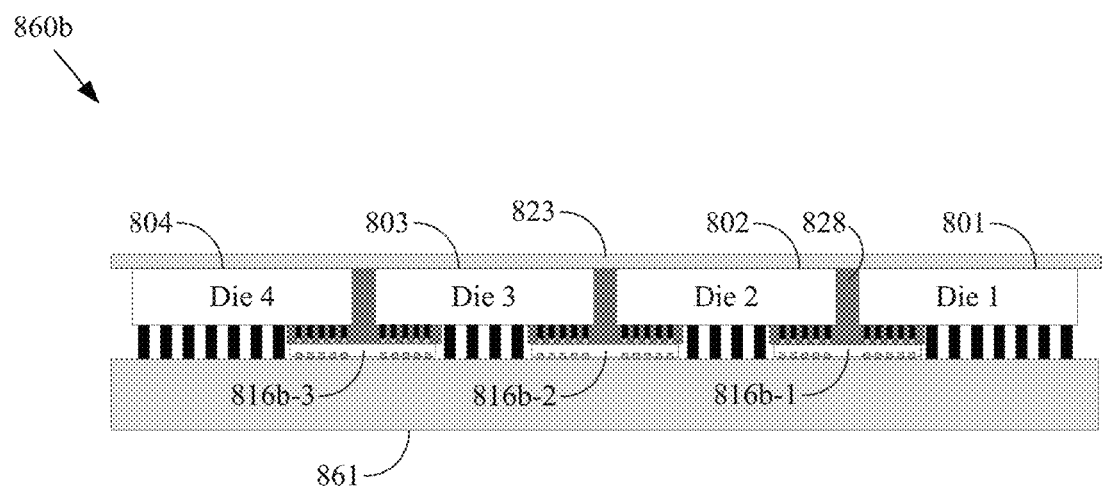
Figures 1, 8I:
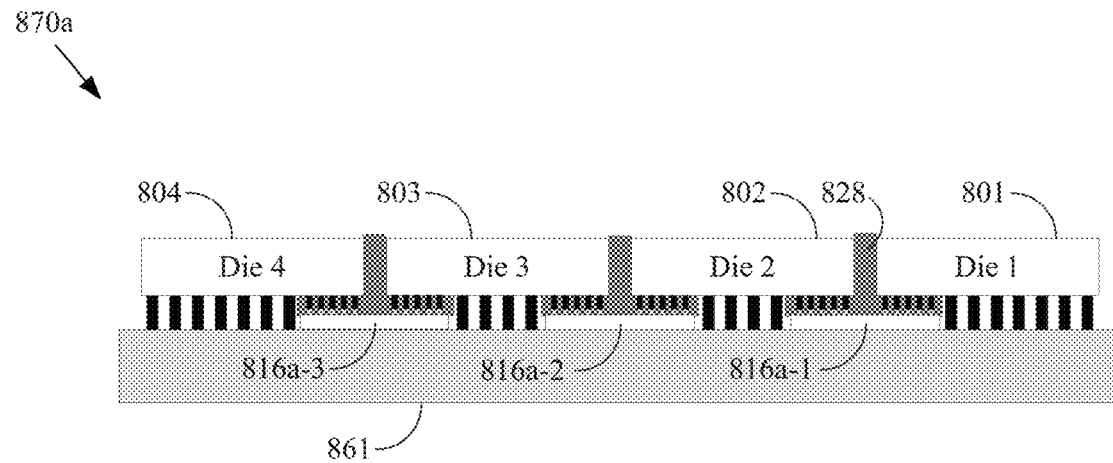
Figures 2, 8I:
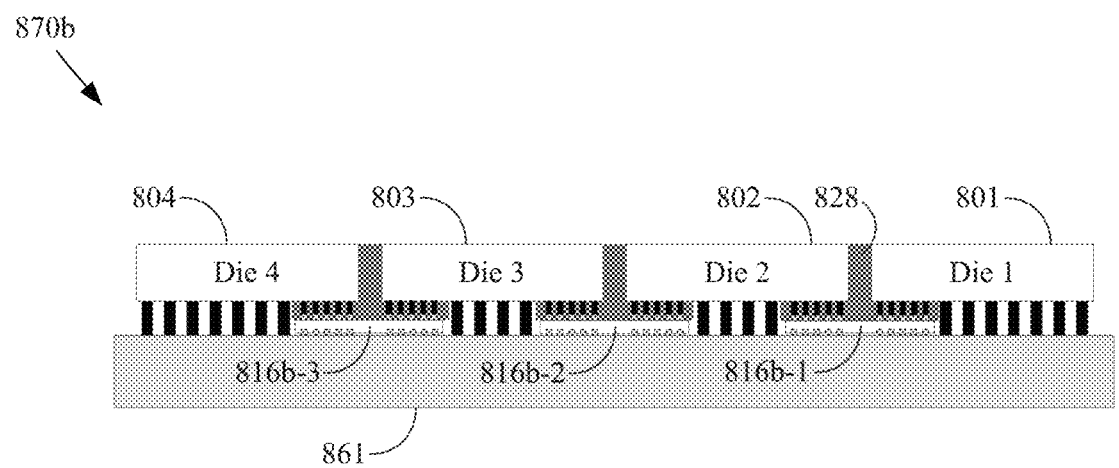

In the example implementation 860a shown in FIG. 8H-1, block 760 may comprise soldering (e.g., utilizing mass reflow, thermal-compression bonding, laser soldering, etc.) the second interconnection structures 814 of the functional die 801-804 to respective pads (e.g., bond pads, traces, lands, etc.) of the substrate 861. The connect die 816a (e.g., a backside thereof) may, for example, be adhered to the substrate 861 with a layer of adhesive.

In the example implementation 860b shown in FIG. 8H-2, block 760 may comprise soldering (e.g., utilizing mass reflow, thermal-compression bonding, laser soldering, etc.) the second interconnection structures 814 of the functional die 801-804 and the second interconnection structures 899 of the connect die 816b to respective pads (e.g., bond pads, traces, lands, etc.) of the substrate 861.

In general, block 760 comprises mounting (or attaching) the assembly (or module) singulated at block 755 to a substrate. Accordingly, the scope of this disclosure should not be limited by characteristics of any particular type of attaching or of any particular attachment structure.

The example method 700 may, at block 770, comprise removing the metal pattern (or carrier). Block 770 may, for example, share any or all characteristics with block 135 of the example method 100 shown in FIG. 1, with block 535 of the example method 500 shown in FIG. 5, with block 735, etc. Various example aspects of block 770 are presented at FIGS. 8I-1 (e.g., with regard to a one-sided connect die with conductive pads on only one side, etc.) and 8I-2 (e.g., with regard to a two-sided connect die with conductive pads on two sides, etc.). Block 770 may, for example, comprise performing such removing in any of a variety of manners, non-limiting examples of which are provided herein.

Block 770 may, for example, comprise removing the metal pattern 823 by utilizing any one or more of grinding, etching, chemical-mechanical planarization (CMP), thermal or laser release, mechanical peeling or sheering, etc. As shown in the example implementations 870a and 870b (e.g., compared to the example implementations 860*a* and 860*b*, respectively, of FIGS. 8H-1 and 8H-2), the metal pattern 823 (or metal carrier) has been removed.

In general, block 770 comprises removing the metal pattern (or carrier). Accordingly, the scope of this disclosure should not be limited by characteristics of any particular type of removing or of any particular metal pattern (or carrier).

The example method 700 may, at block 780, comprise underfilling. Block 780 may, for example, share any or all characteristics with any or all underfilling discussed herein. Various example aspects of block 780 are presented at FIGS. 8J-1 (e.g., with regard to a one-sided connect die with conductive pads or other interconnection structures on only one side, etc.) and 8J-2 (e.g., with regard to a two-sided connect die with conductive pads or other interconnection structures on two sides, etc.). Block 780 may, for example, perform such underfilling in any of a variety of manners, non-limiting examples of which are provided herein.

Figures 1, 8J:
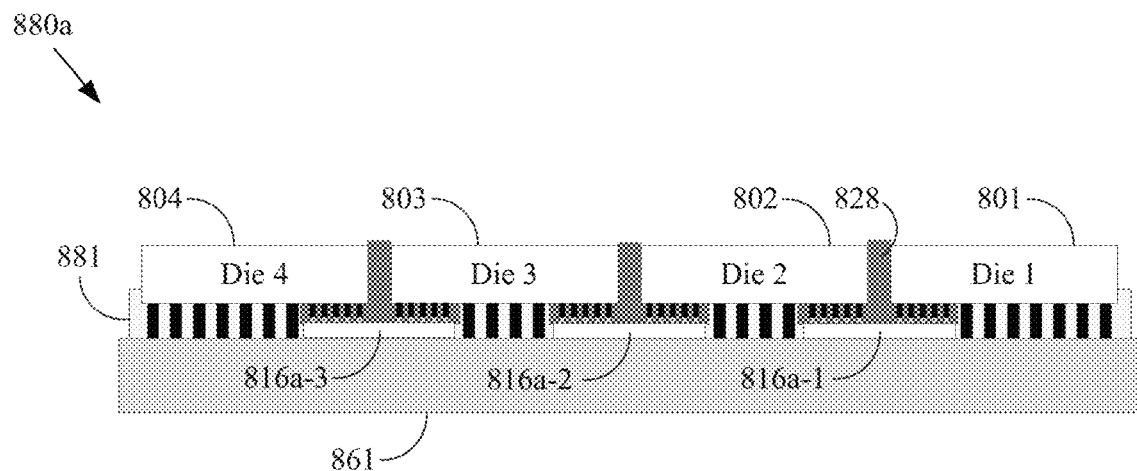
Figures 2, 8J:
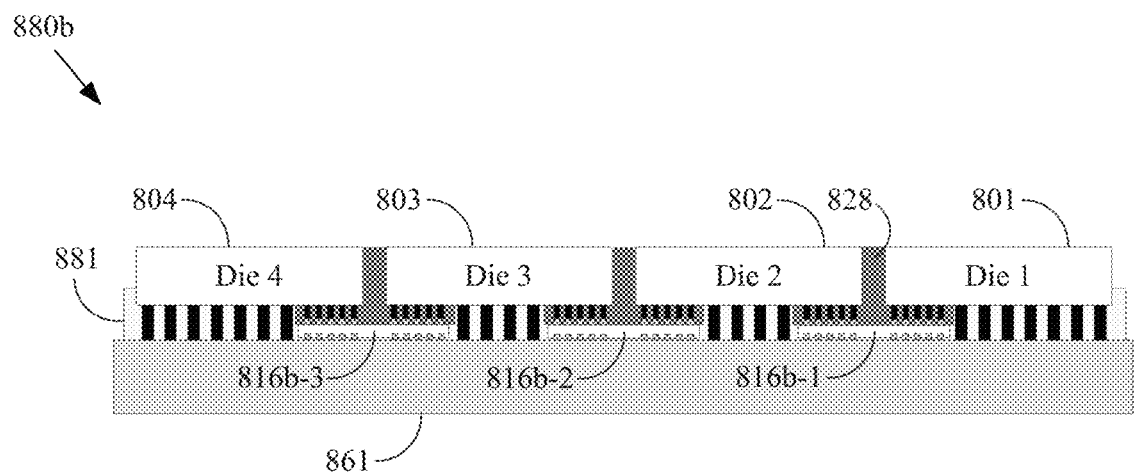

As shown in the example implementations 880*a* and 880*b* shown in FIGS. 8J-1 and 8J-2, the underfill 881 fills between the functional die 801-804 and the substrate 861. For example, the underfill 881 surrounds the second interconnection structures 814 of the functional die 801-804. As discussed herein with regard to block 725, an underfill 828 may also be separately formed between the functional die 801-804 and the connect die 816 and/or between adjacent functional die 801-804. In another example implementation, all of such underfilling (or filling) may be formed at block 780.

The underfill 881 may, for example, comprise a different type of underfill than that 828 between the functional die 801-804 and the connect die 816 and/or between adjacent functional die 801-804. For example, a filler particle size of the underfill 881 may be larger than a filler particle size of the underfill 828 between the functional die 801-804 and the connect die 816 and/or between adjacent functional die 801-804.

Block 780 may comprise forming the underfill 881 utilizing a capillary underfilling process, utilizing a pre-applied underfill (e.g., at block 760, etc.), utilizing a molded underfill, etc. Though not shown in FIGS. 8J-1 and 8J-2, block 780 may also comprise performing a molding (or encapsulating) process to cover side and/or top surfaces of the functional die 801-804 and/or side or top surfaces of the substrate 861.

In general, block 780 comprises underfilling. Accordingly, the scope of this disclosure should not be limited by characteristics of any particular manner of underfilling or type of underfill.

The example method 700 may, at block 790, comprise performing continued processing. Such continued processing may comprise any of a variety of characteristics. For example, block 790 may comprise returning execution flow of the example method 700 to any block thereof. Also for example, block 790 may comprise directing execution flow of the example method 700 to any other method block (or step) discussed herein (e.g., with regard to the example method 100 of FIG. 1, the example method 300 of FIG. 3, the example method 500 of FIG. 5, etc.).

In the example implementation discussed with regard to FIG. 7 and FIGS. 8A-8J, the functional die were mounted to the carrier (e.g., to a metal pattern thereof, etc.) back-side down, for example with the interconnection structures of such die facing away from the carrier. Note that the scope of the present disclosure is not limited thereto. For example, in other example implementations, the functional die may be mounted to the carrier (e.g., to a metal pattern thereof, etc.) front-side down, for example with the interconnection structures of one or more of such functional die facing the carrier. A non-limiting example implementation in which the front sides of the functional die are mounted to the carrier will now be discussed.

Figure 9:
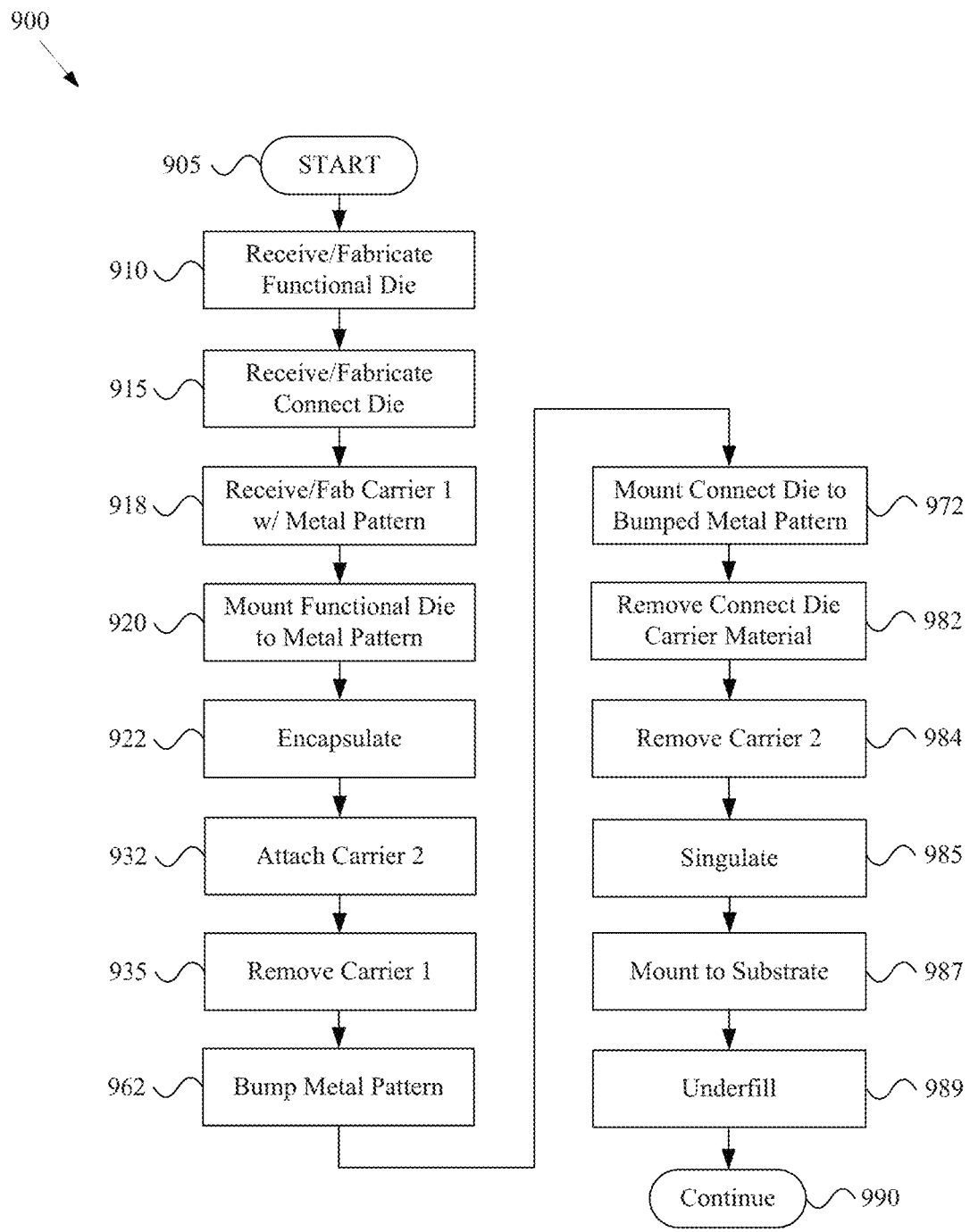
FIG. 9 shows a flow diagram of an example method of making an electronic device, in accordance with various aspects of the present disclosure.

FIG. 9 shows a flow diagram of an example method 900 of making an electronic device (e.g., a semiconductor package, etc.), in accordance with various aspects of the present disclosure. The example method 900 may, for example, share any or all characteristics with any other example method discussed herein (e.g., the example method 100 of FIG. 1, the example method 300 of FIG. 3, the example method 500 of FIG. 5, the example method 700 of FIG. 7, etc.). FIGS. 10A-10K show cross-sectional views illustrating an example electronic device (e.g., an electronic package, etc.) and an example method of making an example electronic device, in accordance with various aspects of the present disclosure. FIGS. 10A-10K may, for example, illustrate an example electronic device at various blocks (or steps) of the method 900 of FIG. 9. FIGS. 9 and 10A-10K will now be discussed together. It should be noted that the order of the example blocks of the method 900 may vary without departing from the scope of this disclosure.

The example method 900 begins executing at block 905. Block 905 may, for example, share any or all characteristics with block 105 of the example method 100 shown in FIG. 1, with block 305 of the example method 300 shown in FIG. 3, with block 505 of the example method 500 shown in FIG. 5, with block 705 of the example method 700 shown in FIG. 7, etc.

The example method 900 may, at block 910, comprise receiving and/or fabricating a plurality of functional die. Block 910 may, for example, share any or all characteristics with block 110 of the example method 100 shown in FIG. 1, with block 310 of the example method 300 shown in FIG. 3, with block 510 of the example method 500 shown in FIG. 5, with block 710 of the example method 700 shown in FIG. 7, etc.

The example method 900 may, at block 915, comprise receiving and/or fabricating one or more connect die. Block 915 may, for example, share any or all characteristics with block 115 of the example method 100 shown in FIG. 1, with block 315 of the example method 300 shown in FIG. 3, with block 515 of the example method 500 shown in FIG. 5, with block 715 of the example method 700 shown in FIG. 7, etc.

The example method 900 may, at block 918, comprise receiving and/or fabricating a carrier. Block 918 may, for example, share any or all characteristics with block 120 of the example method 100 shown in FIG. 1, with block 518 of the example method 500 shown in FIG. 5, block 718 of the example method 700 shown in FIG. 7, etc.

The example method 900 may, at block 920, comprise mounting functional die to the carrier (e.g., to a metal pattern thereof, to an RD structure thereof, etc.). Block 920 may, for example, share any or all characteristics with block 525 of the example method 500 shown in FIG. 5 (e.g., attaching functional die to the carrier (and/or RD structure)), with block 125 of the example method 100 shown in FIG. 1 (e.g., attaching functional die to the carrier), with block 720 of the example method 700 shown in FIG. 7, etc. Various example aspects of block 920 are presented at FIGS. 10A-1 and 10A-2.

The functional die 1001-1004 may, for example, be received as individual die. Also for example, the functional die 1001-1004 may be received on a single wafer (e.g., as shown at 210A, etc.), the functional die 1001-1004 may be received on multiple respective wafers (e.g., as shown at 210B and 210C, etc.), etc. In a scenario in which one or both of the functional die are received in wafer form, the functional die may be singulated from the wafer. Note that if any of the functional die 1001-1004 are received on a single MPW (e.g., as shown at 210A, etc.), such functional die may be singulated from the wafer as an attached set (e.g., connected with silicon).

The functional die 1001-1004 may be attached to the metal pattern 1023 (which may, for example, share any or all characteristics with the metal pattern 823 of FIG. 8B and discussed herein). In the example implementation 1020a shown at FIG. 10A-1, the functional die 1001-1004 are attached to the metal pattern 1023. As discussed herein, the metal pattern 1023 may comprise a single metal layer, a multi-layer signal distribution structure comprising a plurality of dielectric and conductive layers, pads or other interconnection structures, etc.

For example, first die interconnection structures 1014 of the first functional die 1001 (and of the other functional die 1002-1004) may be mechanically and electrically connected to respective interconnection structures (e.g., pads, traces, lands, bumps, posts, pillars, etc.) of the metal pattern 1023.

Such interconnection structures may be connected in any of a variety of manners. For example, the connection may be performed by soldering. In an example implementation, the first die interconnection structures 1014 and/or corresponding interconnection structures of the metal pattern 1023 may comprise solder caps (or bumps or balls or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963, 037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the first die interconnection structures 1014 to the metal pattern 1023 (e.g., mass reflow, thermal-compression bonding (TCB), direct metal-to-metal intermetallic bonding, conductive adhesive, etc.).

After the connection of the first die interconnection structures 1014 of the first functional die 1001 (and of the other functional die 1002-1004) to the metal pattern 1023, the metal pattern 1023 may provide electrical connectivity between the first die interconnection structures 1014 of the first functional die 1001 (and of the other functional die 1002-1004) and respective interconnection structures of the metal pattern 1023 on the side of the metal pattern 1023 opposite the side on which the first functional die 1001 is positioned.

As discussed herein, underfill may be applied between the functional die 1001-1004 and the metal pattern 1023. In a scenario in which pre-applied underfill (PUF) is utilized, such PUF may be applied to the metal pattern and/or functional die before the attachment of the first die interconnection structures to the metal pattern. Also for example, the underfill may be formed after such attachment (e.g., a capillary underfill, a molded underfill, etc.). As shown in the example implementation 1020b of FIG. 10A-2, the underfill material 1024 (e.g., any underfill material discussed herein, etc.) may completely or partially cover the top side of the metal pattern 1023. The underfill material 1024 may also, for example, surround the first interconnection structures 1014 of the functional die 1001-1004 and/or of the metal pattern 1023, cover a bottom side of the functional die 1001-1004, and/or cover at least a portion (or all) of the side surfaces of the functional die 1001-1004. The encapsulating material 1024 may, for example, fill at least a portion (or all) of gaps between adjacent die of the functional die 1001-1004.

It should be noted that a testing process may be performed between attachment of any of the functional die 1001-1004. In such a scenario, as discussed herein, underfill may be applied between any or all of the functional die 1001-1004 and the metal pattern 1023 (and/or between any adjacent pair of the functional die 1001-1004) prior to such test(s). Note that the metal pattern 1023 may, for example, comprise traces to utilize in such testing. In an example scenario, having passed electrical test, next functional die may then be attached (e.g., with or without underfill).

It should also be noted that although the illustrations herein generally present the functional die 1001-1004 (and interconnection structures thereof) as being similarly sized and shaped, such symmetry is not required. For example, the functional die 1001-1004 may be of different respective shapes and sizes, may have different types and/or numbers of interconnection structures, etc.

It should additionally be noted that although the discussion herein of FIGS. 9 and 10A-10K generally focuses on four functional die coupled to a single metal pattern (or carrier), the scope of this disclosure is not limited thereto. For example, any number of functional die (e.g., two die, three die, five die, etc.) may be coupled to a single metal pattern (or carrier). Also for example, any number of metal patterns (and die attached thereto) may be utilized in a single module or package.

In general, block 920 may comprise attaching the functional die to the carrier (e.g., to a metal pattern thereof, to an RD structure thereof, etc.). Accordingly, the scope of this disclosure should not be limited by characteristics of any particular manner of such attaching or by any particular characteristics of such functional die, carrier, metal pattern, attachment or interconnection structures, etc.

The example method 900 may, at block 922, comprise encapsulating. Block 920 may comprise performing such encapsulating in any of a variety of manners, non-limiting examples of which are provided herein. Various example aspects of block 922 are presented at FIGS. 10B-1 and 10B-2. Block 922 may, for example, share any or all characteristics with other encapsulating steps discussed herein (e.g., block 130 of the example method 100 shown in FIG. 1, block 330 of the example method 300 of FIG. 3, block 530 of the example method 500 of FIG. 5, etc.).

Block 922 may, for example, comprise performing a wafer (or panel) level molding process. As discussed herein, prior to singulating individual modules, any or all of the process steps discussed herein may be performed at the panel or wafer level. Referring to the example implementation 1022a shown at FIG. 10B-1, the encapsulating material 1026' may cover a top side of the metal pattern 1023, exposed portions of the underfill 1024, top sides of the functional die 1001-1004, at least portions of side surfaces of the functional die 1001-1004, etc.

Figures 1, 10A:
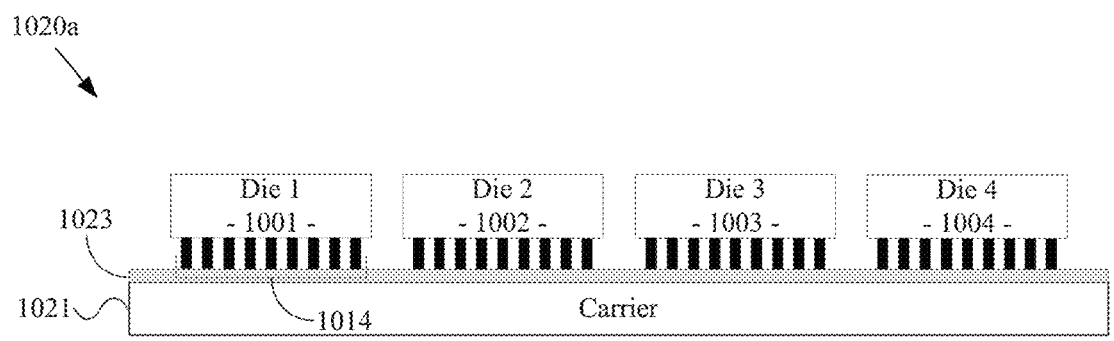
Figures 2, 10A:
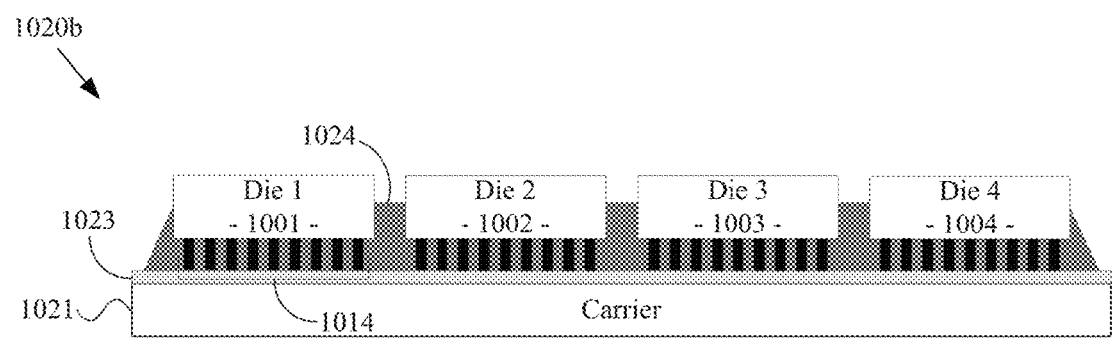
Figures 1, 10B:
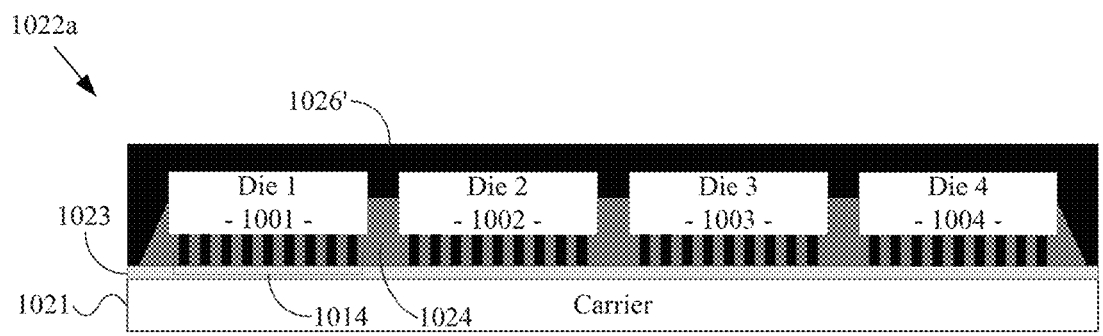
Figures 2, 10B:
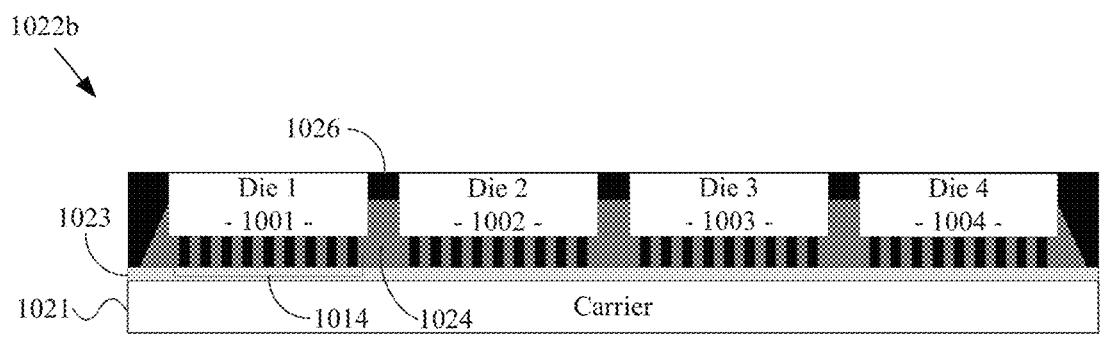

Though the encapsulating material 1026' (as shown in FIG. 10B-1) is shown covering the top sides of the functional die 1001-1004, any or all of such top sides may be exposed from the encapsulating material 1026 (as shown in FIG. 10B-2). Block 922 may, for example, comprise originally forming the encapsulating material 1026 with the die top sides exposed (e.g., utilizing a film assisted molding technique, die-seal molding technique, etc.), forming the encapsulating material 1026' followed by a thinning process to thin the encapsulating material enough to expose the top sides of any or all of the functional dies 1001-1004, forming the encapsulating material 1026' followed by a thinning process to thin the encapsulating material but still leave a portion of the encapsulating material 1026' to cover the top sides of any or all of the functional dies 1001-1004, etc. In an example implementation, block 922 may comprise thinning (or planarizing) both the encapsulating material 1026' and back sides of any or all of the functional die 1001-1004, thus providing for coplanarity of the top surfaces of the encapsulating material 1026 and of the functional dies 1001-1004.

In general, block 922 may comprise encapsulating. Accordingly, the scope of this disclosure should not be limited by characteristics of any particular manner of performing such encapsulating or of any particular type of encapsulating material or configuration thereof.

The example method 900 may, at block 932, comprise attaching a second carrier. Block 932 may, for example, share any or all characteristics with any carrier attaching discussed herein (e.g., with regard to block 120 of the example method 100 shown in FIG. 1, with regard to block 520 of the example method 500 shown in FIG. 1, with regard to block 720 of the example method 700 shown in FIG. 7, etc.). Various example aspects of block 932 are shown at FIG. 10C.

Figure 10C:
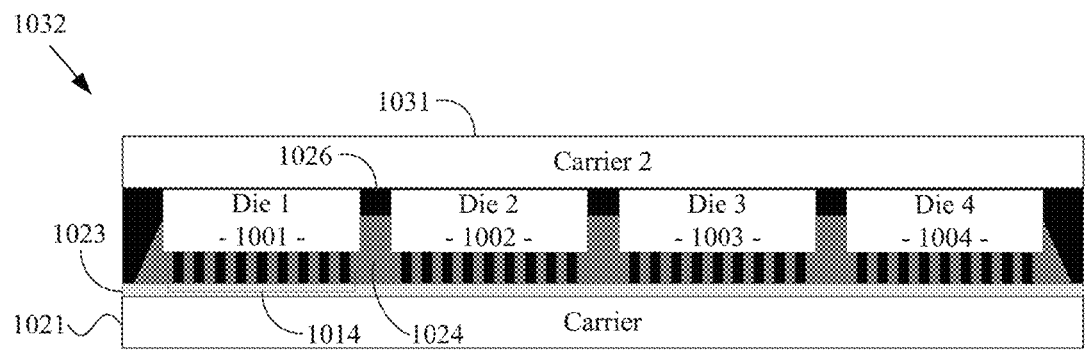

As shown in the example implementation 1032 of FIG. 10C, the second carrier 1031 may be attached to the top sides of the encapsulating material 1026 and/or top sides of the functional die 1001-1004. Note that the assembly may be still in a wafer (or panel) form at this point. The carrier 1031 may comprise any of a variety of characteristics. For example, the carrier 1031 may comprise a glass carrier, silicon (or semiconductor) carrier, metal carrier, etc. Block 932 may comprise attaching the carrier 1031 in any of a variety of manners. For example, block 932 may comprise attaching the carrier 1031 using an adhesive, using a mechanical attachment mechanism, using vacuum attachment, etc.

In general, block 932 may comprise attaching a second carrier. Accordingly, the scope of this disclosure should not be limited by characteristics of any particular manner of attaching a carrier or by characteristics of any particular type of carrier.

The example method 900 may, at block 935, comprise removing the first carrier. Block 935 may, for example, share any or all characteristics with block 735 of the example method 700 shown in FIG. 7. Also for example, block 935 may share any or all characteristics with any carrier-removal process discussed herein (e.g., with regard to block 135 of the example method 100 shown in FIG. 1, with regard to block 535 of the example method 500 shown in FIG. 5, etc.). Various example aspects of block 935 are shown at FIG. 10D.

Figure 10D:
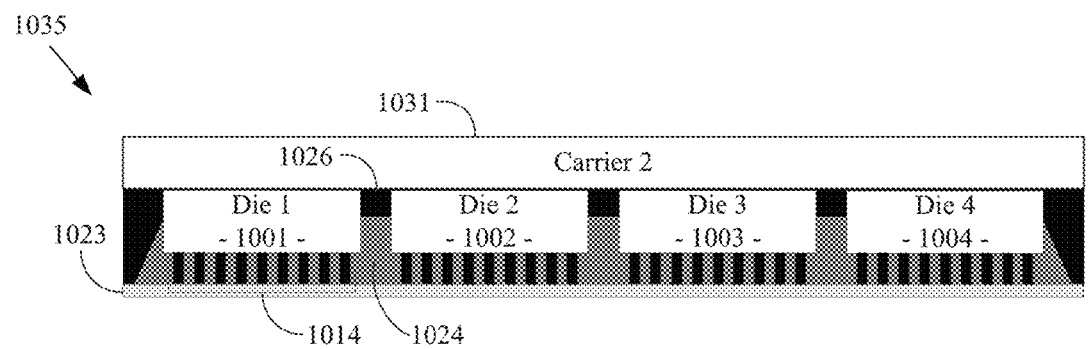

For example, the example implementation 1035 of FIG. 10D shows the first carrier 1021 removed (e.g., in comparison with the example implementation 1032 of FIG. 10C). Block 935 may comprise performing such carrier removal in any of a variety of manners (e.g., grinding, etching, chemical-mechanical planarization, peeling, shearing, thermal or laser releasing, etc.).

In general, block 935 may comprise removing the first carrier. Accordingly, the scope of this disclosure should not be limited by characteristics of any particular manner of removing a carrier or by characteristics of any particular type of carrier.

The example method 900 may, at block 962, comprise bumping the metal pattern. Block 962 may, for example, share any or all characteristics with any interconnection structure forming process discussed herein (e.g., with regard to the forming of interconnection structures on connect die and/or functional die, with regard to the forming of interconnection structures on a redistribution structure and/or metal pattern, etc.). Various example aspects of block 962 are shown at FIG. 10E.

Figure 10E:
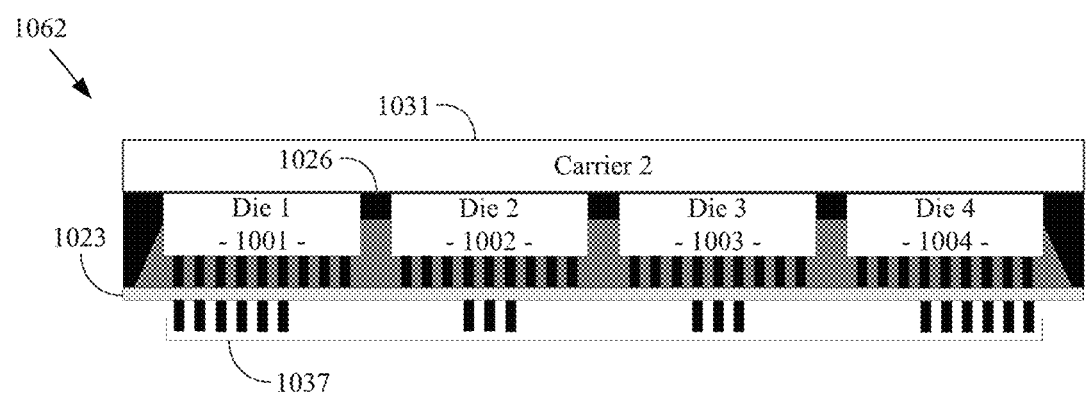

The example implementation 1062 shown at FIG. 10E comprises a bump pattern 1037 formed on the bottom side of the metal pattern 1023 (e.g., the bottom side of the metal pattern 1023 exposed by the removal of the first carrier at block 935. Block 962 may, for example, comprise forming the bump pattern (e.g., the bump pattern 1037, etc.) in any of a variety of manners. For example, block 962 may comprise performing wafer bumping on the metal pattern 1023. Block 962 may, for example, comprise forming conductive bumps or balls (e.g., solder bumps or balls), metal posts or pillars (e.g., copper posts or pillars, with or without solder caps), wires (e.g., wire-bonded wires, etc.), pads, lands, etc. Block 962 may, for example, comprise forming such features in any of a variety of manners (e.g., plating, ball dropping, pasting or printing and/or reflowing, etc.).

In general, block 962 may comprise bumping the metal pattern (or generally forming interconnection structures). Accordingly, the scope of this disclosure should not be limited by characteristics of any particular manner of performing such bumping (or interconnection structure forming) or by characteristics of any particular type of bumps (or interconnection structures).

The example method 900 may, at block 972, comprise mounting (or attaching) connect die to the bumped metal pattern. Block 972 may, for example, share any or all characteristics with block 520 of the example method 500 shown in FIG. 5, with block 120 of the example method 100 shown in FIG. 1, etc. Block 972 may also, for example, share any or all characteristics with block 920 (e.g., mounting connect die rather than functional die, etc.). Various example aspects of block 972 are presented at FIGS. 10E-1 and 10E-2.

For example, die interconnection structures of the first connect die 1016'-1 (and of the other connect die 1016'-2 and 1016'-3) may be mechanically and electrically connected to respective interconnection features (e.g., pads, traces, lands, bumps, posts, pillars, etc.) of the metal pattern 1023.

Such interconnection structures may be connected in any of a variety of manners. For example, the connection may be performed by soldering. In an example implementation, the die interconnection structures and/or corresponding interconnection structures of the metal pattern 1023 may comprise solder caps (or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the die interconnection structures to the metal pattern 1023 (e.g., mass reflow, thermal-compression bonding (TCB), direct metal-to-metal intermetallic bonding, conductive adhesive, etc.).

As shown in the example implementation 1072a, interconnection structures of the first connect die 1016'-1 are connected to respective interconnection structures of the metal pattern 1023. As connected, the first connect die 1016'-1 provides an electrical connection between various interconnection structures of the first functional die 1001 and the second functional die 1002 via the metal pattern 1023 (or RD structure, etc.). Similarly, the second connect die 1016'-2 provides electrical connection between the second functional die 1002 and the third functional die 1003, and the third connect die 1016'-3 provides electrical connection between the third functional die 1003 and the fourth functional die 1004.

As shown in FIG. 10E-1, the connect die 1016' are shown with a thicker form factor than will be present in the completed electronic device. The connect die 1016' may, for example, be thinned at a later process. Note, however, that the connect die 1016' may be formed with their final desired thickness prior to the mounting at block 972.

Underfill may be applied between the connect die (1016'-1, 1016'-2, and/or 1016'-3) and the metal pattern 1023. In a scenario in which pre-applied underfill (PUF) is utilized, such PUF may be applied to the metal pattern 2013 and/or connect die (1016'-1, 1016'-2, and/or 1016'-3) before the coupling of the die interconnection structures to the metal pattern. Also for example, the underfill may be formed after such attachment (e.g., a capillary underfill, a molded underfill, etc.). As shown in the example implementation 1072b of FIG. 10E-2, the underfill material 1073 (e.g., any underfill material discussed herein, etc.) may completely or partially cover the bottom side of the metal pattern 1023. The underfill material 1073 may also, for example, surround the interconnection structures of the connect die (1016'-1, 1016'-2, and/or 1016'-3), cover a top side of the connect die (1016'-1, 1016'-2, and/or 1016'-3), and/or cover at least a portion (or all) of the side surfaces of the connect die (1016'-1, 1016'-2, and/or 1016'-3). The encapsulating material 1073 may, for example, fill at least a portion (or all) of gaps between adjacent die of the connect die (1016'-1, 1016'-2, and/or 1016'-3). For example, the encapsulating material 1073 may extend laterally from the region directly between the connect die (1016'-1, 1016'-2, and/or 1016'-3) and the metal pattern 1023.

Note that although the example connect die (1016'-1, 1016'-2, and 1016'-3) are shown as two-sided connect die (e.g., like the example connect die 616a of FIG. 6, the example connect die 816a of FIG. 8, etc.), the scope of this disclosure is not limited thereto. For example, any or all of such example connect die (1016'-1, 1016'-2, and 1016'-3) may be single-sided (e.g., like the example connect die 616a of FIG. 6, the example connect die 816a of FIG. 8, etc.).

In general, block 972 may comprise mounting (or attaching) connect die to the bumped metal pattern. Accordingly, the scope of this disclosure should not be limited by characteristics of any particular manner of performing such attaching or by characteristics of any particular type of attaching structure.

The example method 900 may, at block 982, comprise removing connect die carrier material. Block 982 may, for example, share any or all characteristics with block 735 of the example method 700 of FIG. 7 (e.g., examples of which are also shown at FIG. 8F). Block 982 may also, for example, share any or all characteristics with any carrier (or carrier material) removing process step discussed herein (e.g., with regard to block 135 of the example method 100 shown in FIG. 1, block 535 of the example method 500 shown in FIG. 5, etc. Various example aspects of block 982 are presented at FIG. 10G.

Block 982 may, for example, comprise performing such material removal by grinding, etching, chemical-mechanical planarization, peeling, sheering, thermal or laser adhesive release, etc.

Figures 1, 10F:
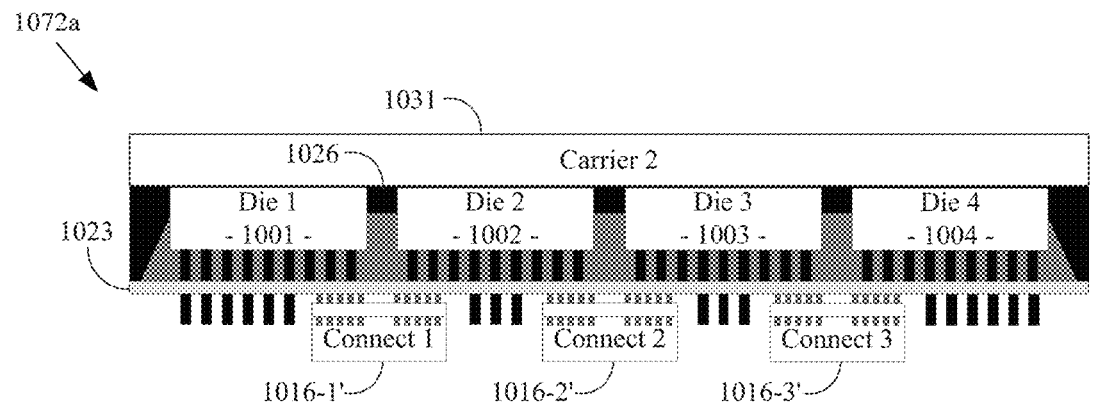
Figures 2, 10F:
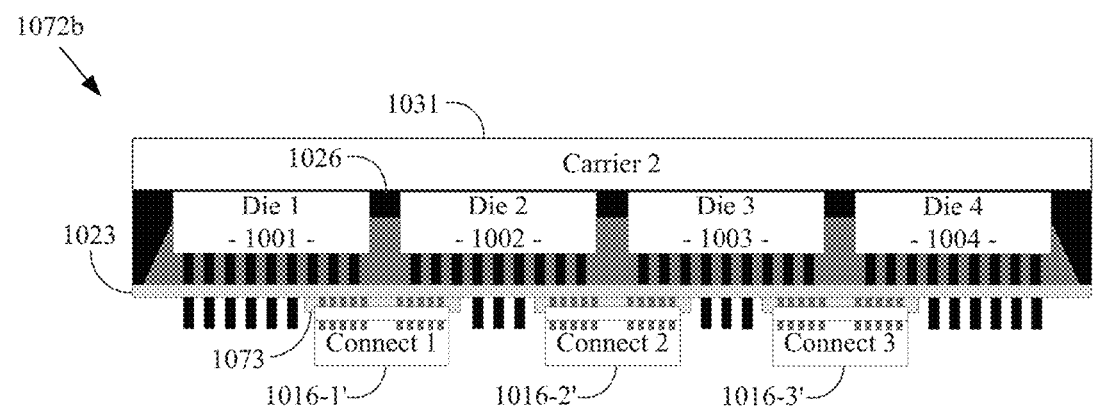
Figure 10G:
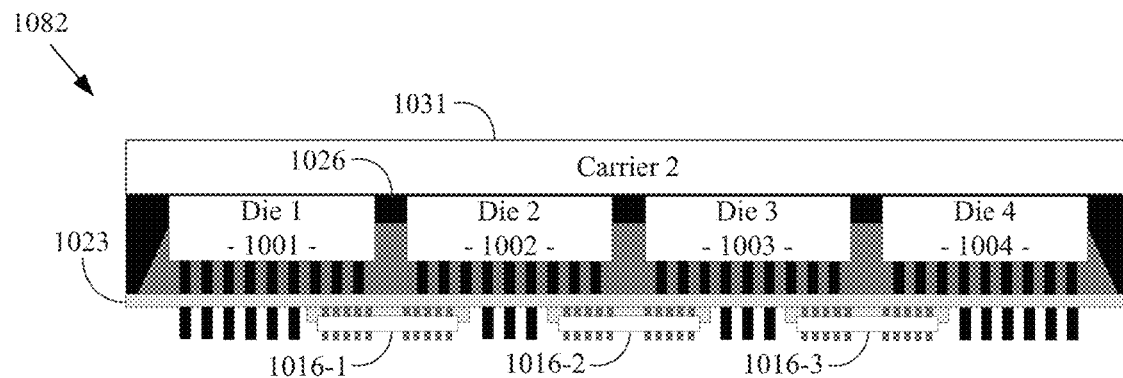

For example, in the example implementation 1082 shown in FIG. 10G, the example connect die (1016-1, 1016-2, and 1016-3) are shown thinned (or planarized, etc.) relative to the example connect die (1016'-1, 1016'-2, and 1016'-3) shown in FIG. 10F. In the example implementation 1082 (e.g., an example implementation with double-sided connect die), the example connect die (1016-1, 1016-2, and 1016-3) are shown with bottom side interconnection structures exposed. Such exposed interconnection structures may, for example, be coupled to a substrate or other device at a later process step.

In general, block 982 may comprise removing connect die carrier (or bulk) material. Accordingly, the scope of this disclosure should not be limited by characteristics of any particular manner of performing such removing or by characteristics of any particular type of material being removed.

The example method 900 may, at block 984, comprise removing the second carrier. Block 984 may, for example, share any or all characteristics with any carrier removal step discussed herein. For example, block 984 may share any or all characteristics with block 135 of the example method 100 of FIG. 1. Also for example, block 984 may share any or all characteristics with block 535 of the example method 500 shown in FIG. 5, with blocks 735 and/or 770 of the example method 700 shown in FIG. 7, etc. Various example aspects of block 984 are shown in FIG. 10H.

Figure 10H:
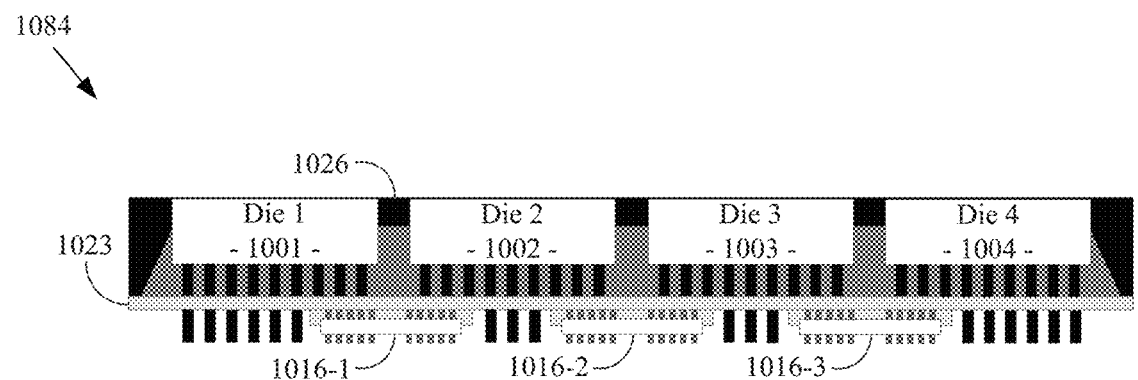
Figure 10I:
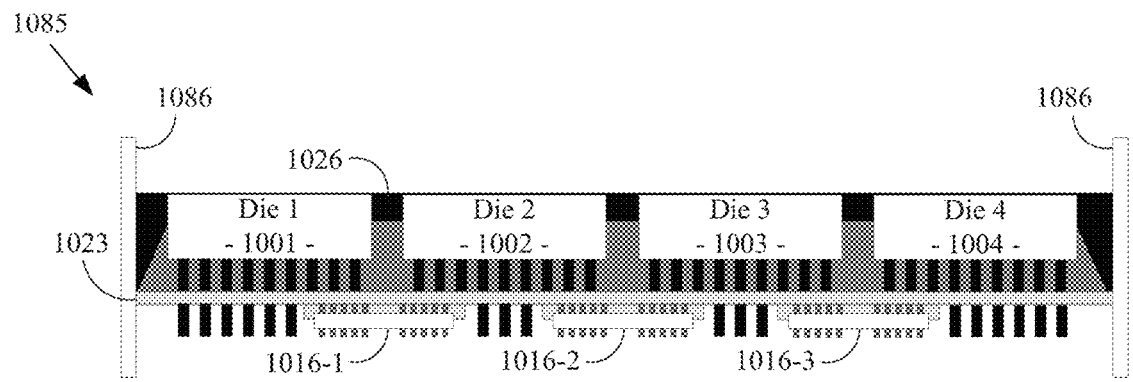

For example, the example implementation 1084 shown in FIG. 10H does not include the second carrier 1031 of the example implementation 1082 shown in FIG. 10I.

In general, block 984 may comprise removing the second carrier. Accordingly, the scope of this disclosure should not be limited by characteristics of any particular manner of performing such carrier removing or by characteristics of any particular type of carrier or carrier material being removed.

The example method 900 may, at block 985, comprise singulating. Block 985 may, for example, share any or all characteristics with block 155 of the example method 100 shown in FIG. 1, with block 355 of the example method 300 shown in FIG. 3, with block 555 of the example method 500 shown in FIG. 5, with block 755 of the example method 700 shown in FIG. 7, etc. Various example aspects of block 985 are presented at FIG. 10I.

As discussed herein, the example assemblies shown herein may be formed on a wafer or panel that includes a plurality of such assemblies (or modules). In such an example implementation, the wafer or panel may be singulated (or diced) to form individual assemblies (or modules). Example saw lines (or streets) 1086 are shown in the example implementation 1085 of FIG. 10I. In the example implementation shown in which the bulk carrier (or carrier material) was removed at block 984, such singulating (e.g., sawing, cutting, breaking, dicing, etc.) need only be performed on the metal pattern 1023 (or metal carrier) and/or encapsulating material 1026. Note that in another example implementation, the underfill material 1024 may also be cut.

Since the bulk carrier (or carrier material) was removed, in various example implementations, it may be reused. Additionally, such removal may enhance the efficiency of the singulating process at block 985.

In general, block 985 may comprise singulating. Accordingly, the scope of this disclosure should not be limited by any particular manner of singulating.

The example method 900 may, at block 987, comprise mounting (or attaching) to a substrate. Block 987 may, for example, share any or all characteristics with block 760 of the example method 700 shown in FIG. 7. Block 987 may, for example, share any or all characteristics with any of the mounting (or attaching) steps discussed herein (e.g., attaching interconnection structures, attaching die backsides, etc.). Various example aspects of block 987 are presented at FIG. 10J. Block 987 may, for example, comprise performing such attaching in any of a variety of manners, non-limiting examples of which are provided herein.

The substrate 1088 may comprise any of a variety of characteristics, non-limiting examples of which are provided herein. For example, the substrate 1088 may comprise a packaging substrate, an interposer, a mother board, printed wire board, etc. The substrate 1088 may, for example, comprise a coreless substrate, an organic substrate, a ceramic substrate, etc. The substrate 1088 may, for example, comprise one or more dielectric layers (e.g., organic and/or inorganic dielectric layers) and/or conductive layers formed on a semiconductor (e.g., silicon, etc.) substrate, a glass or metal substrate, a ceramic substrate, etc. The substrate 1088 may, for example, share any or all characteristics with the RD structures 646 (646*a* or 646*b*) of FIGS. 6B-1 and 6B-2, with the RD structures 698 (698*a* or 698*b*) of FIGS. 6A-2 and 6A-4, with the RD structures 298 of FIG. 2C, etc. The substrate 1088 may, for example, comprise an individual package substrate or may comprise a plurality of substrates coupled together (e.g., in a panel or wafer), which may be later singulated.

Figure 10J:
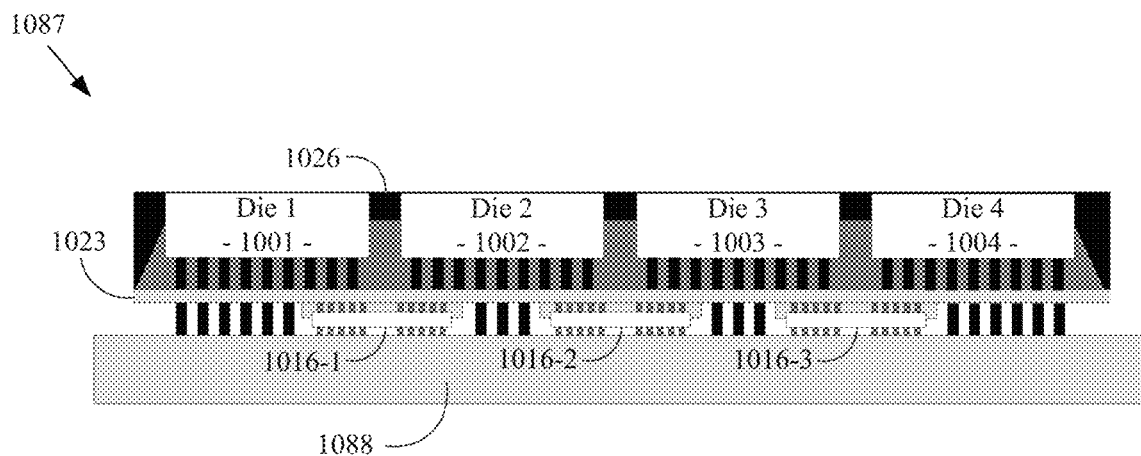

In the example implementation 1087 shown in FIG. 10J, block 987 may comprise soldering (e.g., utilizing mass reflow, thermal compression bonding, laser soldering, etc.) the interconnection structures (or bumps), which were formed on the metal pattern 1023 at block 962, to respective pads (e.g., bond pads, traces, lands, etc.) of the substrate 1088, and/or soldering the interconnection structures (or bumps) on the bottom side of the connect die (1016-1, 1016-2, and/or 1016-3) to respective pads (e.g., bond pads, traces, lands, etc.) of the substrate 1088.

In general, block 987 comprises mounting (or attaching) the assembly (or module) singulated at block 985 to a substrate. Accordingly, the scope of this disclosure should not be limited by characteristics of any particular type of mounting (or attaching) or of any particular mounting (or attachment) structure.

The example method 900 may, at block 989, comprise underfilling between the substrate and the assembly (or module) mounted thereto at block 987. Block 989 may, for example, share any or all characteristics with block 780 of the example method 700 shown in FIG. 7. Block 989 may also, for example, share any or all characteristics with block 920 (e.g., underfilling aspects thereof, for example as shown at FIG. 10A-2, etc.). Various examples of block 989 are presented at FIG. 10K.

Block 989 may comprise performing such underfilling in any of a variety of manners, non-limiting examples of which are provided herein. For example, block 989 may comprise performing a capillary or injected underfill process after the mounting performed at block 987. Also for example, in a scenario in which pre-applied underfill (PUF) is utilized, such PUF may be applied to the substrate, metal pattern, and/or interconnection structures thereof before such mounting. Block 989 may also comprise performing such underfilling utilizing a molded underfilling process.

Figure 10K:
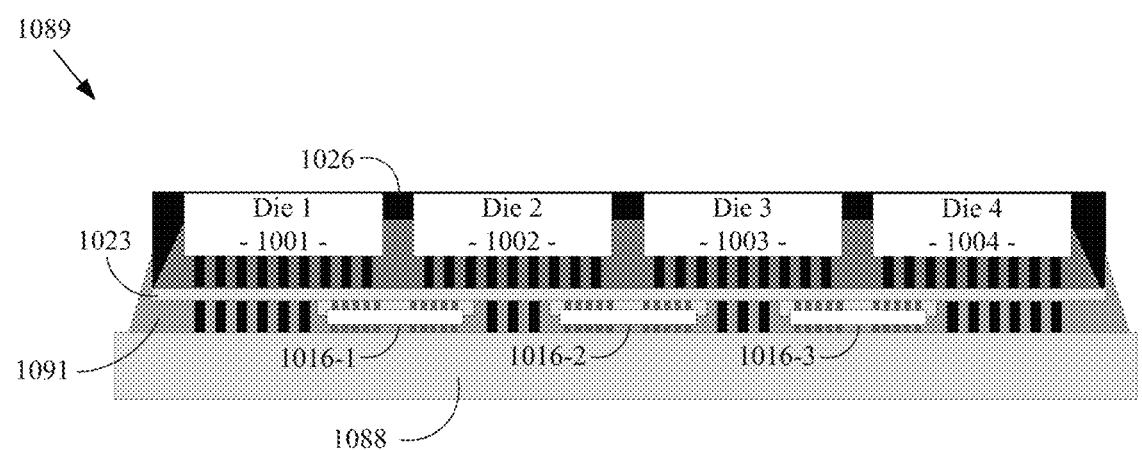

As shown in the example implementation 1089 of FIG. 10K, the underfill material 1091 (e.g., any underfill material discussed herein, etc.) may completely or partially cover the top side of the substrate 1088. The underfill material 1091 may also, for example, surround the interconnection structures between the metal pattern 1023 and the substrate 1088 and between the connect die 1016 and the substrate 1088. The underfill material 1091 may, for example, cover a bottom side of the metal pattern 1023, and bottom sides of the connect die 1016. The underfill material 1091 may also, for example, cover side surfaces of the connect die 1016 and/or exposed lateral surfaces of the underfill 1073 between the connect die 1016 and the metal pattern 1023. The underfill material 1091 may, for example, cover side surfaces of the metal pattern 1023, the underfill 1024, and/or the encapsulating material 1026.

In general, block 989 comprises underfilling. Accordingly, the scope of this disclosure should not be limited by characteristics of any particular type of underfilling or of any particular underfill material.

The example method 900 may, at block 990, comprise performing continued processing. Such continued processing may comprise any of a variety of characteristics. For example, block 990 may comprise returning execution flow of the example method 900 to any block thereof. Also for example, block 990 may comprise directing execution flow of the example method 900 to any other method block (or step) discussed herein (e.g., with regard to the example method 100 of FIG. 1, the example method 300 of FIG. 3, the example method 500 of FIG. 5, the example method 700 of FIG. 7, etc.).

In various examples discussed herein (e.g., with regard to the example method 500 of FIG. 5, etc.), an assembly may be attached to a redistribution (RD) structure, where the RD structure may be formed in a carrier prior to coupling various components to the RD structure. In any of such example implementations, the RD structure may instead be formed directly on the assembly instead of being formed on a carrier and then attached to the assembly. An example of such an implementation is shown at FIG. 11.

Figure 11:
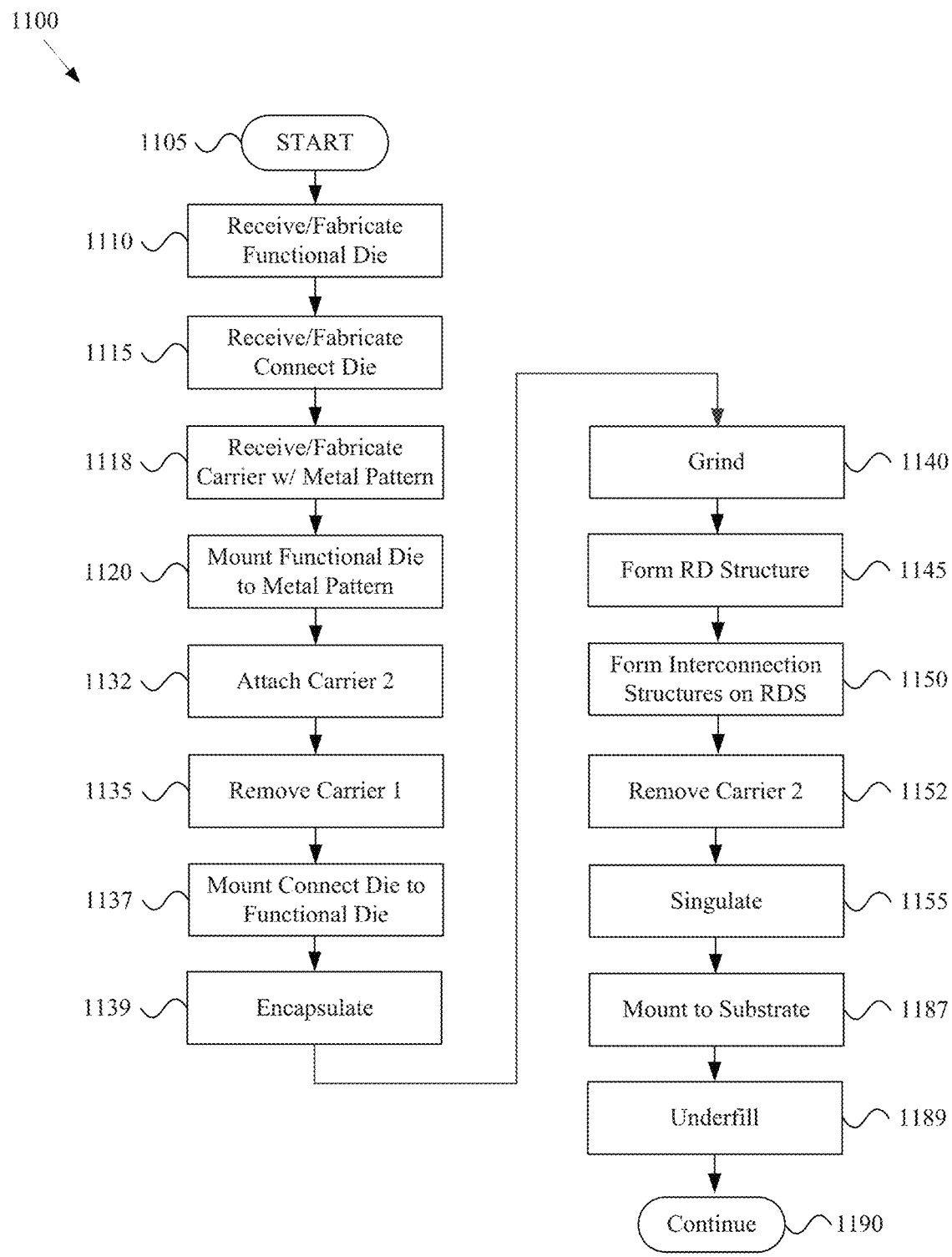
FIG. 11 shows a flow diagram of an example method of making an electronic device, in accordance with various aspects of the present disclosure.

FIG. 11 shows a flow diagram of an example method 1100 of making an electronic device (e.g., a semiconductor package, etc.), in accordance with various aspects of the present disclosure. The example method 1100 may, for example, share any or all characteristics with any other example method discussed herein (e.g., the example method 100 of FIG. 1, the example method 300 of FIG. 3, the example method 500 of FIG. 5, the example method 700 of FIG. 7, the example method 900 of FIG. 9, etc.). FIGS. 12A-12M show cross-sectional views illustrating an example electronic device (e.g., an electronic package, etc.) and an example method of making an example electronic device, in accordance with various aspects of the present disclosure. FIGS. 12A-12M may, for example, illustrate an example electronic device at various blocks (or steps) of the method 1100 of FIG. 11. FIGS. 11 and 12A-12M will now be discussed together. It should be noted that the order of the example blocks of the method 1100 may vary without departing from the scope of this disclosure.

The example method 1100 begins executing at block 1105. Block 1105 may, for example, share any or all characteristics with block 105 of the example method 100 shown in FIG. 1, with block 305 of the example method 300 shown in FIG. 3, with block 505 of the example method 500 shown in FIG. 5, with block 705 of the example method 700 shown in FIG. 7, with block 905 of the example method 900 shown in FIG. 9, etc.

The example method 900 may, at block 910, comprise receiving and/or fabricating a plurality of functional die. Block 910 may, for example, share any or all characteristics with block 110 of the example method 100 shown in FIG. 1, with block 310 of the example method 300 shown in FIG. 3, with block 510 of the example method 500 shown in FIG. 5, with block 710 of the example method 700 shown in FIG. 7, etc.

The example method 1100 may, at block 1115, comprise receiving and/or fabricating one or more connect die. Block 1115 may, for example, share any or all characteristics with block 115 of the example method 100 shown in FIG. 1, with block 315 of the example method 300 shown in FIG. 3, with block 515 of the example method 500 shown in FIG. 5, with block 715 of the example method 700 shown in FIG. 7, with block 915 of the example method 900 shown in FIG. 9, etc.

The example method 1100 may, at block 1118, comprise receiving and/or fabricating a carrier. Block 1118 may, for example, share any or all characteristics with block 718 of the example method 700 shown in FIG. 7. Block 1118 may also, for example, share any or all characteristics with block 120 of the example method 100 shown in FIG. 1, with block 518 of the example method 500 shown in FIG. 5, block 918 of the example method 900 shown in FIG. 9, etc. Various examples of block 1118 are presented at FIG. 12A and discussed herein.

The example carrier 1218 may, for example, share any or all characteristics with any carrier discussed herein (e.g., the example carrier 221 of FIG. 2D, the example carriers 621a and 621b of FIGS. 6B-1 and 6B-2, the example carrier 819 of FIG. 8B, etc.). For example, the carrier 1218 may be entirely formed of temporary (or dummy) material that is completely removed at a later process step. Also for example, the carrier 1218 may comprise a bulk carrier portion on which a metal pattern (or RD structure) is formed. Additionally for example, the carrier 1218 may comprise a bulk carrier portion on which a pattern is formed.

Figure 12A:
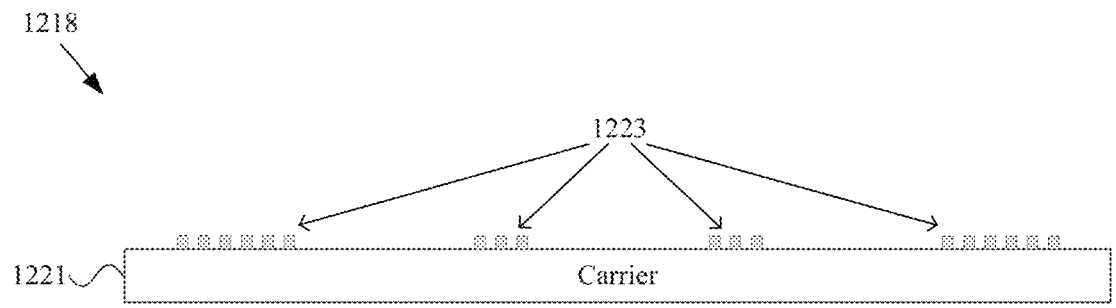
FIGS. 12A-12M show cross-sectional views illustrating an example electronic device and an example method of making an example electronic device, in accordance with various aspects of the present disclosure.
Figure 12B:
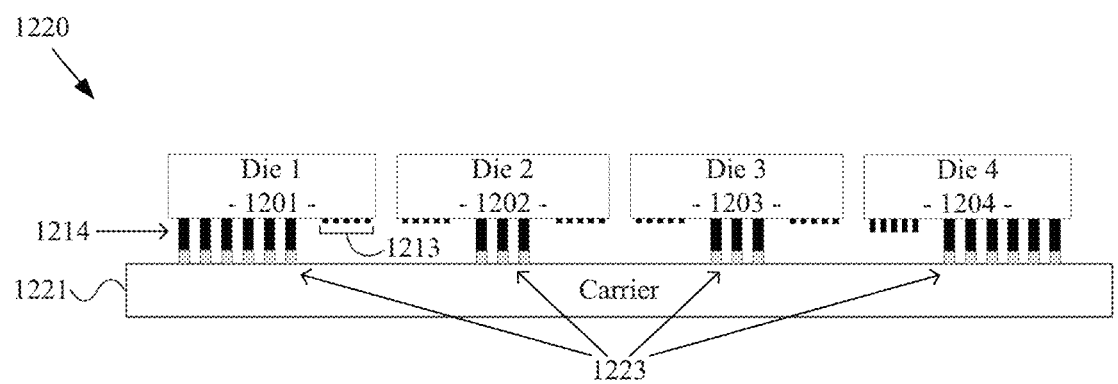

The example carrier 1218 of FIG. 12A, for example, is shown with a bulk carrier portion 1221 on which a metal pattern 1223 is formed (or positioned). The metal pattern 1223 may serve any of a variety of purposes. For example, as discussed herein (e.g., with regard to block 120, etc.), the metal pattern 1223 may comprise alignment features (e.g., fiducials, outlines, etc.) to assist with the accurate placement of die (e.g., connect die, functional die, etc.) thereon. Also for example, the metal pattern 1223 may comprise pads (or traces, or lands, or other interconnection structures, etc.) to which die (e.g., functional die, connect die, etc.) may be attached (at least temporarily). Also for example, the metal pattern 1223 may comprise a thickness that is stable (or strong or rigid) enough to serve as a work-piece carrier, even after the bulk carrier portion 1221 is removed. The metal pattern 1223 may also be referred to herein as a metal carrier. Additionally, for example, the metal pattern 1223 may comprise signal routing lines (e.g., a complete or partial RD structure) that remain with the final assembly after the bulk carrier portion 1221 is removed.

In general, block 1118 may comprise receiving and/or fabricating a carrier. Accordingly, the scope of this disclosure should not be limited by characteristics of any particular manner of making such a carrier or by any particular characteristics of such a carrier.

The example method 1100 may, at block 1120, comprise mounting functional die to the carrier (e.g., to a metal pattern thereof, to an RD structure thereof, etc.). Block 1120 may, for example, share any or all characteristics with block 920 of the example method 900 shown in FIG. 9. Block 1120 may also, for example, share any or all characteristics with block 525 of the example method 500 shown in FIG. 5 (e.g., attaching functional die to the carrier (and/or RD structure)), with block 125 of the example method 100 shown in FIG. 1 (e.g., attaching functional die to the carrier), etc. Various example aspects of block 1120 are presented at FIG. 12B.

The functional die 1201-1204 may, for example, be received as individual die. Also for example, the functional die 1201-1204 may be received on a single wafer (e.g., as shown at 210A, etc.), the functional die 1201-1204 may be received on multiple respective wafers (e.g., as shown at 210B and 210C, etc.), etc. In a scenario in which one or both of the functional die are received in wafer form, the functional die may be singulated from the wafer. Note that if any of the functional die 1201-1204 are received on a single MPW (e.g., as shown at 210A, etc.), such functional die may be singulated from the wafer as an attached set (e.g., connected with silicon).

The functional die 1201-1204 may be attached to the metal pattern 1223 (which may, for example, share any or all characteristics with the metal pattern 1023 of FIG. 10A-1, the metal pattern 823 of FIG. 8B, any metal pattern or RD structure discussed herein, etc.). In the example implementation 1220 shown at FIG. 12B, the functional die 1201-1204 are attached to respective pads (e.g., pads, lands, traces, pillars, posts, bumps, interconnection structures, etc.) of the metal pattern 1223. As discussed herein, the metal pattern 1223 may comprise a single metal layer, a multi-layer signal distribution structure comprising a plurality of dielectric and conductive layers, pads or other interconnection structures, etc.

For example, second die interconnection structures 1214 of the first functional die 1201 (and of the other functional die 1202-1204) may be mechanically and electrically connected to respective interconnection structures (e.g., pads, traces, lands, bumps, posts, pillars, etc.) of the metal pattern 1223.

Such interconnection structures may be connected in any of a variety of manners. For example, the connection may be performed by soldering. In an example implementation, the second die interconnection structures 1214 and/or corresponding interconnection structures of the metal pattern 1223 may comprise solder caps (or bumps or balls or other solder structures) that may be reflowed to perform the connection. Such solder caps may, for example, be reflowed by mass reflow, thermal compression bonding (TCB), etc. In another example implementation, the connection may be performed by direct metal-to-metal (e.g., copper-to-copper, etc.) bonding, instead of utilizing solder. Examples of such connections are provided in U.S. patent application Ser. No. 14/963,037, filed on Dec. 8, 2015, and titled "Transient Interface Gradient Bonding for Metal Bonds," and U.S. patent application Ser. No. 14/989,455, filed on Jan. 6, 2016, and titled "Semiconductor Product with Interlocking Metal-to-Metal Bonds and Method for Manufacturing Thereof," the entire content of each of which is hereby incorporated herein by reference. Any of a variety of techniques may be utilized to attach the second die interconnection structures 1214 to the metal pattern 1223 (e.g., mass reflow, thermal-compression bonding (TCB), direct metal-to-metal intermetallic bonding, conductive adhesive, etc.).

As discussed herein, underfill may be applied between the functional die 1201-1204 and the metal pattern 1223 and/or carrier 1221. In a scenario in which pre-applied underfill (PUF) is utilized, such PUF may be applied to the metal pattern and/or functional die before the attachment of the first die interconnection structures to the metal pattern. Also for example, the underfill may be formed after such attachment (e.g., a capillary underfill, a molded underfill, etc.). In the example implementation 1220 of FIG. 12B, such underfill may, for example, surround the second interconnection structures 1214 and cover adjacent portions of the bottom side of the functional die 1201-1204, while leaving the first interconnection structures 1213 exposed (e.g., for later connection to connect die, etc.).

It should be noted that although the illustrations herein generally present the functional die 1201-1204 (and interconnection structures thereof) as being similarly sized and shaped, such symmetry is not required. For example, the functional die 1201-1204 may be of different respective shapes and sizes, may have different respective types and/or numbers of interconnection structures, etc.

It should additionally be noted that although the discussion herein of FIGS. 11 and 12A-12M generally focuses on four functional die coupled to a single metal pattern (or carrier), the scope of this disclosure is not limited thereto. For example, any number of functional die (e.g., two die, three die, five die, etc.) may be coupled to a single metal pattern (or carrier). Also for example, any number of metal patterns (and die attached thereto) may be utilized in a single module or package.

In general, block 1120 may comprise attaching the functional die to the carrier (e.g., to a metal pattern thereof, to an RD structure thereof, etc.). Accordingly, the scope of this disclosure should not be limited by characteristics of any particular manner of such attaching or by any particular characteristics of such functional die, carrier, metal pattern, attachment or interconnection structures, etc.

The example method 1100 may, at block 1132, comprise attaching a second carrier. Block 1132 may, for example, share any or all characteristics with any carrier attaching discussed herein (e.g., with regard to block 932 of the example method 900 of FIG. 9, with regard to block 120 of the example method 100 shown in FIG. 1, with regard to block 520 of the example method 500 shown in FIG. 1, with regard to block 720 of the example method 700 shown in FIG. 7, etc.). Various example aspects of block 1132 are shown at FIG. 12C.

Figure 12C:
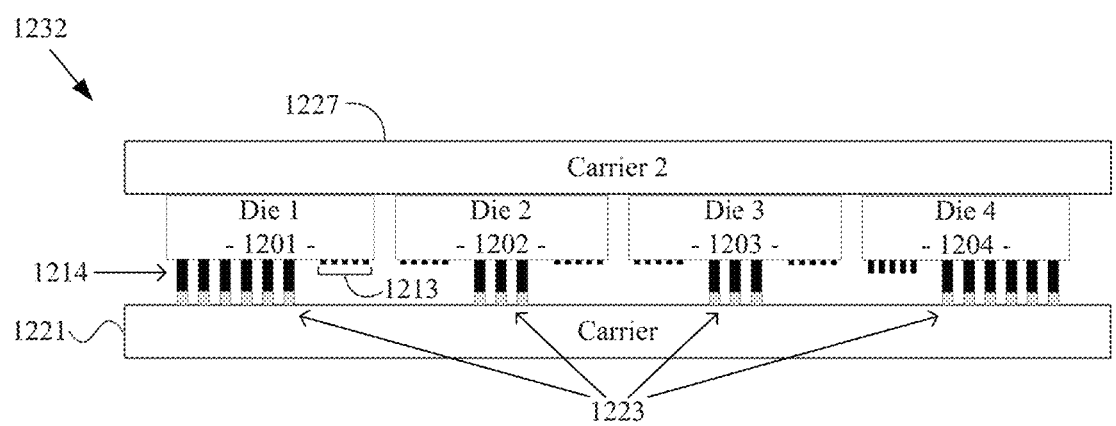

As shown in the example implementation 1232 of FIG. 12C, the second carrier 1227 may be attached to the top sides of the functional die 1201-1204. Note that the assembly may be still in a wafer (or panel) form at this point. The carrier 1231 may comprise any of a variety of characteristics. For example, the carrier 1231 may comprise a glass carrier, silicon (or semiconductor) carrier, metal carrier, etc. The carrier 1231 may, for example, comprise a compliant surface (or compliant coupling layer for example an adhesive layer), for example to accommodate differences in functional component height. Block 1132 may comprise attaching the carrier 1231 in any of a variety of manners. For example, block 1132 may comprise attaching the carrier 1231 using an adhesive, using a mechanical attachment mechanism, using vacuum attachment, etc.

In general, block 1132 may comprise attaching a second carrier. Accordingly, the scope of this disclosure should not be limited by characteristics of any particular manner of attaching a carrier or by characteristics of any particular type of carrier.

The example method 1100 may, at block 1135, comprise removing the first carrier. Block 1135 may, for example, share any or all characteristics with block 935 of the example method 900 shown in FIG. 9 and/or with block 735 of the example method 700 shown in FIG. 7. Block 1135 may also, for example, share any or all characteristics with any carrier-removal process discussed herein (e.g., with regard to block 135 of the example method 100 shown in FIG. 1, with regard to block 535 of the example method 500 shown in FIG. 5, etc.). Various example aspects of block 1135 are shown at FIG. 12D.

Figure 12D:
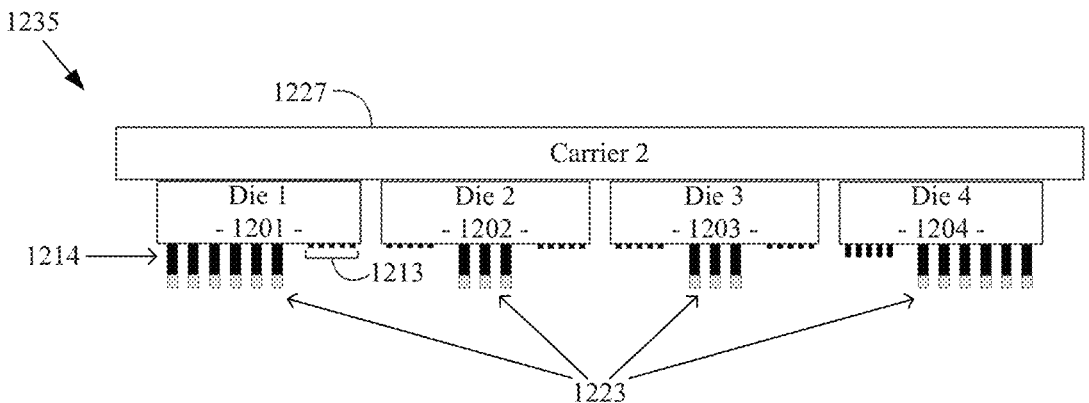

For example, the example implementation 1235 of FIG. 12D shows the first carrier 1221 (or bulk carrier material) removed (e.g., in comparison with the example implementation 1232 of FIG. 12C). Block 1135 may comprise performing such carrier removal in any of a variety of manners (e.g., grinding, etching, chemical-mechanical planarization, peeling, shearing, thermal or laser releasing, etc.). Note that, although not required, the metal pattern 1223 (or portions thereof) attached to the second interconnection structures 1214 may still remain. Such remaining metal pattern 1223 may, for example, be removed later or may be incorporated into a final package.

In general, block 1135 may comprise removing the first carrier. Accordingly, the scope of this disclosure should not be limited by characteristics of any particular manner of removing a carrier or by characteristics of any particular type of carrier.

The example method 1100 may, at block 1137, comprise mounting (or attaching) connect die to the functional die. Block 1137 may, for example, share any or all characteristics with block 725 of the example method 700 shown in FIG. 3, with block 320 of the example method 300 shown in FIG. 3, etc. Block 1137 may also, for example, share any or all characteristics with block 125 (e.g., with regard to the attachment between the connect die and the functional die) of the example method 100 shown in FIG. 1, with block 525 (e.g., with regard to the attachment between the connect die and the functional die), etc. Various example aspects of block 1137 are presented at FIG. 12E.

Figure 12E:
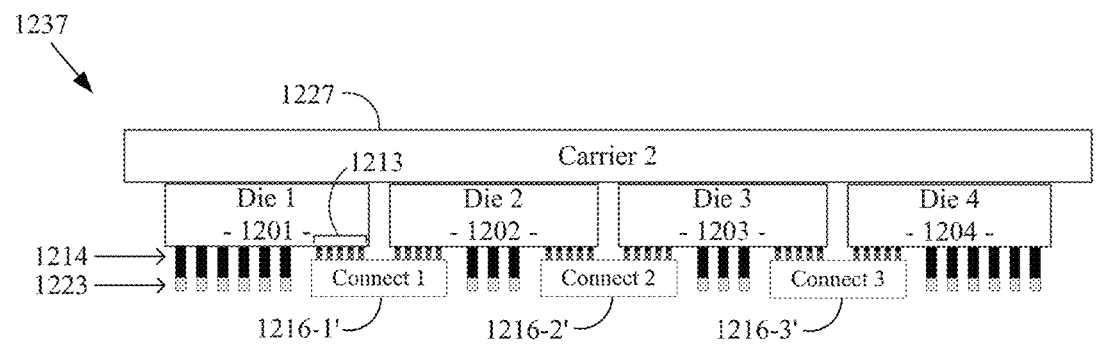

For example, in the example implementation 1237 shown at FIG. 12E, the first die interconnection structures 1213 of the first functional die 1201 and of the second functional die 1202 may be mechanically and electrically connected to respective connect die interconnection structures of a first connect die 1216-1'. The first die interconnection structures 1213 of the first functional die 1201 (e.g., at the right side of the first functional die 1201) may be connected to a left portion of such connect die interconnection structures, and the first die interconnection structures 1213 of the second functional die 1202 (e.g., at the left side of the second functional die 1202) may be connected to a right portion of such connect die interconnection structures.

Such interconnection structures may be connected in any of a variety of manners, non-limiting examples of which are provided herein, for example with regard to the first die interconnection structures 213 and connect die interconnection structures 217 as discussed with regard to FIGS. 1 and 2 (e.g., FIG. 2E). Such interconnection structures may, for example, be coupled utilizing any of the variety of attachment techniques discussed herein.

After the connection of the first die interconnection structures 1213 of the first functional die 1201 and of the second functional die 1202 to the first connect die 1216-1', the first connect die 1216-1' provides electrical connectivity between the first die interconnection structures 1213 of the first functional die 1201 and respective first die interconnection structures 1213 of the second functional die 1202.

As discussed herein, electrical connectivity between the first die interconnection structures 1213 and the back side of the connect die 1216-1 may or may not be provided. For example, although the example first connect die 1216-1 is illustrated as a single-sided connect die (e.g., with no electrical interconnection structures on the back side), as shown in other example implementations herein, any of the connect die 1216 may be two-sided (e.g., providing electrically connectivity between interconnection structures on a first side of the connect die 1216 and interconnection structures on a second side of the connect die 1216).

As with the first connect die 1216-1' electrically connecting the first functional die 1201 and second functional die 1202, a second connect die 1216-2' may similarly provide a connection between the second functional die 1202 and the third functional die 1203, and a third connect die 1216-3' may similarly provide a connection between the third functional die 1203 and the fourth functional die 1204.

After (or before or while) attaching the connect die to the functional die at block 1137, an underfill may be formed between the connect die and the functional die and/or between adjacent ones of the functional die. Such underfill may comprise any of a variety of characteristics. For example, the underfill may comprise a capillary underfill material, a pre-applied underfill material, a molded underfill material, etc. Such underfilling may be performed in any of a variety of manners, non-limiting examples of which are provided herein. For example, such underfilling may be performed utilizing one or more of a capillary underfill, a pre-applied underfill, an injected underfill, any combination thereof, etc. For example, in an example implementation, a first type of underfill (e.g., a pre-applied underfill, for example a non-conductive paste, etc.) may be utilized to fill between the functional die, and a capillary underfill may be utilized to fill between the functional die and the connect die. Example implementations 827a and 827b of such underfilling are provided at FIGS. 8E-1 and 8E-2. As shown in the example implementations 827a and 827b, the underfill material 828 may be formed between the connect die 816 and the functional die 801-804 and/or between any or all adjacent pairs of the functional die 801-804. Any or all aspects of such underfilling may, for example, be performed at block 1137.

In general, block 1137 may comprise mounting (or attaching) connect die to functional die. Accordingly, the scope of this disclosure should not be limited by characteristics of any particular manner of performing such attaching or of any particular type of attachment structure.

The example method 1100 may, at block 1139, comprise encapsulating. Various example aspects of block 1139 are presented at FIG. 12F. Block 1139 may, for example, share any or all characteristics with block 330 of the example method 300 shown in FIG. 3. Block 1139 may, for example, share any or all characteristics with any of the encapsulating and/or underfilling discussed herein (e.g., with regard to block 130 of the example method 100 shown in FIG. 1, with regard to block 530 of the example method 500 shown in FIG. 5, with regard to block 780 of the example method 700 shown in FIG. 7, with regard to block 989 of the example method 900 shown in FIG. 9, with regard to any of the underfilling discussed with regard to the mounting (or attaching) steps discussed herein, etc.).

Figure 12F:
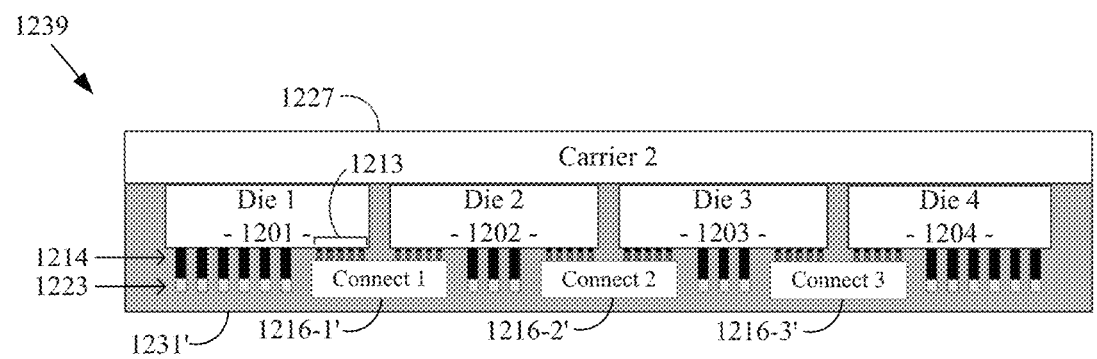
Figure 12G:
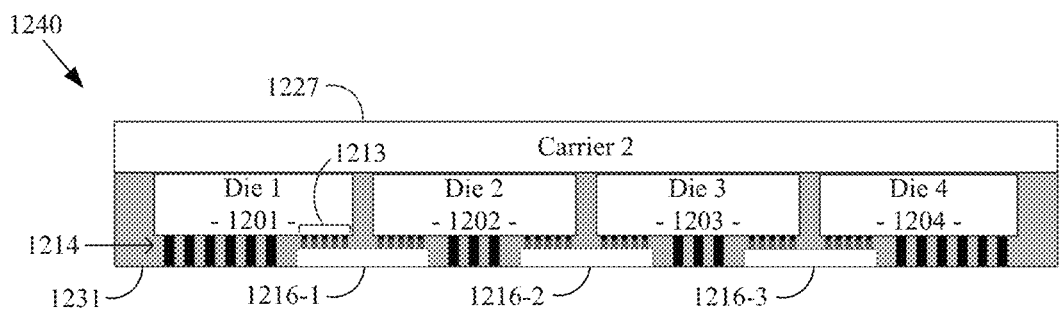
Figure 12H:
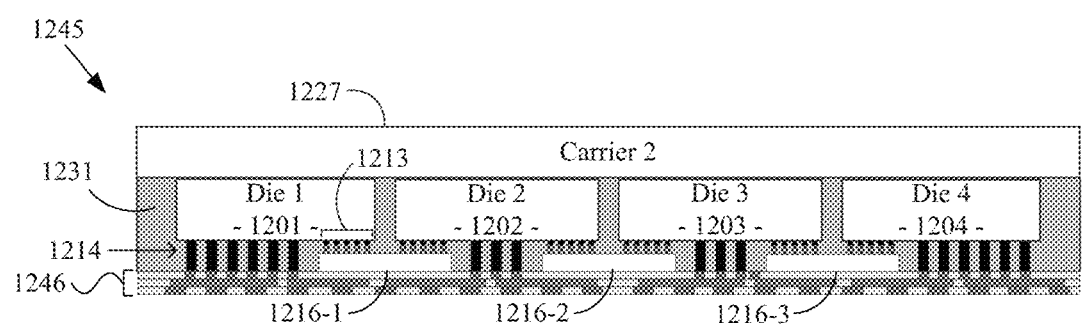
Figure 12I:
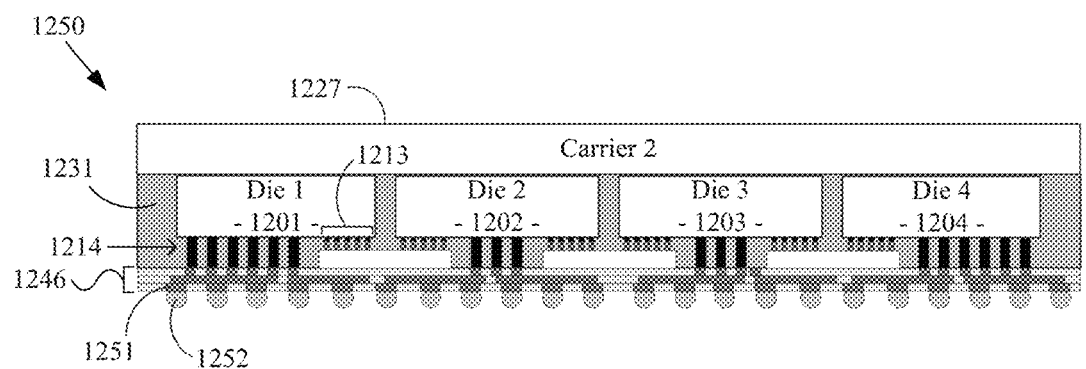

As shown in FIG. 12F, an encapsulant 1231' (or encapsulating material) is formed that covers various portions of the functional die 1201-1204, the connect die 1216', and portions of the second carrier 1227 between the functional die 1201-1204, second interconnection structures 1214 protruding from the functional die 1201-1204 and metal pattern 1223 attached thereto (if present), first interconnection structures 1213 and other interconnection structures between the functional die 1201-1204 and the connect die 1216', etc. The encapsulant 1231' may comprise epoxy molding compound or any of a variety of materials. For example, the encapsulant 1231' may comprise a polymer, polymer composite material (such as epoxy resin with filler, epoxy acrylate with filler, or polymer with filler), etc.

The encapsulant 1231' may be formed in any of a variety of manners. For example, block 1139 may comprise transfer molding the encapsulant 1231'. Also for example, block 1139 may comprise compression molding the encapsulant 1231'. In an example implementation in which underfill has been formed between at least the functional die 1201-1204 and the connect die 1216', compression molding or transfer molding may be utilized to cover portions of such underfill with encapsulating material 1231'

As shown in the example 430 illustrated in FIG. 12F, the encapsulant 1231' may also, for example, cover side and back surfaces of the connect die 1216'. The encapsulant 1231' may also, for example, front (or active) surfaces of the functional die 1201-1204. Note that although the encapsulant 1231' is shown covering top (or back) sides of the connect die 1216', the top sides of the connect die 1216' may be exposed from the encapsulant 1231'. For example, in an example implementation, the top surface of the encapsulant 1231' may be coplanar with the top surface of the connect die 1216. Such coplanarity may, for example, be formed during the original encapsulant forming or may be formed by subsequent thinning or planarizing (e.g., as will be discussed herein at block 1140).

Note that in an example implementation, the underfill 1231' may surround the first die interconnection structures 1213 and the corresponding connect die interconnection structures (and/or underfill if present), and the encapsulant 1231' may surround the second die interconnection structures 1214 (and underfill if present). For example, the encapsulant 1231' might not have the physical properties (e.g., filler diameter, etc.) to effectively underfill between the functional die 1201-1204 and the connect die 1216', and/or the process utilized to form the encapsulant 1231' might not have the capabilities to effectively perform such underfilling. In such cases, both underfill and encapsulant may be formed.

In general, block 1139 may comprise encapsulating the die. Accordingly, the scope of this disclosure should not be limited by characteristics of any particular manner of performing such encapsulating and/or underfilling or by any particular characteristics of such encapsulant and/or underfill.

The example method 1100 may, at block 1140, comprise grinding. For example, block 1140 may comprise the encapsulant, metal layer, die interconnection structures, and/or connect die. Various example aspects of block 1140 are presented at FIG. 12G. Block 1140 may, for example, share any or all characteristics with block 340 of the example method 300 of FIG. 3. Block 1140 may, for example, share any or all characteristics with any or all grinding or planarizing steps discussed herein (e.g., with regard to 140 of the example method 100 shown in FIG. 1, etc.).

Though grinding is generally presented as an example, block 1140 may, for example, comprise performing thinning (or planarizing) in any of a variety of manners (e.g., mechanically, mechanically/chemically (CMP), etching, etc.).

Block 1140 may, for example, comprise performing such grinding to expose ends of the second die interconnection structures 1214 of the functional die 1201-1204, to remove remaining portions of the metal pattern 1223, etc. Also for example, block 1140 may comprise grinding the connect die 1216' and encapsulant 1231' to their desired thicknesses. Also for example, block 1140 may comprise grinding the second die interconnection structures 1214 to planarize the end surfaces thereof for subsequent processing steps.

Block 1140 may also comprise grinding (or thinning) the encapsulant 1231', resulting in the encapsulant 1231, and grinding (or thinning) the connect die 1216', resulting in the connect die 1216. For example, even if thinned to some extent, the thickness of the connect die 1216' may have been left large enough to ensure safe handling of the connect die 1216' and bonding of the connect die 1216' to the functional die 1201-1204. Now that the connect die 1216' is additionally protected by the encapsulant 1231' and the attachment to the functional die and/or by underfill if present, back side material from the connect die 1216' may be removed. Note that in an example implementation utilizing a one-sided connect die, at least some bulk support material (e.g., silicon) may be left for continued structural support of the thin connect die 1216.

In the example presented, block 1140 results in the end surfaces of the second die interconnection structures 1214, the back side of the thin connect die 1216, and the grinded surface of the encapsulant 1231 being coplanar.

In general, block 1140 may comprise grinding (or thinning or planarizing), for example the encapsulant, die interconnection structures, and/or connect die. Accordingly, the scope of this disclosure should not be limited by characteristics of any particular manner of performing such grinding (or thinning or planarizing), nor by any particular characteristics of the grinded (or thinned or planarized) components.

The example method 1100 may, at block 1145, comprise forming a redistribution structure (RDS or RD structure). Various example aspects of block 1145 are presented at FIG. 12H. Block 1145 may, for example, share any or all characteristics with block 145 of the example method 100 shown in FIG. 1. For example, the redistribution structure 1246 (e.g., dielectric layer(s) and/or conductive layer(s), etc.) and/or the formation thereof may share any or all characteristics with the redistribution structure 246 (e.g., dielectric layer(s) 247 and/or conductive layer(s) 248, etc.) and/or the formation thereof. Also for example, block 1245 may share any or all characteristics with block 345 of the example method 300 shown in FIG. 3, block 518 of the example method 500 shown in FIG. 5, etc. Block 1145 may, for example, share any or all characteristics with any example process step herein for forming redistribution structures (or signal distribution structures).

The example method 1100 may, at block 1150, comprise forming interconnection structures on the redistribution structure. Various example aspects of block 1150 are presented at FIG. 12I. Block 1150 may, for example, share any or all characteristics with block 150 of the example method 100 shown in FIG. 1 and discussed herein. For example, the pad(s) 1251 and interconnection structure(s) 1252 and/or the formation thereof may share any or all characteristics with the pad(s) 1251 and interconnection structure(s) 1252 and/or the formation thereof. Block 1150 may, for example, share any or all characteristics with any example process step herein for forming interconnection structures.

Figure 12J:
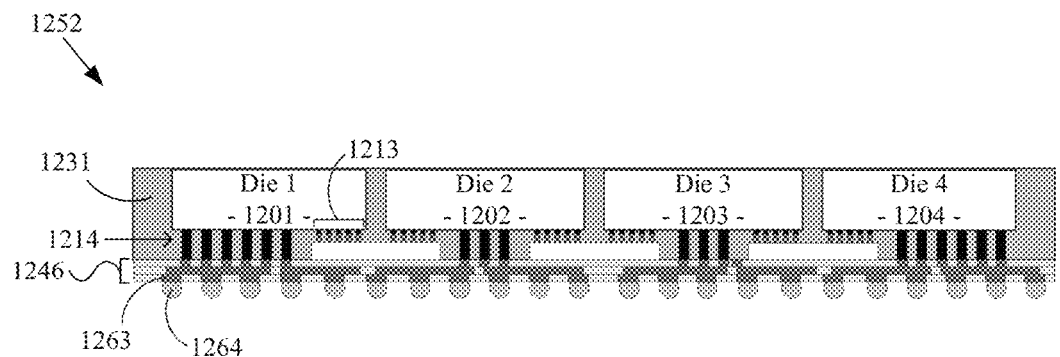
Figure 12K:
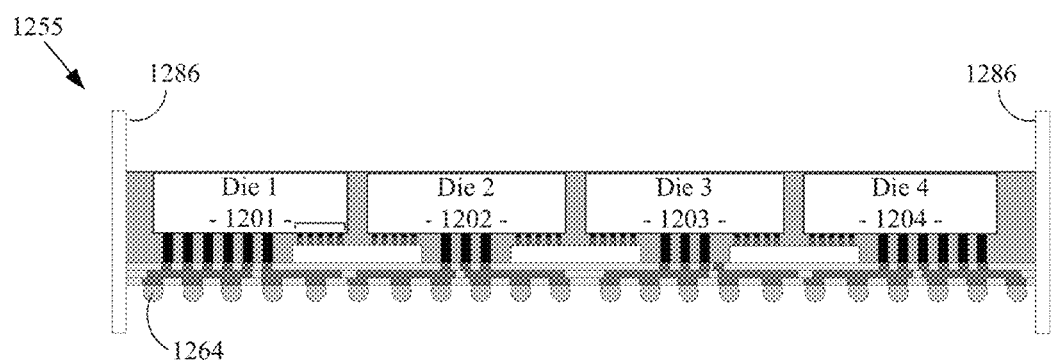

The example method 1100 may, at block 1152, comprise removing the second carrier (e.g., the second carrier attached at block 1132. Block 1152 may, for example, share any or all characteristics with any carrier removal step discussed herein. For example, block 1152 may share any or all characteristics with block 135 of the example method 100 of FIG. 1. Also for example, block 1152 may share any or all characteristics with block 535 of the example method 500 shown in FIG. 5, with blocks 735 and/or 770 of the example method 700 shown in FIG. 7, with block 984 of the example method 900 shown in FIG. 9, etc. Various example aspects of block 1152 are shown in FIG. 12J.

Block 1152 may, for example, comprise removing the second carrier in any of a variety of manners, non-limiting examples of which are discussed herein (e.g., grinding, chemical-mechanical planarizing, etching, peeling, sheering, applying heat or laser light or other forms of energy to release adhesives, etc.). For example, the example implementation 1252 shown in FIG. 12J does not include the second carrier 1227 of the example implementation 1250 shown in FIG. 12I.

In general, block 1152 may comprise removing the second carrier. Accordingly, the scope of this disclosure should not be limited by characteristics of any particular manner of performing such carrier removing or by characteristics of any particular type of carrier or carrier material being removed.

The example method 1100 may, at block 1155, comprise singulating the assemblies (or modules or packages or portions thereof). Various example aspects of block 1155 are presented at FIG. 12K. Block 1155 may, for example, share any or all characteristics with block 155 of the example method 100 shown in FIG. 1 and discussed herein. For example, cut lines 1286 (or singulation streets) and/or the singulating along such cut lines 1286 may share any or all characteristics with the cut lines 256 (or singulation streets) and/or the singulating along such cut lines 256. Block 1155 may, for example, share any or all characteristics with any or all singulating examples provided herein.

In general, block 1155 may comprise singulating. Accordingly, the scope of this disclosure should not be limited by characteristics of any particular manner of performing such singulating or by characteristics of any particular type of singulated component.

The example method 1100 may, at block 1187, comprise mounting (or attaching) to a substrate. Block 1187 may, for example, share any or all characteristics with block 987 of the example method 900 shown in FIG. 9, block 760 of the example method 700 shown in FIG. 7, etc. Block 1187 may, for example, share any or all characteristics with any of the mounting (or attaching) steps discussed herein (e.g., attaching interconnection structures, attaching die backsides, etc.). Various example aspects of block 1187 are presented at FIG. 12L. Block 1187 may, for example, comprise performing such attaching in any of a variety of manners, non-limiting examples of which are provided herein.

The substrate 1288 may comprise any of a variety of characteristics, non-limiting examples of which are provided herein. For example, the substrate 1288 may comprise a packaging substrate, an interposer, a mother board, printed wire board, etc. The substrate 1288 may, for example, comprise a coreless substrate, an organic substrate, a ceramic substrate, etc. The substrate 1288 may, for example, comprise one or more dielectric layers (e.g., organic and/or inorganic dielectric layers) and/or conductive layers formed on a semiconductor (e.g., silicon, etc.) substrate, a glass or metal substrate, a ceramic substrate, etc. The substrate 1288 may, for example, share any or all characteristics with the RD structures 646 (646a or 646b) of FIGS. 6B-1 and 6B-2, with the RD structures 698 (698a or 698b) of FIGS. 6A-2 and 6A-4, with the RD structures 298 of FIG. 2C, etc. The substrate 1288 may, for example, comprise an individual package substrate or may comprise a plurality of substrates coupled together (e.g., in a panel or wafer), which may be later singulated.

Figure 12L:
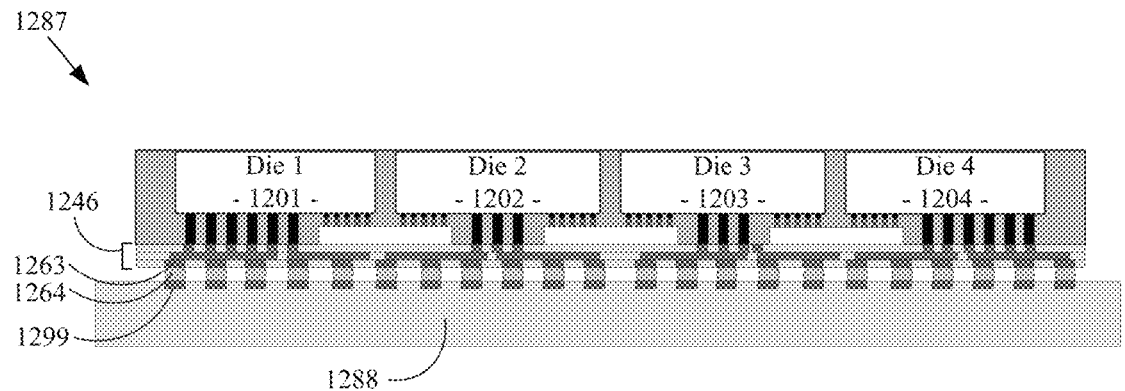

In the example implementation 1287 shown in FIG. 12L, block 1287 may comprise soldering (e.g., utilizing mass reflow, thermal compression bonding, laser soldering, etc.) the interconnection structures 1264 (or bumps), which were formed on the RD structure 1246 at block 1150, to respective interconnection structures 1264 (e.g., pads, traces, lands, posts, pillars, etc.) of the substrate 1288.

In general, block 1187 comprises mounting (or attaching) the assembly (or module) singulated at block 1155 to a substrate. Accordingly, the scope of this disclosure should not be limited by characteristics of any particular type of mounting (or attaching) or of any particular mounting (or attachment) structure.

The example method 1100 may, at block 1189, comprise underfilling between the substrate and the assembly (or module) mounted thereto at block 1187. Block 1189 may, for example, share any or all characteristics with block 989 of the example method 900 shown in FIG. 9 and/or with block 780 of the example method 700 shown in FIG. 7. Block 1189 may also, for example, share any or all characteristics with any underfilling process step discussed herein.

Block 1189 may comprise performing such underfilling in any of a variety of manners, non-limiting examples of which are provided herein. For example, block 1189 may comprise performing a capillary or injected underfill process after the mounting performed at block 1187. Also for example, in a scenario in which pre-applied underfill (PUF) is utilized, such PUF may be applied to the substrate, metal pattern, and/or interconnection structures thereof before such mounting. Block 1189 may also comprise performing such underfilling utilizing a molded underfilling process.

Figure 12M:
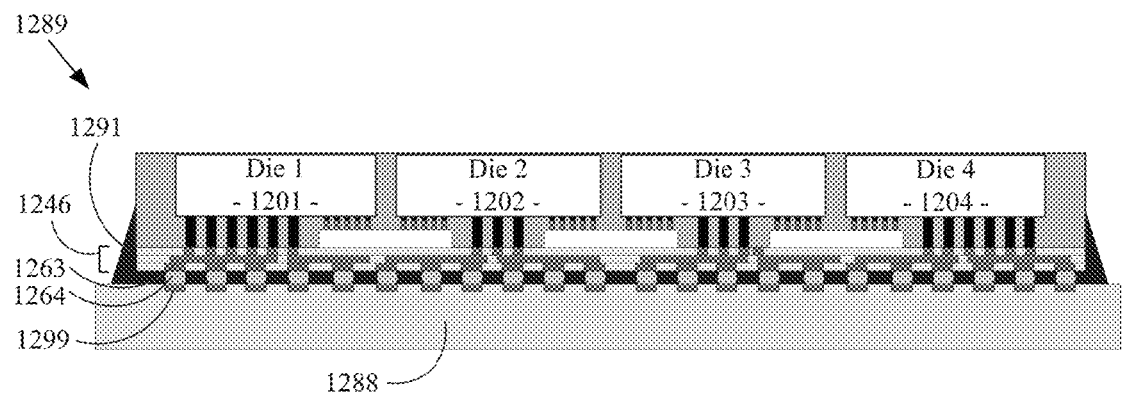

As shown in the example implementation 1289 of FIG. 12M, the underfill material 1291 (e.g., any underfill material discussed herein, etc.) may completely or partially cover the top side of the substrate 1288. The underfill material 1291 may also, for example, surround the interconnection structures 1264 between the RD structure 1246 and the substrate 1288. The underfill material 1291 may, for example, cover a bottom side of the RD structure 1246. The underfill material 1291 may also, for example, cover side surfaces of the RD structure 1246 and/or encapsulating material (e.g., as formed at block 1139).

In general, block 1189 comprises underfilling. Accordingly, the scope of this disclosure should not be limited by characteristics of any particular type of underfilling or of any particular underfill material.

The example method 1100 may, at block 1190, comprise performing continued processing. Such continued processing may comprise any of a variety of characteristics. For example, block 1190 may comprise returning execution flow of the example method 1100 to any block thereof. Also for example, block 1190 may comprise directing execution flow of the example method 1100 to any other method block (or step) discussed herein (e.g., with regard to the example method 100 of FIG. 1, the example method 300 of FIG. 3, the example method 500 of FIG. 5, the example method 700 of FIG. 7, the example method 900 of FIG. 9, etc.).

As discussed herein, the functional die and the connect die may be mounted to a substrate, for example in a multi-chip module configuration. Non-limiting examples of such configurations are shown in FIGS. 13 and 14.

Figure 13:
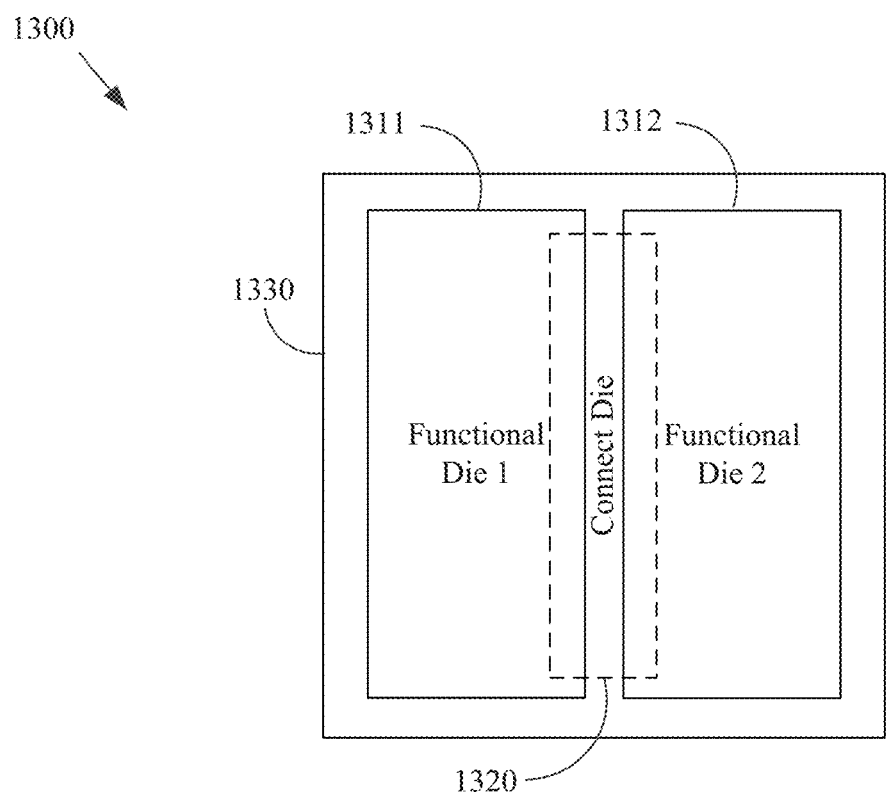
FIG. 13 shows a top view of an example electronic device, in accordance with various aspects of the present disclosure.

FIG. 13 shows a top view of an example electronic device 1300, in accordance with various aspects of the present disclosure. The example electronic device 1300 may, for example, share any or all characteristics with any or all electronic devices discussed herein. For example, the functional die (1311 and 1312), connect die 1320, and the substrate 1330 may respectively share any or all characteristics with any or all functional die, connect die, and/or substrates discussed herein.

Figure 14:
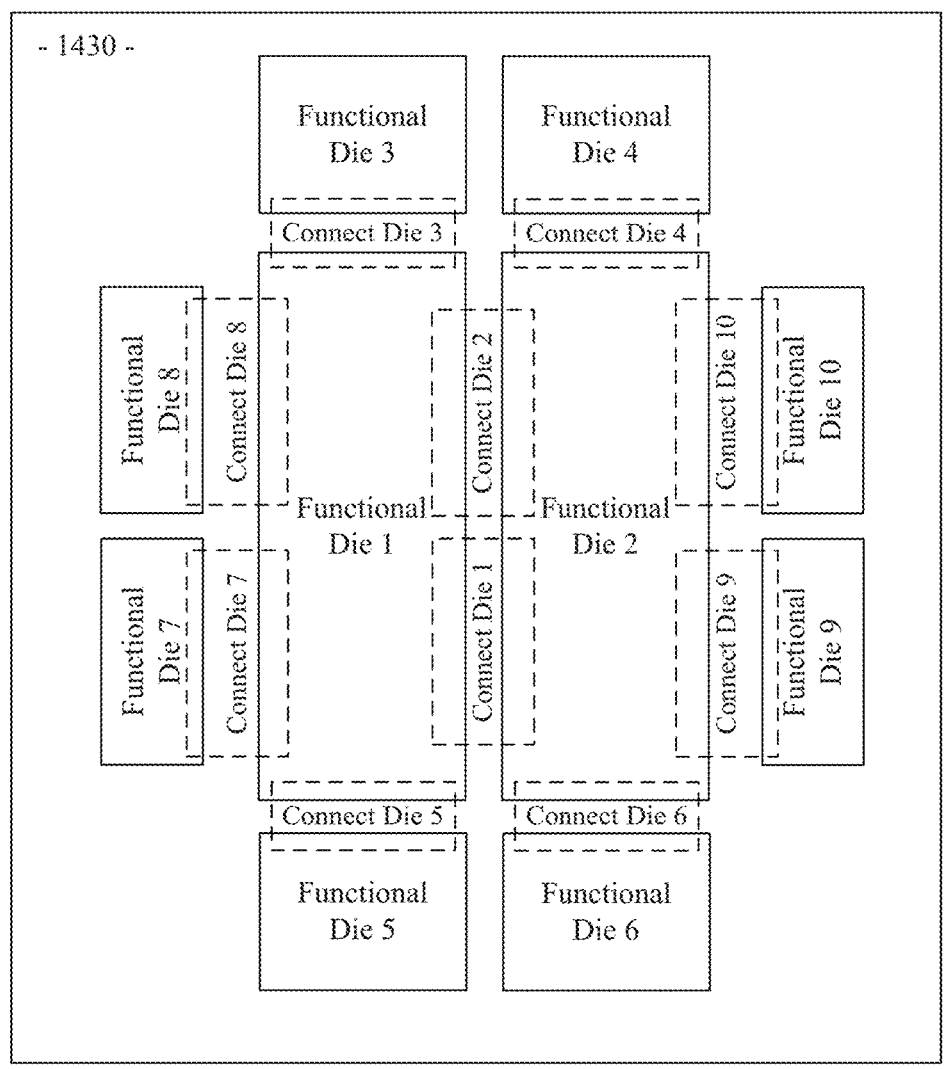
FIG. 14 shows a top view of an example electronic device, in accordance with various aspects of the present disclosure.

FIG. 14 shows a top view of an example electronic device, in accordance with various aspects of the present disclosure. The example electronic device 1400 may, for example, share any or all characteristics with any or all electronic devices discussed herein. For example, the functional die (Functional Die 1 to Functional Die 10), the connect die (Connect die 1 to Connect die 10), and the substrate 1430 may share any or all characteristics with any or all functional die, connect die, and/or substrates discussed herein.

The discussion herein included numerous illustrative figures that showed various portions of semiconductor device assemblies (or packages) and/or methods of manufacturing thereof. For illustrative clarity, such figures did not show all aspects of each example assemblies. Any of the example assemblies presented herein may share any or all characteristics with any or all other assemblies presented herein.

In summary, various aspects of this disclosure provide a semiconductor package structure and a method for making a semiconductor package. As non-limiting examples, various aspects of this disclosure provide various semiconductor package structures, and methods for making thereof, that comprise a connect die that routes electrical signals between a plurality of other semiconductor die. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a redistribution structure comprising at least one dielectric layer, a first conductor, and a second conductor;
   a connect die comprising:
      a top side comprising a first connect die interconnection structure and a second connect die interconnection structure electrically coupled to the first connect die interconnection structure; and
      a non-conductive bottom side coupled to a top side of the redistribution structure;
   a first semiconductor die comprising:
      a first die interconnection structure connected to the first connect die interconnection structure; and
      a second die interconnection structure connected to the first conductor of the redistribution structure; and
   a second semiconductor die comprising:
      a third die interconnection structure connected to the second connect die interconnection structure; and
      a fourth die interconnection structure connected to the second conductor of the redistribution structure.

2. The electronic device of claim 1, wherein:
the first die interconnection structure comprises a first metal structure; and
the second die interconnection structure comprises a second metal pillar that is taller than the first metal structure.

3. The electronic device of claim 2, wherein the second metal pillar is taller than the first metal structure by at least a thickness of the connect die.

4. The electronic device of claim 1, wherein:
the first die interconnection structure comprises a first metal pillar; and
the second die interconnection structure comprises a second metal pillar that is at least two times wider than the first metal pillar.

5. The electronic device of claim 1, wherein the second die interconnection structure comprises a metal pillar with an end surface that is coplanar with the bottom side of the connect die.

6. The electronic device of claim 1, comprising a first underfill material surrounding the first die interconnection structure but not surrounding the second die interconnection structure.

7. The electronic device of claim 6, comprising a second underfill material surrounding the second die interconnection structure, wherein the second underfill material is a different type of underfill material than the first underfill material.

8. The electronic device of claim 1, wherein the connect die comprises a semiconductor substrate.

9. The electronic device of claim 8, wherein the connect die comprises:
a conductive layer on the semiconductor substrate; and
an inorganic dielectric layer on the conductive layer and comprising:
a first aperture through which a first portion of the conductive layer is exposed; and
a second aperture through which a second portion of the conductive layer is exposed,
wherein the first connect die interconnection structure is electrically connected to the first portion of the conductive layer through the first aperture, and the second connect die interconnection structure is electrically connected to the second portion of the conductive layer through the second aperture.

10. The electronic device of claim 9, comprising a second inorganic dielectric layer between the conductive layer and the semiconductor substrate.

11. The electronic device of claim 1, wherein:
the connect die comprises a plurality of inorganic dielectric layers; and
the at least one dielectric layer of the redistribution structure comprises a plurality of organic dielectric layers.

12. The electronic device of claim 1, comprising interconnection structures on a bottom side of the redistribution structure, at least one of which is outside a first footprint of the first semiconductor die and outside a second footprint of the second semiconductor die.

13. The electronic device of claim 1, comprising interconnection structures on a bottom side of the redistribution structure, at least one of which is within a footprint of the connect die.

14. The electronic device of claim 1, wherein the redistribution structure comprises a redistribution structure of a substrate.

15. An electronic device comprising:
a redistribution structure comprising at least one dielectric layer, a first conductor, and a second conductor;
a connect die comprising:
a top side comprising a first plurality of connect die interconnection structures and a second plurality of connect die interconnection structures, each electrically coupled to at least a respective one of the first plurality of connect die interconnection structures; and
a bottom side coupled to a top side of the redistribution structure;
a first semiconductor die comprising:
a first plurality of die interconnection structures having a first pitch and connected to the first plurality of connect die interconnection structures; and
a second plurality of die interconnection structures having a second pitch, greater than the first pitch, and connected to the redistribution structure; and
a second semiconductor die comprising:
a third plurality of die interconnection structures having a third pitch and connected to the second plurality of connect die interconnection structure; and
a fourth plurality of die interconnection structures having a fourth pitch, greater than the third pitch, and connected to the redistribution structure.

16. The electronic device of claim 15, wherein:
each of the first plurality of die interconnection structures comprises a first type of metal pillar; and
each of the second plurality of die interconnection structures comprises a second type of metal pillar,
wherein the second type of metal pillar is taller than the first type of metal pillar by at least a thickness of the connect die.

17. The electronic device of claim 16, wherein the bottom side of the connect die comprises a bottom conductive interconnection structure.

18. An electronic device comprising:
a redistribution structure comprising at least one dielectric layer, a first conductor, and a second conductor;
a connect die comprising:
a top side comprising a first connect die interconnection structure and a second connect die interconnection structure electrically coupled to the first connect die interconnection structure; and
a bottom side coupled to a top side of the redistribution structure;
a first semiconductor die comprising:
a first die interconnection structure connected to the first connect die interconnection structure; and
a second die interconnection structure connected to the first conductor of the redistribution structure;
a second semiconductor die comprising:
a third die interconnection structure connected to the second connect die interconnection structure; and
a fourth die interconnection structure connected to the second conductor of the redistribution structure; and
a first underfill material surrounding the first die interconnection structure but not surrounding the second die interconnection structure.

19. The electronic device of claim 18, comprising a second underfill material surrounding the second die interconnection structure, where the second underfill material is a different type of underfill material than the first underfill material.

20. The electronic device of claim 19, wherein:
the second underfill material comprises a molded underfill material; and
the first underfill material comprises a pre-applied underfill material or a capillary underfill material.

* * * * *